(12) United States Patent
Bai et al.

(10) Patent No.: US 11,900,881 B2
(45) Date of Patent: *Feb. 13, 2024

(54) DISPLAY SUBSTRATE, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lu Bai, Beijing (CN); Haigang Qing, Beijing (CN); Pengfei Yu, Beijing (CN); Jie Dai, Beijing (CN); Xiaofeng Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 83 days.

This patent is subject to a terminal disclaimer.

(21) Appl. No.: 17/286,285

(22) PCT Filed: Jun. 4, 2020

(86) PCT No.: PCT/CN2020/094315
§ 371 (c)(1),
(2) Date: Apr. 16, 2021

(87) PCT Pub. No.: WO2021/243637
PCT Pub. Date: Dec. 9, 2021

(65) Prior Publication Data
US 2022/0044639 A1    Feb. 10, 2022

(51) Int. Cl.
*G09G 3/32* (2016.01)
*G09G 3/3266* (2016.01)
(Continued)

(52) U.S. Cl.
CPC .......... *G09G 3/3266* (2013.01); *G11C 19/28* (2013.01); *G09G 3/3674* (2013.01);
(Continued)

(58) Field of Classification Search
CPC ......... G09G 3/3266; G09G 2310/0286; G09G 2310/061; G11C 19/28
See application file for complete search history.

(56) References Cited

U.S. PATENT DOCUMENTS

| 2016/0140928 A1* | 5/2016 | Xiao | G09G 3/3674 345/212 |
|---|---|---|---|
| 2018/0053471 A1 | 2/2018 | Lin et al. | |

(Continued)

FOREIGN PATENT DOCUMENTS

| CN | 105931606 A | 9/2016 |
|---|---|---|
| CN | 106816141 A | 6/2017 |

(Continued)

*Primary Examiner* — Roy P Rabindranath
(74) *Attorney, Agent, or Firm* — Muncy, Geissler, Olds & Lowe, P.C.

(57) ABSTRACT

The present disclosure provides a display substrate, a manufacturing method and a display device. At least one of the plurality of shift register units in the scan driving circuit includes an output circuit including an output transistor and an output reset transistor; a length of the active layer of the output transistor/the output reset transistor in the first direction is a first length/a second length, and a sum thereof is an output active length; a smaller one of minimum width of the active layer of the output transistor and the output reset transistor in a second direction is a first output active width, the first direction intersects the second direction; a ratio of the output active length to the first output active width is within a first predetermined ratio range greater than or equal to 3 and less than or equal to 11.

25 Claims, 23 Drawing Sheets

(51) Int. Cl.
*G11C 19/28* (2006.01)
*G09G 3/36* (2006.01)

(52) U.S. Cl.
CPC ... *G09G 3/3677* (2013.01); *G09G 2310/0286* (2013.01); *G09G 2310/061* (2013.01)

(56) References Cited

U.S. PATENT DOCUMENTS

| | | |
|---|---|---|
| 2018/0069031 A1 | 3/2018 | Wu et al. |
| 2019/0088226 A1* | 3/2019 | Cheng .................... G09G 3/20 |
| 2019/0287446 A1 | 9/2019 | Liao et al. |

FOREIGN PATENT DOCUMENTS

| | | | | |
|---|---|---|---|---|
| CN | 108877544 | A | 11/2018 | |
| CN | 110010078 | * | 7/2019 | ........... G09G 3/3266 |
| CN | 110010078 | A | 7/2019 | |
| CN | 111223454 | A | 6/2020 | |
| EP | 1607931 | A1 | 12/2005 | |

* cited by examiner

DISPLAY SUBSTRATE, MANUFACTURING METHOD THEREOF, AND DISPLAY DEVICE

CROSS-REFERENCE TO RELATED APPLICATION

The present application is the U.S. national phase of PCT Application No. PCT/CN2020/094315 filed on Jun. 4, 2020, which is incorporated herein by reference in its entirety.

TECHNICAL FIELD

The present disclosure relates to the field of display technology, in particular to a display substrate, a manufacturing method thereof, and a display device.

BACKGROUND

Active-Matrix Organic Light emitting Diode (AMOLED) display panels are widely used in various fields due to the advantages of low power consumption, low production cost, and wide color gamut.

The AMOLED display panel includes a pixel circuit located in a display area and a scan driving circuit located in an edge area. The pixel circuit includes a plurality of sub-pixel circuits distributed in an array. The scan driving circuit includes a plurality of shift register units. Each shift register unit is used to provide a light emitting control signal for the corresponding sub-pixel circuit. Since the scan driving circuit is arranged in the edge area of the AMOLED display panel, the arrangement of the scan driving circuit determines the frame width of the AMOLED display panel.

SUMMARY

In one aspect, the present disclosure provides in some embodiments a display substrate comprising a scan driving circuit and a display area provided on a base substrate, wherein the scan driving circuit includes a plurality of shift register units, and at least one of the plurality of shift register units includes an output circuit, and the output circuit includes an output transistor and an output reset transistor; an active layer of the output transistor and an active layer of the output reset transistor are arranged along a first direction, a length of the active layer of the output transistor in the first direction is a first length, and a length of the active layer of the output reset transistor in the first direction is a second length, and a sum of the first length and the second length is an output active length; a smaller one of a minimum width of the active layer of the output transistor in a second direction and a minimum width of the active layer of the output reset transistor in the second direction is a first output active width, the first direction intersects the second direction; a ratio of the output active length to the first output active width is within a first predetermined ratio range; the first predetermined ratio range is greater than or equal to 3 and less than or equal to 11.

Optionally, the first output active width is greater than or equal to 12 microns and less than or equal to 40 microns.

Optionally, the active layer of the output transistor and the active layer of the output reset transistor are formed by a continuous first semiconductor layer; the first semiconductor layer extends along a first direction; a length of the first semiconductor layer in the first direction is an output active length; a minimum length of the first semiconductor layer in the second direction is a first output active width.

Optionally, the at least one shift register unit further includes an output reset capacitor; the scan driving circuit further includes a first voltage signal line; a first electrode plate of the output reset capacitor is coupled to a gate electrode of the output reset transistor; a second electrode plate of the output reset capacitor is coupled to the first voltage signal line; the second electrode plate of the output reset capacitor extends along the second direction; the first voltage signal line and the output reset capacitor are both located on a side of the output circuit away from the display area.

Optionally, the scan driving circuit further includes a first voltage signal line and a second voltage signal line; the at least one shift register unit further includes an output reset capacitor; the output circuit is located between the first voltage signal line and the second voltage signal line, the first voltage signal line is located on a side of the output circuit away from the display area, and the second voltage signal line is located on a side of the output circuit close to the display area; the first electrode of the output transistor is coupled to the second voltage signal line; the first electrode of the output reset transistor is coupled to the second electrode plate of the output reset capacitor.

Optionally, both the first voltage signal line and the second voltage signal line extend along a first direction; a minimum distance in the second direction between an edge of an orthographic projection of the active layer of the output transistor on the base substrate and an edge of an orthographic projection of the second voltage signal line on the base substrate is a first predetermined distance.

Optionally, the first predetermined distance is greater than or equal to 10 microns and less than or equal to 15 microns.

Optionally, the scan driving circuit further includes a second voltage signal line, and the at least one shift register unit further includes a signal output line; the second voltage signal line extends along the first direction, and the second voltage signal line is located on a side of the output circuit close to the display area; the signal output line includes a first output line portion extending in a first direction; the first output line portion is coupled to the second electrode of the output transistor through a plurality of first signal line via holes arranged in a first signal line overlap area, and the first output line portion is coupled to the second electrode of the output reset transistor through a plurality of second signal line via holes in a second signal line overlap area, the plurality of first signal line via holes are arranged in sequence along the first direction, and the plurality of second signal line via holes are arranged in sequence along the first direction; the first signal line overlap area is an overlap area between an orthographic projection of the first output line portion on the base substrate and an orthographic projection of a first source-drain metal pattern on the base substrate, the first source-drain metal pattern includes the second electrode of the output transistor; the second signal line overlap area is an overlap area between the orthographic projection of the first output line portion on the base substrate and an orthographic projection of a second source-drain metal pattern on the base substrate, the second source-drain metal pattern includes the second electrode of the output reset transistor; the first output line portion is located between the output circuit and the second voltage signal line.

Optionally, the scan driving circuit further includes a second voltage signal line, and the at least one shift register unit further includes a signal output line; the signal output line includes a first output line portion and at least one second output line portion that are coupled to each other; the second voltage signal line and the first output line portion extend in a first direction, and the first output line portion is located between the second voltage signal line and the output circuit; the second output line portion extends along the second direction; the second output line portion is used for coupling with a pixel circuit in the display area; the first output line portion and the output circuit are located on a side of the second voltage signal line away from the display area.

Optionally, a minimum width of the active layer of the output transistor in the second direction is smaller than a minimum width of the active layer of the output reset transistor in the second direction.

Optionally, a minimum width of the active layer of the output transistor in the second direction is equal to a minimum width of the active layer of the output reset transistor in the second direction.

Optionally, the at least one shift register unit further comprises an output capacitor; a first electrode plate of the output capacitor is coupled to the gate electrode of the output transistor; an orthographic projection of a second electrode plate of the output capacitor on the base substrate is within an orthographic projection of the first electrode plate of the output capacitor on the base substrate; the output capacitor is located on a side of the output transistor away from the display area.

Optionally, a shape of the second electrode plate of the output capacitor is an L shape.

Optionally, the at least one shift register unit further comprises a first transistor; the first transistor includes a first active pattern; the first active pattern extends in a second direction; the first transistor is located on a side of the output circuit away from the display area.

Optionally, the at least one shift register unit further includes a first transistor and a second transistor; a first electrode of the second transistor is coupled to an electrode conductive connection portion; a gate electrode of the first transistor is coupled to a first conductive connection portion; there is a fifth overlap area between an orthographic projection of the first conductive connection portion on the base substrate and the orthographic projection of the electrode conductive connection portion on the base substrate; the electrode conductive connection portion is coupled to the first conductive connection portion through a fifth via hole in the fifth overlap area, so that the first electrode of the second transistor is coupled to the gate electrode of the first transistor.

Optionally, the at least one shift register unit further includes a third transistor; a gate electrode of the third transistor is coupled to the second conductive connection portion, and the second conductive connection portion is coupled to the first electrode of the output transistor, so that a gate electrode of the third transistor is connected to the first electrode of the output transistor.

Optionally, the at least one shift register unit further includes a first transistor and a third transistor; a gate electrode of the first transistor is coupled to a gate electrode of the third transistor; the gate electrode of the first transistor is coupled to a third conductive connection portion, and the third conductive connection portion is coupled to the first electrode of the output transistor, so that the gate electrode of the first transistor is connected to the first electrode of the output transistor.

Optionally, the first transistor is located on a side of the third transistor close to the output circuit; a distance in the second direction between an orthographic projection of the gate electrode of the first transistor on the base substrate and an orthographic projection of a gate electrode of the third transistor on the base substrate is a second predetermined distance.

Optionally, the second predetermined distance is greater than or equal to 18 microns and less than or equal to 24 microns.

Optionally, the at least one shift register unit further includes a fourth transistor and a fifth transistor; the scan driving circuit further includes a first clock signal line; a first electrode of the fourth transistor is coupled to the first clock signal line, and a gate electrode of the fifth transistor is coupled to the first clock signal line; no transistor and/or capacitor is provided between the fourth transistor and the first clock signal line; no transistor and/or capacitor is provided between the fifth transistor and the first clock signal line.

Optionally, an active layer of the fourth transistor and an active layer of the fifth transistor are formed by a continuous second semiconductor layer; the second semiconductor layer extends along the first direction; the active layer of the fourth transistor includes a first third conductive portion, a third channel portion, and a second third conductive portion sequentially arranged along the first direction; the second third conductive portion is multiplexed as a first fourth conductive portion; the active layer of the fifth transistor includes the first fourth conductive portion, a fourth channel portion, and a second fourth conductive portion sequentially arranged along the first direction; the first third conductive portion is used as the first electrode of the fourth transistor, the second third conductive portion is used as a second electrode of the fourth transistor, and the second fourth conductive portion is used as a second electrode of the fourth transistor, and the second electrode of the fourth transistor is multiplexed as a first electrode of the fifth transistor.

Optionally, the first clock signal line extends along a first direction, and the first clock signal line is located on a side of the fourth transistor and the fifth transistor away from the display area.

Optionally, the at least one shift register unit further includes a fourth transistor, a fifth transistor, a sixth transistor, and a first capacitor; a gate electrode of the fourth transistor is coupled to a first electrode plate of the first capacitor, and a second electrode plate of the first capacitor is coupled to a second electrode of the fourth transistor; the second electrode of the fourth transistor is multiplexed as a first electrode of the fifth transistor; a second electrode of the fifth transistor is coupled to a second electrode of the sixth transistor; a first electrode of the sixth transistor is coupled to a first electrode of the output reset transistor; the fourth transistor, the fifth transistor, the sixth transistor and the first capacitor are located on a side of the output reset transistor away from the display area; the fourth transistor, the first capacitor, and the sixth transistor are arranged in a first direction, and the output reset transistor, the first capacitor, and the fifth transistor are arranged in a direction away from the display area.

Optionally, the at least one shift register unit further includes an output reset capacitor; the second electrode of the fifth transistor is coupled to a first electrode plate of the output reset capacitor, and the first electrode of the sixth transistor is coupled to a second electrode plate of the output reset capacitor; the first capacitor and the output reset capacitor are arranged along the first direction.

Optionally, the at least one shift register unit further includes a seventh transistor and an eighth transistor; an active layer of the seventh transistor and an active layer of the eighth transistor are formed by a continuous third semiconductor layer; the third semiconductor layer extends along the first direction; the active layer of the seventh transistor includes a first fifth conductive portion, a fifth channel portion, and a second fifth conductive portion sequentially arranged along the first direction; the second fifth conductive portion is multiplexed as a first sixth conductive portion; an active layer of the eighth transistor includes the first sixth conductive portion, a sixth channel portion, and a second sixth conductive portion that are sequentially arranged along the first direction; the first fifth conductive portion is used as a second electrode of the seventh transistor, the second fifth conductive portion is used as a first electrode of the seventh transistor, and the second sixth conductive portion is used as a first electrode of the eighth transistor, the first electrode of the seventh transistor is multiplexed as a second electrode of the eighth transistor.

Optionally, the scan driving circuit further includes a first voltage signal line; the first electrode of the eighth transistor is coupled to the first voltage signal line; the first voltage signal line is located on a side of the output circuit away from the display area, and the seventh transistor and the eighth transistor are located between the first voltage signal line and the output circuit; no transistor and/or capacitor is provided between the eighth transistor and the first voltage signal line.

Optionally, the at least one shift register unit further includes a second transistor and an input transistor; the scan driving circuit further includes a second clock signal line; the second clock signal line extends along the first direction; a gate electrode of the second transistor is coupled to a gate electrode of the input transistor; the gate electrode of the input transistor is coupled to the second clock signal line and a first electrode of the input transistor is coupled to an input end; the second transistor and the input transistor are located on a side of the output circuit away from the display area.

Optionally, the at least one shift register unit further includes a node control transistor, a gate electrode of the node control transistor includes a first gate electrode pattern and a second gate electrode pattern coupled to each other.

Optionally, the at least one shift register unit furthers include an input transistor, a sixth transistor, a first transistor, a seventh transistor, and an eighth transistor; the gate electrode of the node control transistor is coupled to a first electrode of the first transistor, and the gate electrode of the node control transistor is also coupled to a second electrode of the input transistor, the gate electrode of the node control transistor is also coupled to a second electrode of the seventh transistor, and the gate electrode of the node control transistor is also coupled to a gate electrode of the sixth transistor; a first electrode of the node control transistor is coupled to a gate electrode of the input transistor, and a second electrode of the node control transistor is coupled to a gate electrode of the eighth transistor; the input transistor, the node control transistor, the seventh transistor, and the eighth transistor are arranged in a first direction.

Optionally, the scan driving circuit further includes a first voltage signal line, a second voltage signal line, a first clock signal line, and a second clock signal line; the first voltage signal line, the second voltage signal line, the first clock signal line, and the second clock signal line all extend in a first direction; an orthographic projection of the first voltage signal line on the base substrate, an orthographic projection of the first clock signal line on the base substrate, and an orthographic projection of the second clock signal line on the base substrate are all located on a side of an orthographic projection of the shift register unit on the base substrate away from the display area; the orthographic projection of the second voltage signal line on the base substrate is located on a side of the shift register unit close to the display area.

Optionally, the scan driving circuit further includes a first voltage signal line, a second voltage signal line, a first clock signal line, and a second clock signal line; the at least one shift register unit also includes a signal output line, a first capacitor, an output capacitor, an output reset capacitor, a first transistor, a second transistor, a third transistor, a fourth transistor, a fifth transistor, a sixth transistor, a seventh transistor, an eighth transistor, an input transistor and a node control transistor; the signal output line includes a first output line portion and at least one second output line portion; a first electrode plate of the output reset capacitor is coupled to a gate electrode of the output reset transistor, and a second electrode plate of the output reset capacitor is coupled to the first voltage signal line; a first electrode of the output transistor is coupled to the second voltage signal line, and a first electrode of the output reset transistor is coupled to the second electrode plate of the output reset capacitor; a second electrode of the output transistor and a second electrode of the output reset transistor are respectively coupled to the first output line portion; a first electrode plate of the output capacitor is coupled to the gate electrode of the output transistor, and a second electrode plate of the output capacitor is coupled to a gate electrode of the seventh transistor; a gate electrode of the first transistor is coupled to a first electrode of the output transistor, and the second electrode of the first transistor is coupled to the gate electrode of the output transistor; a gate electrode of the second transistor is coupled to a gate electrode of the input transistor, a first electrode of the second transistor is coupled to the gate electrode of the first transistor, and a second electrode of the second transistor is coupled to a gate electrode of the eighth transistor; a gate electrode of the third transistor is coupled to the first electrode of the output transistor, a first electrode of the third transistor is coupled to a gate electrode of the eight transistor, a second electrode of the third transistor is coupled to a gate electrode of the fourth transistor; a first electrode of the fourth transistor is coupled to the first clock signal line, and a gate electrode of the fifth transistor is coupled to the first clock signal line; the gate electrode of the fourth transistor is coupled to the first electrode plate of the first capacitor, and the second electrode plate of the first capacitor is coupled to the second electrode of the fourth transistor; the second electrode of the fourth transistor is multiplexed as a first electrode of the fifth transistor; a second electrode of the fifth transistor is coupled to a second electrode of the sixth transistor; a gate electrode of the sixth transistor is coupled to a gate electrode of the node control transistor, and a first electrode of the sixth transistor is coupled to a first electrode of the output reset transistor; a second electrode of the fifth transistor is coupled to a first electrode plate of the output reset capacitor, and a first electrode of the sixth transistor is connected to a second electrode plate of the output reset capacitor; a gate electrode of the seventh transistor is coupled to the second electrode plate of the output capacitor, and a first electrode of the seventh transistor is multiplexed as a second electrode of the eighth transistor, a second electrode of the seventh transistor is coupled to the gate electrode of the node control transistor; a gate electrode of the eighth transistor is coupled to the second electrode of the node control transistor, and a first electrode of the eighth transistor is coupled to the first voltage signal line; a gate electrode of the input transistor is coupled to the second clock signal line, and a first electrode of the input transistor is coupled to the input end; the gate electrode of the node control transistor is coupled to the first electrode of the first transistor, and the gate electrode of the node control transistor is also coupled to the second electrode a of the input transistor; the first electrode of the node control transistor is coupled to the gate electrode of the input transistor; the second output line portion extend to the display area and are used to provide a light emitting control signal for a pixel circuit located in the display area.

Optionally, along the first direction, the input transistor, the node control transistor, the seventh transistor, the eighth transistor, the fourth transistor, the fifth transistor and the output reset capacitor are arranged in sequence; the input transistor, the second transistor, and the first transistor are arranged along a second direction; the node control transistor, the output capacitor, and the output transistor are arranged along a second direction; the third transistor, the fourth transistor, the first capacitor, and the output reset capacitor are arranged in sequence along the first direction; the sixth transistor is arranged between the output reset transistor and the first capacitor.

Optionally, the scan driving circuit further includes a first voltage signal line, a second voltage signal line, a first clock signal line, and a second clock signal line; the at least one shift register unit also includes a signal output line, a first capacitor, an output capacitor, an output reset capacitor, a first transistor, a second transistor, a third transistor, a fourth transistor, a fifth transistor, a sixth transistor, a seventh transistor, an eighth transistor, an input transistor and a node control transistor; a first electrode plate of the output reset capacitor is coupled to a gate electrode of the output reset transistor, and a second electrode plate of the output reset capacitor is coupled to the first voltage signal line; the signal output line includes a first output line portion and at least one second output line portion; a first electrode of the output transistor is coupled to the second voltage signal line, and a first electrode of the output reset transistor is coupled to the second electrode plate of the output reset capacitor; a second electrode of the output transistor and a second electrode of the output reset transistor are respectively coupled to the first output line portion; a first electrode plate of the output capacitor is coupled to the gate electrode of the output transistor, and a second electrode plate of the output capacitor is coupled to a gate electrode of the seventh transistor; a gate electrode of the first transistor is coupled to a gate electrode of the third transistor, and the gate electrode of the first transistor is coupled to the first electrode of the output transistor; a second electrode of the first transistor is coupled to a gate electrode of the output transistor; a gate electrode of the second transistor is coupled to a gate electrode of the input transistor, a first electrode of the second transistor is coupled to the first electrode of the output transistor, and a second electrode of the second transistor is coupled to a gate electrode of the eighth transistor; a first electrode of the third transistor is coupled to the gate electrode of the eighth transistor, and a second electrode of the third transistor is coupled to a gate electrode of the fourth transistor; a first electrode of the fourth transistor is coupled to the first clock signal line, and a gate electrode of the fifth transistor is coupled to the first clock signal line; the gate electrode of the fourth transistor is coupled to the first electrode plate of the first capacitor, and the second electrode plate of the first capacitor is coupled to the second electrode of the fourth transistor; the second electrode of the fourth transistor is multiplexed as a first electrode of the fifth transistor; a second electrode of the fifth transistor is coupled to a second electrode of the sixth transistor; a gate electrode of the sixth transistor is coupled to a gate electrode of the node control transistor, and a first electrode of the sixth transistor is coupled to a first electrode of the output reset transistor; a second electrode of the fifth transistor is coupled to a first electrode plate of the output reset capacitor, and a first electrode of the sixth transistor is connected to a second electrode plate of the output reset capacitor; a gate electrode of the seventh transistor is coupled to the second electrode plate of the output capacitor, and a first electrode of the seventh transistor is multiplexed as a second electrode of the eighth transistor, a second electrode of the seventh transistor is coupled to the gate electrode of the node control transistor; a gate electrode of the eighth transistor is coupled to the second electrode of the node control transistor, and a first electrode of the eighth transistor is coupled to the first voltage signal line; a gate electrode of the input transistor is coupled to the second clock signal line, and a first electrode of the input transistor is coupled to the input end; the gate electrode of the node control transistor is coupled to the first electrode of the first transistor, and the gate electrode of the node control transistor is also coupled to the second electrode a of the input transistor; the first electrode of the node control transistor is coupled to the gate electrode of the input transistor; the second output line portion extend to the display area and are used to provide a light emitting control signal for a pixel circuit located in the display area.

Optionally, the input transistor, the node control transistor, the seventh transistor, the eighth transistor, the fourth transistor, and the fifth transistor and the output reset capacitor are arranged in sequence along the first direction; the input transistor and the second transistor are arranged along the second direction; the node control transistor, the output capacitor, and the output transistor are arranged along the second direction; the third transistor, the fourth transistor, the first capacitor, and the output reset capacitor are arranged in sequence along the first direction; the first transistor, the sixth transistor, and the output reset capacitor are arranged in sequence along the first direction.

Optionally, the second voltage signal line is arranged on a side of the shift register unit close to the display area; the first voltage signal line, the first clock signal line, and the second clock signal line are arranged on a side of the shift register unit away from the display area; along a direction close to the display area, the first clock signal line, the second clock signal line, and the first voltage signal line are arranged in sequence; or along the direction close to the display area, the second clock signal line, the first clock signal line, and the first voltage signal line are arranged in sequence.

Optionally, the scan driving circuit further includes a first start signal line and a second start signal line; along the direction close to the display area, the second start signal line, the first start signal line, the first clock signal line, the second clock signal line, and the first voltage signal line are sequentially arranged; or along the direction close to the display area, the first start signal line, the second start signal line, the first clock signal line, the second clock signal line, and the first voltage signal line are sequentially arranged; or along the direction close to the display area, the second start signal line, the first start signal line, the second clock signal line, the first clock signal line, and the first voltage signal line are sequentially arranged; or along the direction close to the display area, the first start signal line, the second start signal line, the second clock signal line, the first clock signal line, and the first voltage signal line are sequentially arranged.

Optionally, the display substrate further includes a plurality of rows of pixel circuits arranged on the base substrate;

the pixel circuit includes a light emitting control end; the shift register unit corresponds to at least one row of the pixel circuits; the signal output line of the shift register unit is coupled to the light emitting control end of the at least one row of pixel circuits, and is used to provide a light emitting control signal for the light emitting control end of the at least one row of pixel circuits.

Optionally, a larger one of a minimum width of the active layer of the output transistor in the second direction, and a minimum width of the active layer of the output reset transistor in the second direction is a second output active width, and a ratio of the output active length to the second output active width is within a second predetermined ratio range; the second predetermined ratio range is greater than or equal to 3 and less than or equal to 11.

In another aspect, a method of manufacturing a display substrate, comprising forming a scan driving circuit on a base substrate; wherein the scan driving circuit includes a plurality of shift register units, and at least one shift register unit of the plurality of shift register units includes an output circuit; the output circuit includes an output transistor and an output reset transistor; the method of manufacturing the display substrate further includes: forming a semiconductor layer on the base substrate, and performing a patterning process on the semiconductor layer to form an active layer of the output transistor and an active layer of the output reset transistor; the active layer of the output transistor and the active layer of the output reset transistor are arranged along a first direction, a length of the active layer of the output transistor in the first direction is a first length, and a length of the active layer of the output reset transistor in the first direction is a second length, and a sum of the first length and the second length is an output active length; a smaller one of a minimum width of the active layer of the output transistor in a second direction and a minimum width of the active layer of the output reset transistor in the second direction is a first output active width; the first direction intersects the second direction; a ratio of the output active length to the first output active width is within a first predetermined ratio range; the first predetermined ratio range is greater than or equal to 3 and less than or equal to 11.

Optionally, the first output active width is greater than or equal to 12 microns and less than or equal to 40 microns.

Optionally, the method further includes: forming a first gate metal layer on a side of the semiconductor layer away from the substrate, and performing a patterning process on the first gate metal layer to form a gate electrode of the output transistor and a gate electrode of the output reset transistor; using the gate electrode of the output transistor and the gate electrode of the output reset transistor as a mask, doping a portion of the semiconductor layer that is not covered by the gate electrodes so that the portion of the semiconductor layer that is not covered by the gate electrodes is formed as a conductive portion, and a portion of the semiconductor layer covered by the gate electrode is formed as a channel portion; forming a second gate metal layer on a side of the first gate metal layer away from the semiconductor layer, and performing a patterning process on the second gate metal layer to form a signal output line; the signal output line including a first output line portion extending in the first direction; forming a first insulating layer on a side of the second gate metal layer away from the first gate metal layer; forming a plurality of first signal line via holes and a plurality of second signal line via holes in an overlap area between the first insulating layer and the first output line portion; the plurality of first signal line via holes and the plurality of second signal line via holes penetrating the first insulating layer; forming a source-drain metal layer on a side of the first insulating layer away from the second gate metal layer, performing a patterning process on the source-drain metal layer to form a first source-drain metal pattern and a second source-drain metal pattern, wherein the first source-drain metal pattern includes the second electrode of the output transistor, and the second source-drain metal pattern includes the second electrode of the output reset transistor, so that the first output line portion is coupled to the second electrode of the output transistor through the plurality of first signal line via holes, and the first output line portion is coupled to the second electrode of the output reset transistor through the plurality of second signal line via holes, the plurality of first signal line via holes are sequentially arranged along the first direction, and the plurality of second signal line via holes are sequentially arranged along the first direction.

Optionally, the signal output line further includes at least one second output line portion, the second output line portion is coupled to the first output line portion; the second output line portion extends to the display area, and is used to provide a light emitting control signal for a pixel circuit located in the display area.

In another aspect, the present disclosure provides in some embodiments a display device including the above-mentioned display substrate.

DETAILED DESCRIPTION

The technical solutions in the embodiments of the present disclosure will be clearly and completely described below in conjunction with the accompanying drawings in the embodiments of the present disclosure. Obviously, the described embodiments are only a portion of the embodiments of the present disclosure, not all of the embodiments. Based on the embodiments in the present disclosure, all other embodiments obtained by those of ordinary skill in the art without creative work fall within the protection scope of the present disclosure.

Figure 1:
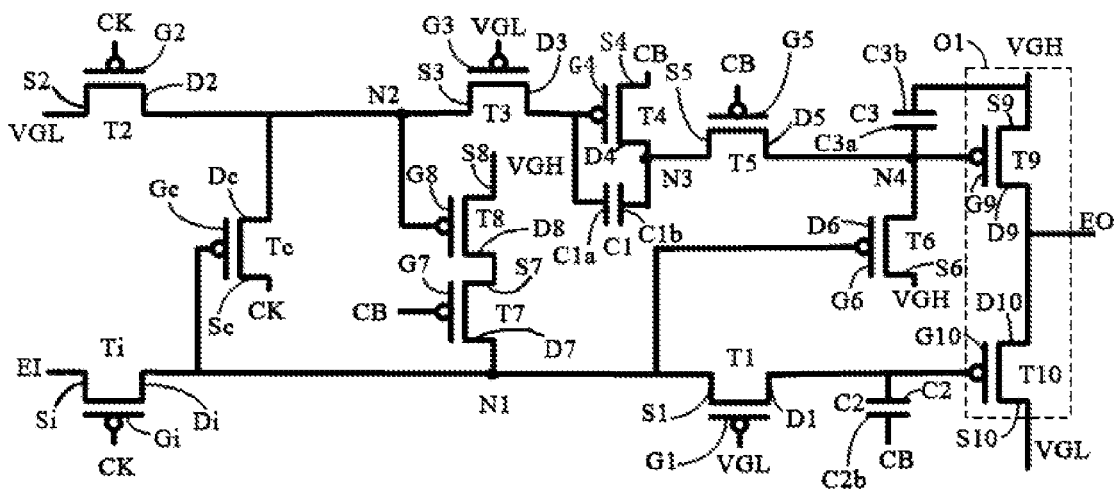
FIG. 1 is a circuit diagram of at least one shift register unit included in a display substrate according to an embodiment of the present disclosure.

As shown in FIG. 1, at least one embodiment of the present disclosure provides a display substrate. The display substrate includes a scan driving circuit located in an edge area of the display substrate. The scan driving circuit includes a first voltage signal line VGH, a second voltage signal line VGL, a first clock signal line CB, and a second clock signal line CK; the scan driving circuit further includes a plurality of shift register units.

As shown in FIG. 1, at least one shift register unit of the plurality of shift register units includes a signal output line E0, a first capacitor C1, an output capacitor C2, an output reset capacitor C3, an output circuit O1, a first transistor T1, a second transistor T2, a third transistor T3, a fourth transistor T4, a fifth transistor T5, a sixth transistor T6, a seventh transistor T7, an eighth transistor T8, an input transistor T1 and a node control transistor Tc; the output circuit O1 includes an output transistor T10 and an output reset transistor T9.

A first electrode plate C3a of the output reset capacitor C3 is coupled to a gate electrode G9 of the output reset transistor T9, and a second electrode plate C3b of the output reset capacitor C3 is coupled to the first voltage signal line VGH.

A first electrode S10 of the output transistor T10 is coupled to the second voltage signal line, and a first electrode S9 of the output reset transistor T9 is coupled to a second electrode plate C3b of the output reset capacitor C3; a second electrode D10 of the output transistor T10 and a second electrode D9 of the output reset transistor T9 are respectively coupled to the signal output line E0.

A first electrode plate C2a of the output capacitor C2 is coupled to a gate electrode G10 of the output transistor T10, and a second electrode plate C2 of the output capacitor C2 is coupled to the first clock signal line CB.

A gate electrode G1 of the first transistor T1 is coupled to the second voltage signal line VGL, and a second electrode D1 of the first transistor T1 is coupled to a gate electrode G10 of the output transistor T10.

A gate electrode G2 of the second transistor T2 and a gate electrode Gi of the input transistor T1 are both coupled to the second clock signal line CK, and a first electrode S2 of the second transistor T2 is coupled to the second voltage signal line VGL, and a second electrode D2 of the second transistor T2 is coupled to a gate electrode G8 of the eighth transistor T8.

A gate electrode G3 of the third transistor T3 is coupled to the second voltage signal line VGL, and a first electrode S3 of the third transistor T3 is coupled to a gate electrode G8 of the eighth transistor T8, a second electrode D3 of the third transistor T3 is coupled to a gate electrode G4 of the fourth transistor T4.

A first electrode S4 of the fourth transistor T4 is coupled to the first clock signal line CB, and a gate electrode G5 of the fifth transistor T5 is coupled to the first clock signal line CB.

A gate electrode G4 of the fourth transistor T4 is coupled to a first electrode plate C1a of the first capacitor C1, and a second electrode plate C1b of the first capacitor C1 is coupled to a second electrode D4 of the fourth transistor T4; a second electrode D4 of the fourth transistor T4 is coupled to a first electrode S5 of the fifth transistor T5.

A second electrode D5 of the fifth transistor T5 is coupled to a second electrode D6 of the sixth transistor T6.

A gate electrode G6 of the sixth transistor T6 is coupled to a gate electrode Gc of the node control transistor Tc, and a first electrode S6 of the sixth transistor T6 is coupled to the first voltage signal line VGH.

A second electrode D5 of the fifth transistor T5 is coupled to a first electrode plate C3a of the output reset capacitor C3.

A gate electrode G7 of the seventh transistor T7 is coupled to the first clock signal line CB, a first electrode S7 of the seventh transistor T7 is coupled to a second electrode D8 of the eighth transistor T8, and a second electrode D7 of the seventh transistor T7 is coupled to the gate electrode Gc of the node control transistor Tc.

A gate electrode G8 of the eighth transistor T8 is coupled to a second electrode Dc of the node control transistor Tc, and a first electrode S8 of the eighth transistor T8 is coupled to the first voltage signal line VGH.

A gate electrode Gi of the input transistor T1 is coupled to the second clock signal line CK, and a first electrode Si of the input transistor T1 is coupled to the input end E1.

The gate electrode Gc of the node control transistor Tc is coupled to the first electrode Si of the first transistor T1, and the gate electrode Gc of the node control transistor Tc is also coupled to the second electrode Di of the input transistor T1.

The first electrode Sc of the node control transistor Tc is coupled to the second clock signal line CK.

In at least one embodiment of the shift register unit shown in FIG. 1, all the transistors are p-type transistors, but not limited to this.

In the embodiments of the present disclosure, at least one embodiment of the shift register unit shown in FIG. 1 may be a light emitting control scan driving circuit, but it is not limited thereto.

In at least one embodiment of the present disclosure, the first electrode of the transistor may be a source electrode, and the second electrode of the transistor may be a drain electrode; or, the first electrode of the transistor may be a drain electrode, and the second electrode of the transistor may be a source electrode.

In FIG. 1, a node labeled N1 is a first node, a node labeled N2 is a second node, a node labeled N3 is a third node, and a node labeled N4 is a fourth node.

Figure 2A:
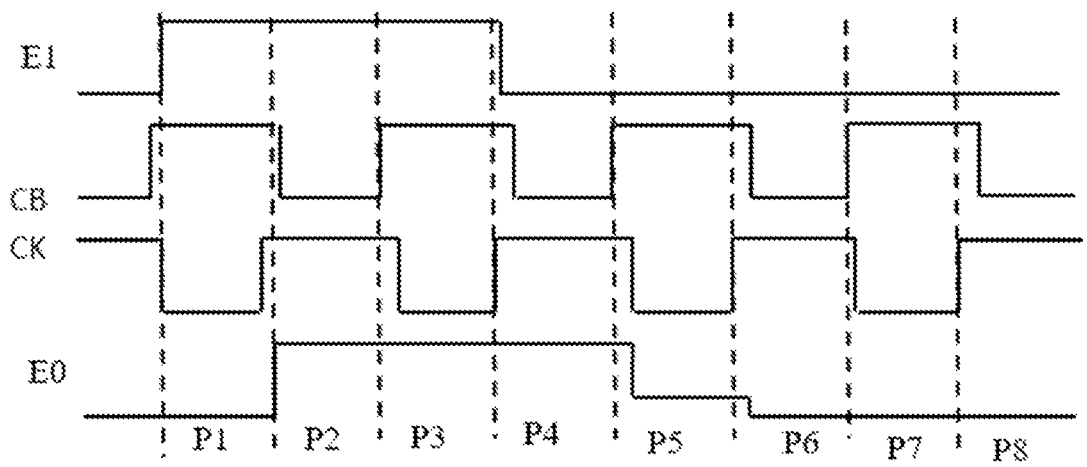
FIG. 2A is a working timing diagram of the shift register unit shown in FIG. 1.

As shown in FIG. 2A, when the shift register unit shown in FIG. 1 of the present disclosure is in operation, the following is performed.

In a first time period P1, E1 provides a high level, CK provides a low level, T1, T2, T3 and T1 are turned on, the potential of N1 is a high level, Tc is turned off, the potential of N2 is a low level, T7, T6 and T10 are turned off, T8 and T4 are turned on; at this time, the potential of the first electrode of T5 is a high level, CB is a high level, and T5 is turned off; since the voltage across the capacitor will not change suddenly, the potential of N4 is maintained at a high level as the previous frame, T9 is turned off, and the potential of the light emitting control signal outputted by E0 is maintained at a low level as the previous frame.

In a second time period P2, E1 and CK provide a high level, CB provides a low level, Ti, Tc and T2 are turned off, the potential of N2 remains at a low level, T7, T8 and T4 are turned on, and the potential of N1 is a high level, the potential of the first electrode of T5 is changed from a high level to a low level, T5 is turned on, T6 is turned off, the potential of N4 is a low level, T9 is turned on, and E0 outputs a high level; T1 is turned on, and T10 is turned off.

In a third time period P3, E1 and CB all provide a high level, CK provides a low level, T1 and T2 are turned on, the potential of N1 is a high level, and the potential of N2 is a low level, Tc and T7 are turned off, T8 and T4 are turned on, the potential of the first electrode of T5 is changed from the low level of the previous time period to a high level, T5 is turned off, the potential of N4 is maintained at a low level due to the discharge of C3, T9 is turned on, and E0 outputs a high level; T1 is turned on, T6 and T10 are turned off.

In a fourth time period P4, E1 and CB provide a low level, CK provides a high level, T1 and T2 are turned off, the potential of N1 is a high level, Tc is turned off, and the potential of N2 is maintained at a low level, T3, T7, T8 and T4 are turned on, the potential of the first electrode of T5 is jumped to a low level, T5 is turned on, the potential of N4 is a low level, T9 is turned on, E0 outputs a high level, T1 is turned on, and T6 and T10 are turned off.

In a fifth time period P5, E1 and CK provide a low level, CB provides a high level, Ti, Tc, T2, T3 and T1 are all turned on, the potential of N1 and N2 are both a low level, and T7 is turned off. T8 and T4 are turned on, the potential of the first electrode of T5 is changed to a high level, T5 is turned off, T6 is turned on, the potential of N4 is changed to a high level, T9 is turned off, T10 is turned on, and E0 outputs a low level.

In a sixth time period P6, both E1 and CB provide a low level, CK provides a high level, T1 and T2 are turned off, the potential of N1 is maintained at a low level, Tc is turned on, and the potential of N2 is at a high level, T3, T1, T7 and T8 are turned on, T4 is turned off, the potential of the first electrode of T5 is a high level, T5 and T6 are turned on, the potential of N4 is a high level, T9 is turned off, T10 is turned on, and E0 outputs a low level.

In a seventh time period P7, both E1 and CK provide a low level, CB provides a high level, Ti, Tc, T2, T3, T1 and T8 are all turned on, the potential of N1 and N2 are a low level, and T4 is turned off, T8 and T4 are turned on, the potential of the first electrode of T5 is a high level, T5 is turned off, T6 is turned on, the potential of N4 is a high level, T9 is turned off, T10 is turned on, and E0 outputs a low level.

In an eighth time period P8, E1 and CB provide a low level, CK provides a high level, T1 and T2 are turned off, the potential of N1 is maintained at a low level, Tc is turned on, the potential of N2 is a high level, and T7 is turned on. T8 and T4 are turned off, the potential of the first electrode of T5 is maintained at a high level, T3, T1, T5 and T6 are turned on, the potential of N4 is at a high level, T9 is turned off, T10 is turned on, and E0 outputs a low level.

After the seventh time period P7, T6 continues to be turned on, T9 is turned off, C2 is charged periodically by T1, the potential of N1 remains at a low level, and T10 continues to be turned on, so that E0 outputs a low level until the next frame of input signal pulse starts.

Figure 2B:
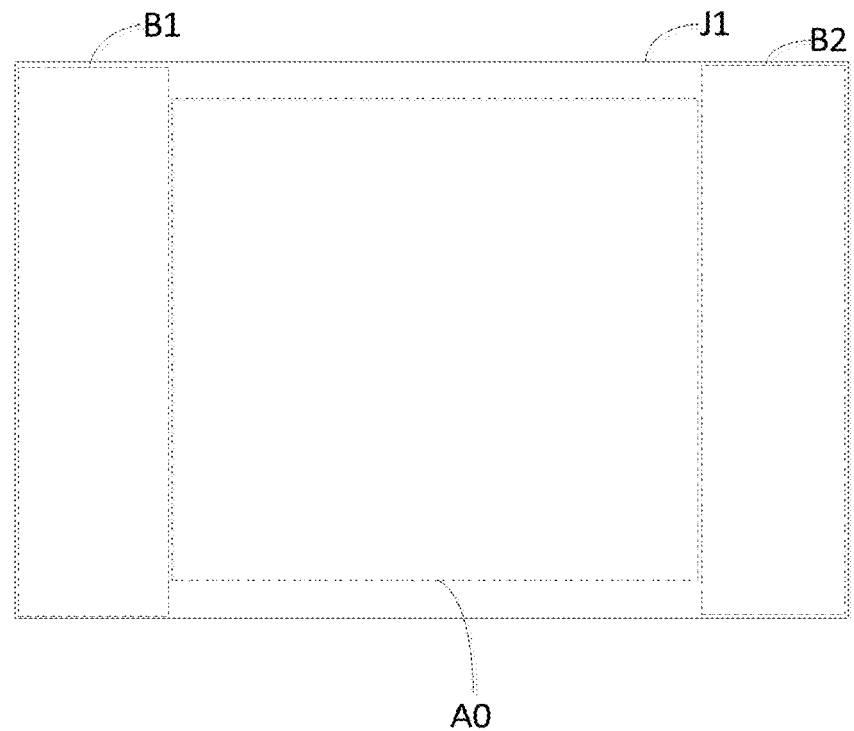
FIG. 2B is a schematic diagram of area division of the display substrate according to at least one embodiment of the present disclosure.

As shown in FIG. 2B, the label J1 denotes the display substrate, the label A0 denotes the display area, the label B1 denotes the first edge area, and the label B2 denotes the second edge area.

A plurality of light emitting control lines, a plurality of gate lines, and a plurality of data lines may be provided in the display area A0 of the display substrate J1, and a plurality of sub-pixels defined by the intersection of the plurality of gate lines and the plurality of data lines.

A scan driving circuit may be provided in the first edge area B1 and/or the second edge area B2, and the scan driving circuit includes a plurality of shift register units.

The signal output line of each shift register unit of the plurality of shift register units included in the scan driving circuit may be respectively coupled to A light emitting control lines for providing light emitting control signals for the corresponding light emitting control lines.

Here, A can be a positive integer. In actual operation, A can be equal to 1, 2, 3, 4 or other positive integers, and the value of A can be selected according to actual conditions.

In specific implementation, the light emitting control line is coupled to the light emitting control end of the pixel circuits in a corresponding row.

Optionally, the display substrate further includes a plurality of rows of pixel circuits arranged on the base substrate; the pixel circuit includes a light emitting control end.

The shift register unit included in the scan driving circuit corresponds to at least one row of the pixel circuits.

The signal output line of the shift register unit is coupled to the light emitting control end of the at least one row of pixel circuits, and is used to provide a light emitting control signal for the light emitting control end of the at least one row of pixel circuits.

In at least one embodiment of the present disclosure, the pixel circuit may be disposed in the effective display area of the display substrate, and the scan driving circuit may be disposed in the edge area of the display substrate.

Figure 2C:
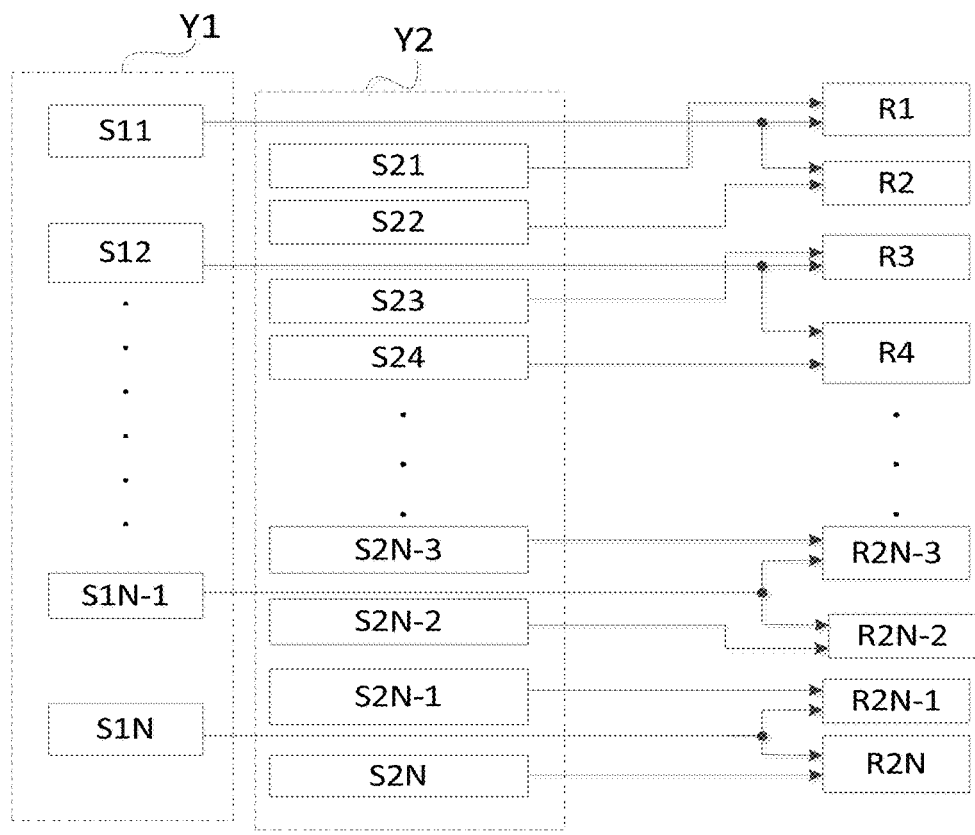
FIG. 2C is a schematic diagram of the connection relationship between the scan driving circuit and the pixel circuit included in the display substrate according to at least one embodiment of the present disclosure.

As shown in FIG. 2C, Y1 is a scan driving circuit, S11 is the first stage of shift register unit included in the scan driving circuit S1, S12 is the second state of shift register unit included in the scan driving circuit S1, S1N-1 is the (N-1)th stage of shift register unit included in the scan driving circuit S1, and S1N is the Nth stage of shift register unit included in the scan driving circuit S1, N is an integer greater than 3.

In FIG. 2C, R1 is the first row of pixel circuits, R2 is the second row of pixel circuits, R3 is the third row of pixel circuits, and R4 is the fourth row of pixel circuits, R2N-3 is the (2N-3)th row of pixel circuits, R2N-2 is the (2N-2)th row of pixel circuits, R2N-1 is the (2N-1)th row of pixel circuits, R2N is the 2Nth row of pixel circuits.

S11 provides a light emitting control signal for R1 and R2, S12 provides a light emitting control signal for R3 and R4, S1N-1 provides a light emitting control signal for R2N-3 and R2N-2, and S1N provides a light emitting control signal for R2N-1 and R2N.

As shown in FIG. 2C, in the edge area, the display substrate may further include a gate driving circuit, the gate driving circuit includes a plurality of stages of gate driving units, and the gate driving unit may correspond to rows of pixel in one-to-one manner, and provide a corresponding gate driving signal for a corresponding row of pixels.

In FIG. 2C, Y2 is the gate driving circuit, S21 is the first row of gate driving units included in the gate driving circuit, and S22 is the second row of gate driving units included in the gate driving circuit, S23 is the third row of gate driving units included in the gate driving circuit, S24 is the fourth row of gate driving units included in the gate driving circuit, and S2N-3 is the (2N-3)th row of gate driving units included in the gate driving circuit, S2N-2 is the (2N-2)th row of gate driving units included in the gate driving circuit, and S2N-1 is the (2N-1)th row of gate driving units included in the gate driving circuit, S2N is the 2Nth row of the gate driving units included in the gate driving circuit.

Figure 2D:
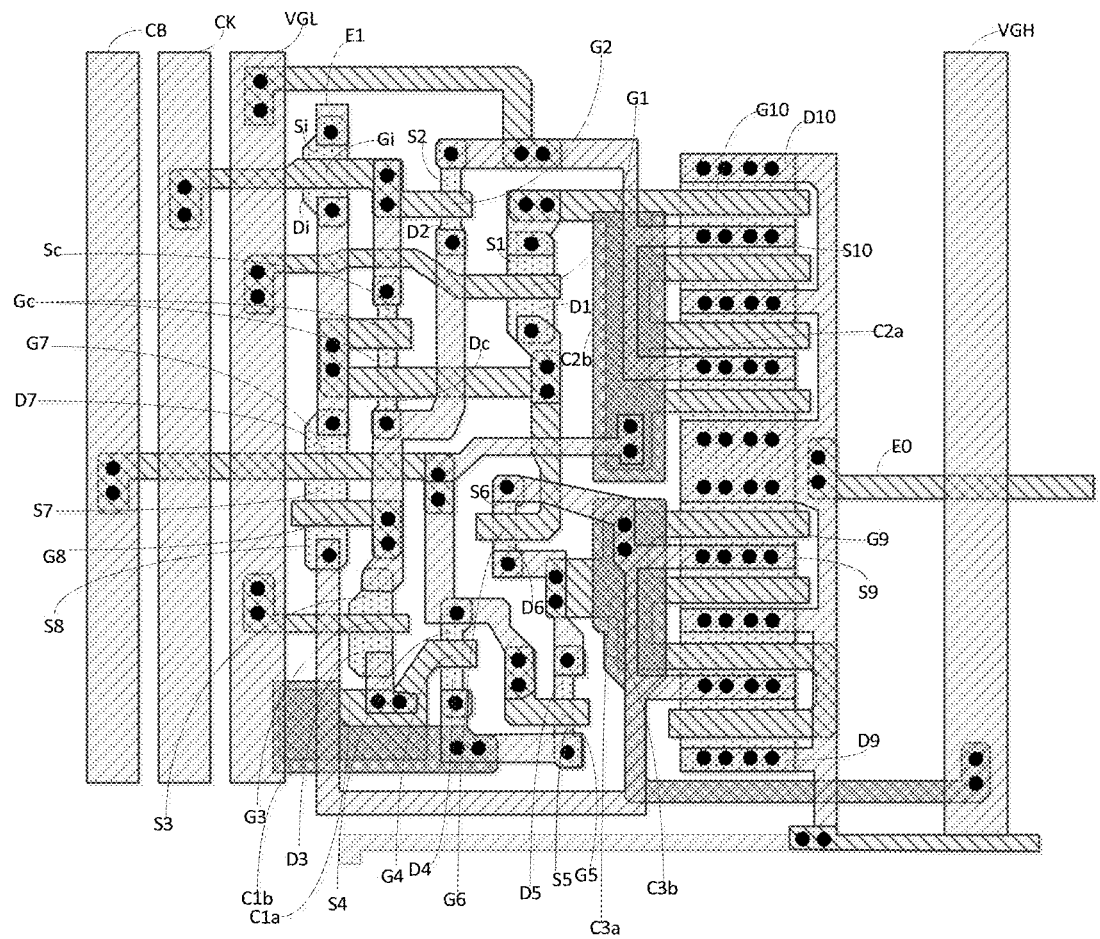
FIG. 2D is a schematic diagram of a layout of a shift register unit according to at least one embodiment of the present disclosure.

In the embodiment shown in FIG. 2D, the first voltage signal line VGH provides a high voltage signal Vgh, and the second voltage signal line VGL provides a low voltage signal Vg1.

As shown in FIG. 2D, VGH, VGL, CK, and CB are arranged in a direction away from the display area; VGH, VGL, CK, and CB extend in the first direction.

As shown in FIGS. 1 and 2D, the shift register unit includes a first capacitor C1, an output capacitor C2, an output reset capacitor C3, an output transistor T10, an output reset transistor T9, a first transistor T1, a second transistor T2, a third transistor T3, a fourth transistor T4, a fifth transistor T5, a sixth transistor T6, a seventh transistor T7, an eighth transistor T8, an input transistor Ti, and a node control transistor Tc; the shift register unit according to the embodiment is set between VGH and VGL.

As shown in FIG. 2D, VGH is set on a side of T9 close to the display area, VGL is set on a side of T10 away from the display area, the first electrode S9 of T9 is coupled to the first electrode plate C3b of C3, and then is coupled to the VGH through the first electrode plate of C3; the first electrode S10 of T10 is coupled to the VGL through a conductive connection portion; the distance between the VGH and the output circuit is relatively large, and the width of the active layer of T9 and the width of the active layer of T10 are relatively wide, which is not conducive to narrowing the width of the shift register unit in the second direction, and is not conducive to achieving a narrow frame.

As shown in FIG. 2D, C2 is arranged on a side of T10 away from VGH, C3 is arranged on a side of T9 away from VGH, and the second electrode plate C3b of C3 extends in the first direction, so that it is impossible to use the space occupied by C3 to set the transistors included in the shift register unit.

As shown in FIG. 2D, the active layer pattern of T1 extends along the first direction, Ti is arranged on the side of C2 away from T10, and the gate electrode G1 of T1 is coupled to the second voltage signal line VGL through the conductive connection portion which is long and extends in the second direction. The path between the gate electrode of T1 and VGL is relatively long, which increases the overlap of different layers of wiring.

In FIG. 2D, E0 is the signal output line.

Figure 3A:
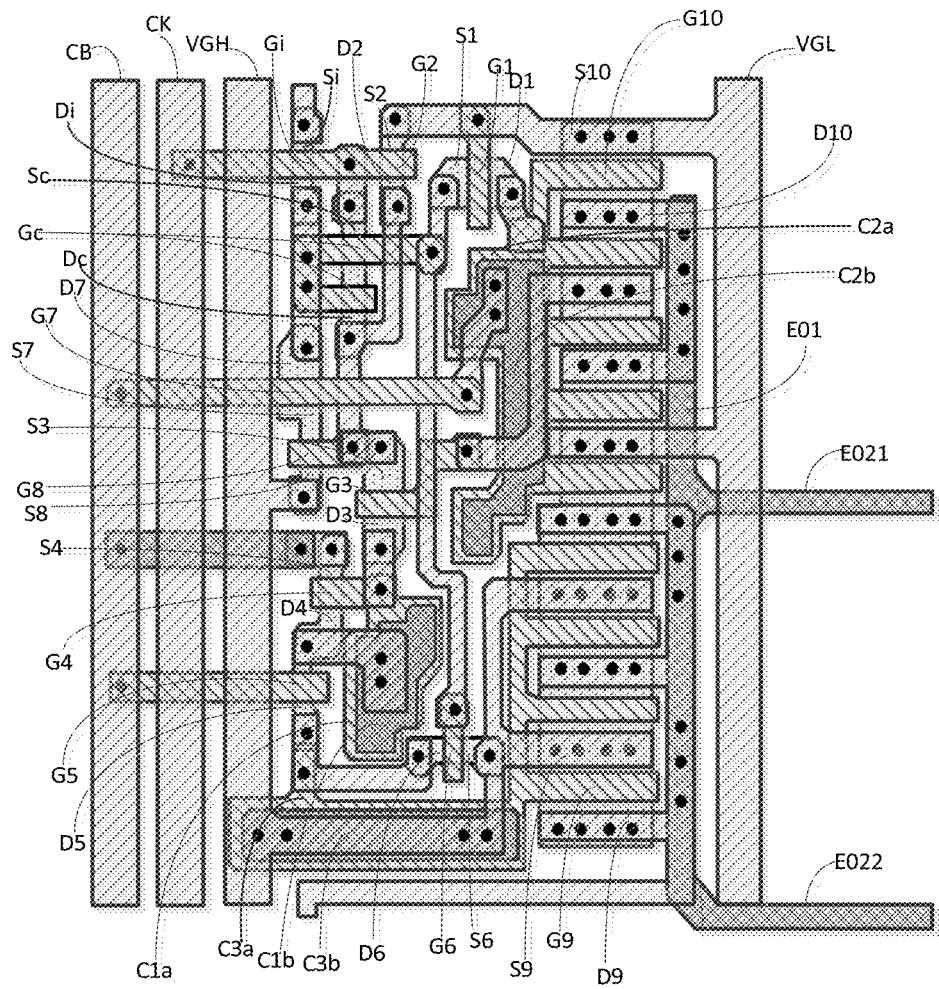
FIG. 3A is another schematic diagram of the layout of the shift register unit according to at least one embodiment of the present disclosure.

In FIGS. 2D and 3A, G1 is the gate electrode of T1, S1 is the first electrode of T1, D1 is the second electrode of T1; G2 is the gate electrode of T2, S2 is the first electrode of T2, D2 is the second electrode of T2; G3 is the gate electrode of T3, S3 is the first electrode of T3, and D3 is the second electrode of T3; G4 is the gate electrode of T4, S4 is the first electrode of T4, and D4 is the second electrode of T4; G5 is the gate electrode of T5, and S5 is the first electrode of T5, D5 is the second electrode of T5; G6 is the gate electrode of T6, S6 is the first electrode of T6, D6 is the second electrode of T6, G7 is the gate electrode T7, S7 is the first electrode of T7, and D7 is the second electrode of T7; G8 is the gate electrode of T8, and S8 is the first electrode of T8, D8 is the second electrode of T8; G9 is the gate electrode of T9, S9 is the first electrode of T9, and D9 is the second electrode of T9; G10 is the gate electrode of T10, and S10 is the first electrode of T10, D10 is the second electrode of T10; Gi is the gate electrode of Ti, Si is the first electrode of Ti, Di is the second electrode of Ti; Gc is the gate electrode of Tc, Sc is the first electrode of Tc, and Dc is the second electrode of Tc; C1a is the first electrode plate of C1, and C1b is the second electrode plate of C1. C2a is the first electrode plate of C2, C2b is the second electrode plate of C2; C3a is the first electrode plate of C3, and C3b is the second electrode plate of C3.

In at least one embodiment shown in FIG. 2D, the first direction may be a vertical direction from top to bottom, and the second direction may be a horizontal direction from left to right, but is not limited to this. In actual operation, the first direction can also be a vertical direction from bottom to top, and the second direction can also be a horizontal direction from right to left; or, the first direction can also be other directions, and the second direction can also be other directions.

In the layout of the gate driving circuit shown in FIG. 2D, the active layer of T9 and the active layer of T10 are formed by a continuous first semiconductor layer, and the width of the first semiconductor layer in the second direction is relatively large. Therefore, the width of the shift register unit in the horizontal direction is relatively large, which is not conducive to the compact arrangement of the devices in the shift register unit in the horizontal direction, and is not conducive to the development of a narrow frame of the display substrate.

The shift register unit shown in FIG. 2D may be an n-th stage of shift register unit included in the scan driving circuit, and n is a positive integer.

Based on the existence of the above-mentioned problems, the present disclosure has discovered through research that the layout of the transistors in the shift register unit can be adjusted to reduce the area occupied by the shift register unit, thereby reducing the frame width of the display substrate.

In the layout shown in FIG. 3A, the first voltage signal line VGH provides a high voltage signal Vgh, and the second voltage signal line VGL provides a low voltage signal Vgl; in at least one embodiment of the present disclosure, the shift register units are arranged between VGH and VGL.

In FIG. 3A, E01 is the first output line portion of the signal output line, E021 is the first second output line portion of the signal output line, and E022 is the second output line portion of the signal output line. E01 is arranged in the first direction, E021 is arranged in the second direction, E01, E021 and E022 are coupled to each other, and the first direction intersects the second direction. As shown in FIG. 3A, E01 is disposed between the VGL and the output circuit, and E021 and E022 extend to the display area along the second direction, so as to provide a light emitting control signal for a pixel circuit located in the display area.

For example, in the layout shown in FIG. 3A, the first direction may be a vertical direction from top to bottom, and the second direction may be a horizontal direction from left to right, but it is not limited to this.

The shift register unit shown in FIG. 3A may be an n-th stage of shift register unit included in the scan driving circuit, and n is a positive integer.

As shown in FIGS. 1 and 3A, in at least one embodiment, the shift register unit includes a first capacitor C1, an output capacitor C2, an output reset capacitor C3, an output transistor T10, an output reset transistor T9, a first transistor T1, a second transistor T2, a third transistor T3, a fourth transistor T4, a fifth transistor T5, a sixth transistor T6, a seventh transistor T7, an eighth transistor T8, an input transistor Ti and a node control transistor Tc; as shown in FIG. 3A, the output circuit includes the output transistor T10 and the output reset transistor T9.

The gate electrode G10 of the output transistor T10 is coupled to the first electrode plate C2a of the output capacitor C2, the first electrode S10 of the output transistor T10 is coupled to the second voltage signal line VGL, and the second electrode D10 of the output transistor T10 is coupled to the first output line portion E01 included in the signal output line.

The gate electrode G9 of the output reset transistor T9 is coupled to the first electrode plate C3a of the output reset capacitor C3, the first electrode S9 of the output reset transistor T9 is coupled to the first voltage signal line VGH, the second electrode D9 of the output reset transistor T9 is coupled to the first output line portion E01 included in the signal output line.

In the layout of the gate driving circuit shown in FIG. 3A, the active layer of T9 and the active layer of T10 can be formed by a continuous first semiconductor layer, and the width of the active layer of T10 in the second direction is reduced, so that other devices included in the shift register unit can use the extra space in the lateral direction, narrow the width of the shift register unit in the lateral direction, and facilitate the compact arrangement of the devices in the shift register unit in the horizontal direction, and the narrow frame of the display substrate.

As shown in FIG. 3A, when the shift register unit of the above structure is arranged in the edge area of the display substrate, along the direction away from the display area of the display substrate, the second voltage signal line VGL, the first voltage signal line VGH, the second clock signal lines CK and the first clock signal line CB are arranged in sequence; the second voltage signal line VGL, the first voltage signal line VGH, the second clock signal line CK and the first clock signal line CB all extend along the first direction.

As shown in FIG. 3A, the first capacitor C1, the output capacitor C2, the output reset capacitor C3, the output transistor T10, the output reset transistor T9, the first transistor T1, the second transistor T2, the third transistor T3, the fourth transistor T4, the fifth transistor T5, the sixth transistor T6, the seventh transistor T7, the eighth transistor T8, the input transistor Ti and the node control transistor Tc are all arranged between VGH and VGL.

As shown in FIG. 3A, the width of the active layer of T10 in the second direction is reduced, and the space saved in the second direction is used to set C2 to narrow the width of the shift register unit in the second direction.

Moreover, as shown in FIG. 3A, the VGL is arranged on the side of the output circuit close to the display area, and the VGH is arranged on the side of the output circuit away from the display area to facilitate the coupling of T10 and VGL, thereby saving space.

As shown in FIG. 3A, the electrode plate of the output reset capacitor C3 extends in the second direction, and C3 is arranged at the lower left of T9, which can reduce the vertical space occupied by C3 and facilitate the gate electrode of T9 G9 to be coupled to the first electrode plate C3a of C3, and facilitate the first electrode S9 of T9 to be coupled to the second electrode plate C3b of C3, and C3 is set close to VGH to facilitate the second electrode plate C3b of C3 to be coupled to VGH.

As shown in FIG. 3A, the active pattern of T1 is changed from extending in the first direction to extending in the second direction. The gate electrode of T1 is directly coupled to the first electrode S2 of T2, which saves the space structure and shortens the coupling path from the gate electrode of T1 to the CB, and reduces the overlap of wiring in different layers caused by the coupling path.

As shown in FIG. 3A, T9, T10, and VGL are arranged adjacent to each other along the second direction, and the first electrode S10 of T10 and the gate electrode G3 of T2 are coupled to the VGL by a common wiring, which saves space.

As shown in FIG. 3A, T4 and T5 are arranged close to CB, thereby shortening the coupling path between T4 and CB, and shortening the coupling path between T5 and CB; and changing the arrangement positions of T4, T5, and T6 to match the shape of the electrode plate of C1 better.

As shown in FIG. 3A, the electrode plate of C3 is changed to extend in the second direction, and C3 is arranged below T4, T5, T6, and C1. The change of the position of C3 also provides space for T9 to increase the width to length ratio.

In at least one embodiment of the present disclosure, C3 is placed in the second direction, and the orthographic projection of C3 on the base substrate partially overlaps the orthographic projection of VGH on the base substrate, thereby saving space in the second direction. Therefore, the saved space is used to increase the width to length ratio of T9 in the second direction.

In addition, in the layout space shown in FIG. 3A, the output active length can also be increased (the output active length is the length of the first semiconductor layer 10 in the first direction), so as to set C3, T12 and C1 in the extra space in the longitudinal direction, and reduce the width of the shift register unit in the second direction.

Figure 6:
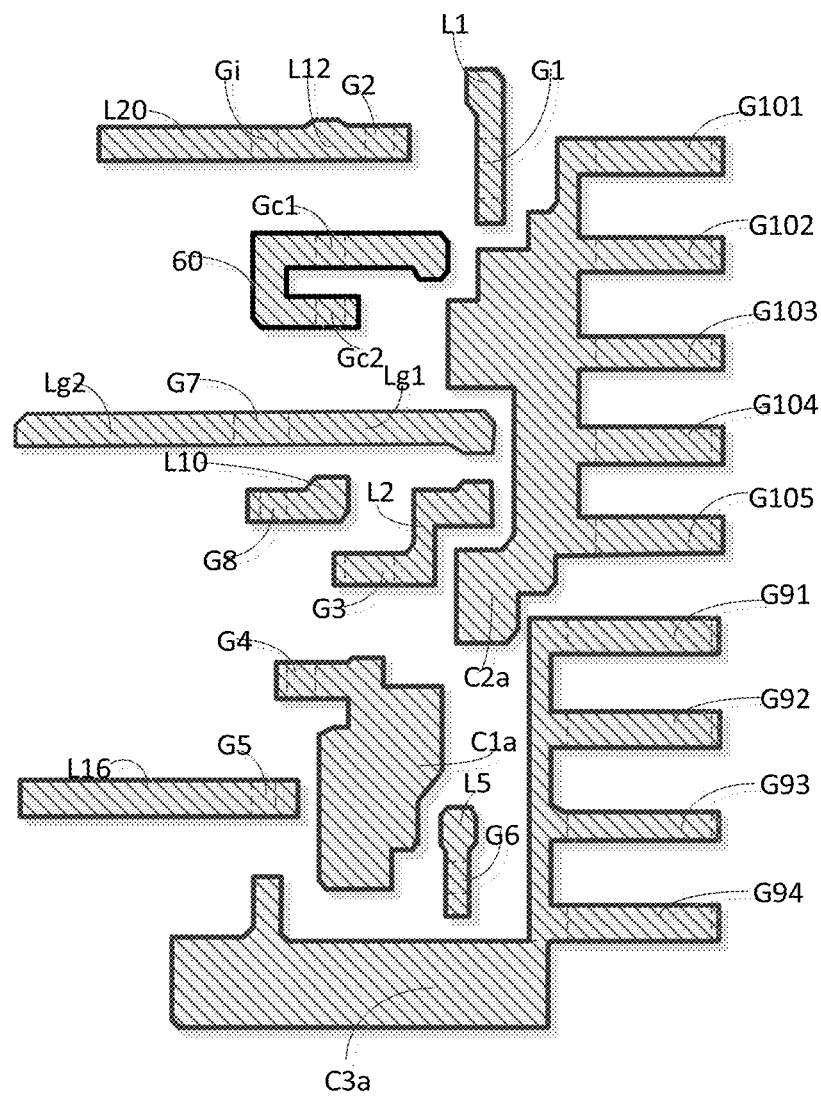
FIG. 6 is a schematic diagram of a first gate metal layer in the shift register unit shown in FIG. 3A according to at least one embodiment of the present disclosure.

And, as shown in FIGS. 3A and 6 (FIG. 6 is a schematic diagram of the first gate metal layer in FIG. 3A), the gate electrode Gc of the Tc includes a first gate electrode pattern Gc1 and a second gate electrode pattern Gc2 that are coupled to each other, so that Tc is formed as a double gate structure.

The purpose of the double-gate structure design is that, in the second time period P2, when the shift register unit included in the scan driving circuit outputs a high voltage signal Vgh, T10 should be completely turned off, and the high level at the gate electrode of T10 is applied by the source electrode of T8. Therefore, in the second time period P2, it is necessary to ensure that T8 is turned on, that is, the potential of the second node N2 needs to be a low level; and in the second time period P2, the potential at the gate electrode of Tc is a high level, to ensure that the potential of the second node N2 is not increase due to current leakage of Tc, so Tc is designed in a double-gate structure, which makes it easier for Tc to be turned off.

In at least one embodiment of the present disclosure, the first direction intersects the second direction. For example, the first direction may be perpendicular to the second direction, but it is not limited thereto.

Specifically, an angle at which the second direction intersects with the first direction can be set according to actual needs. For example, the second direction is perpendicular to the first direction.

In at least one embodiment of the present disclosure, the position of the first clock signal line CB and the position of the second clock signal line CK can be interchanged, but this is limited.

Figure 5:
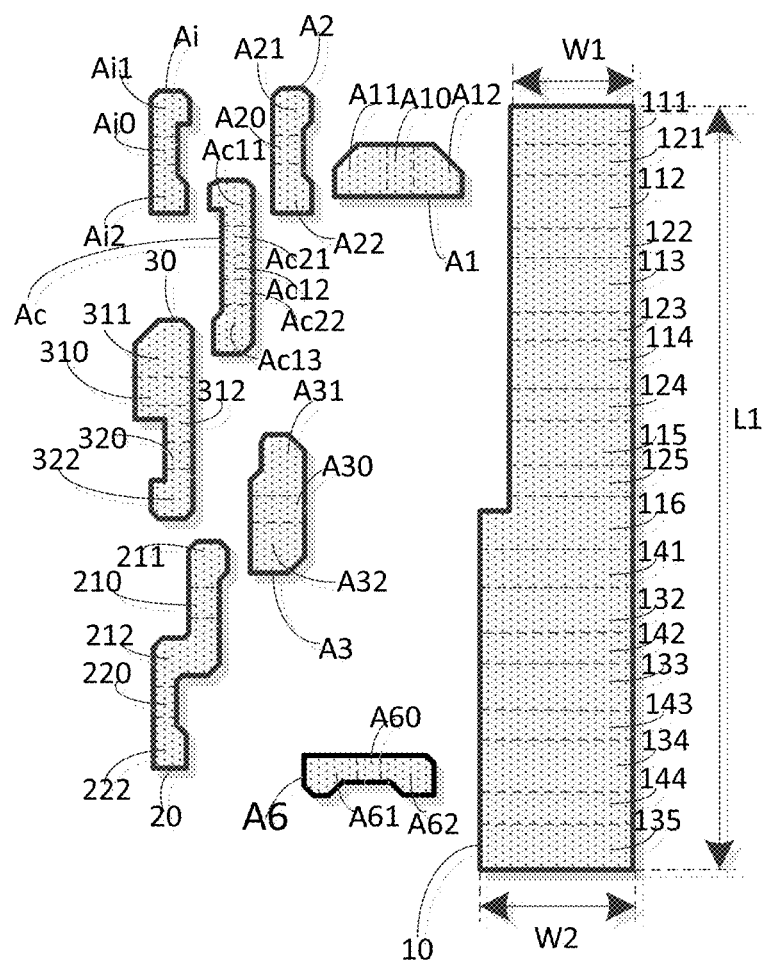
FIG. 5 is a schematic diagram of an active layer in the shift register unit shown in FIG. 3A according to at least one embodiment of the present disclosure.

In the layout shown in FIG. 3A, as shown in FIG. 5 (FIG. 5 is a schematic diagram of the active layer in FIG. 3A), the length of the first semiconductor layer 10 in the first direction is the output active length L1, so the minimum width of the first semiconductor layer 10 in the second direction is the first output active width W1.

A ratio of the output active length L1 to the first output active width W1 is within a first predetermined ratio range.

The first predetermined ratio range is greater than or equal to 3 and less than or equal to 11.

In at least one embodiment of the present disclosure, the first output active width W1 is reduced, so that the devices in the shift register unit other than the output circuit can use the extra lateral space due to the smaller W1 for layout, and then the lateral space occupied by the shift register unit can be reduced.

Optionally, in the layout shown in FIG. 3A, the output active length L1 may be greater than or equal to 50 microns and less than or equal to 130 microns. In at least one embodiment of the present disclosure, the output active length L1 is increased, so that the devices in the shift register unit other than the output circuit can use the longitudinal space that becomes larger due to the increase in L1 for layout, and thus the horizontal space occupied by the shift register unit is reduced.

In at least one embodiment of the present disclosure, the first output active width may be greater than or equal to 12 micrometers and less than or equal to 40 micrometers, but it is not limited thereto.

Optionally, the larger one of a minimum width of the active layer of the output transistor in the second direction and a minimum width of the active layer of the output reset transistor in the second direction is the second output active width, the ratio of the output active length to the second output active width is within a second predetermined ratio range.

The second predetermined ratio range is greater than or equal to 3 and less than or equal to 11, but is not limited to this.

Figure 4A:
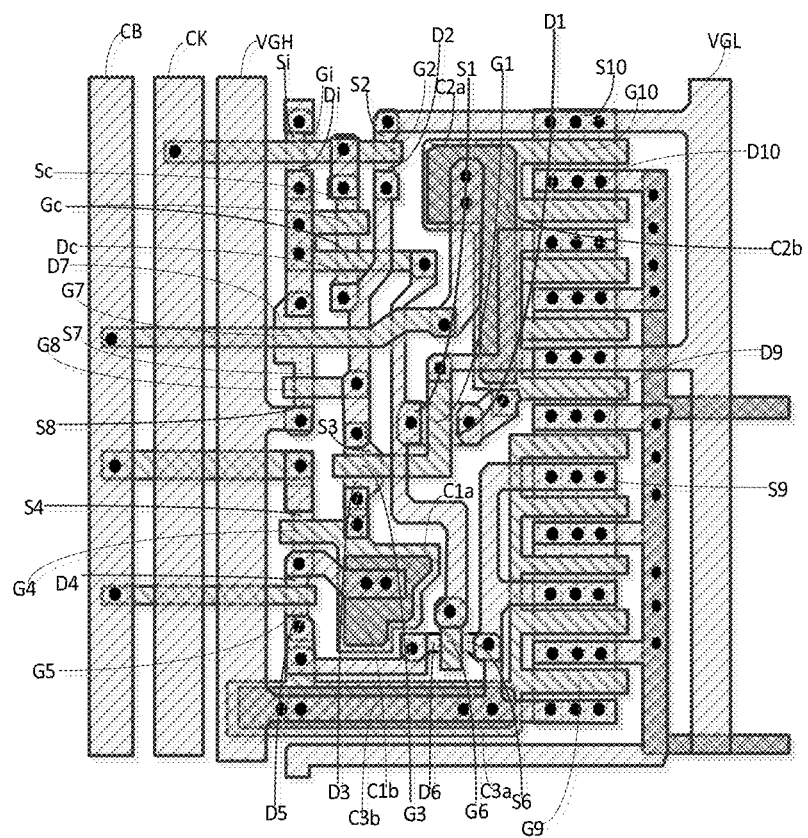
FIG. 4A is still yet another schematic diagram of the layout of the shift register unit according to at least one embodiment of the present disclosure.

In the layout shown in FIG. 4A, the width of the active layer of T9 in the second direction and the width of the active layer of T10 in the second direction are reduced, so as to make full use of the extra space in the second direction. As shown in FIG. 4A, compared with the layout shown in FIG. 3A, T1 moves from the right side of Ti and Tc to the right side of T3, reducing the space occupied by the plurality of transistors in parallel in the second direction. And as shown in FIG. 4A, compared with the layout shown in FIG. 3A, the shape of the electrode plate of C2 is changed, so that the shape of the electrode plate of C2 matches the shapes of T1, T2, and T10 in a better way. In addition to the above differences between FIG. 4A and FIG. 3A, the arrangement and connection of the transistors and capacitors in the layout shown in FIG. 4A can be the same as those of the transistors and capacitors in the layout shown in FIG. 3A.

Figure 11:
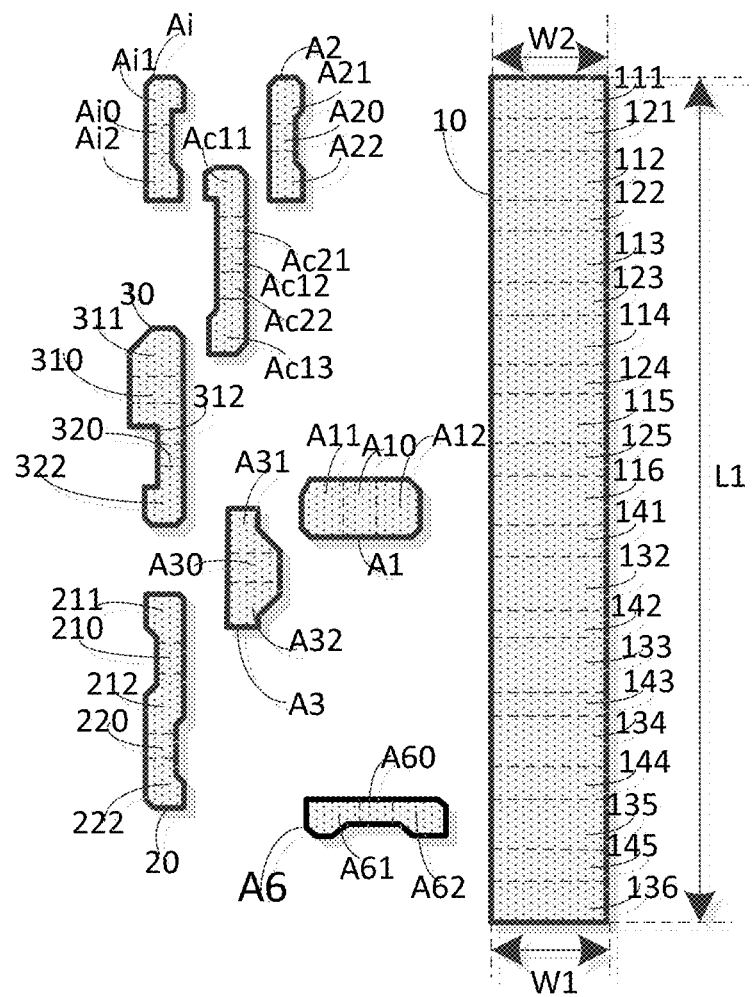
FIG. 11 is a schematic diagram of an active layer in the shift register unit shown in FIG. 4A according to at least one embodiment of the present disclosure.

In the layout shown in FIG. 4A and FIG. 11 (FIG. 11 is a schematic diagram of the active layer in FIG. 4A), the first output active width W1 can be reduced to arrange devices in the shift register unit other than the output circuit in the extra lateral space due to the reduction of the first output active width for layout, thereby reduce the lateral space occupied by the shift register unit.

As shown in FIG. 11, W2 is the second output active width.

Optionally, in the layout shown in FIG. 4A and FIG. 11, the output active length may be greater than or equal to 50 microns and less than or equal to 130 microns. In at least one embodiment of the present disclosure, the output active length is increased, so that the devices in the shift register unit other than the output circuit can be arranged in the extra vertical space for layout due to the increase of the output active length, and the horizontal space occupied by the shift register unit is reduced.

As shown in FIG. 3A, FIG. 8, FIG. 4A and FIG. 14, the first output line portion E01 is coupled to the second electrode D10 of the output transistor T10 through a plurality of first signal line via holes H01 arranged in the signal line overlap area, the first output line portion E01 is coupled to the second electrode D9 of the output reset transistor T9 through a plurality of second signal line via holes H02 arranged in the signal line overlap area. The first signal line via holes H01 are sequentially arranged along the first direction, and the plurality of second signal line via holes H02 are sequentially arranged along the first direction.

Figure 10:
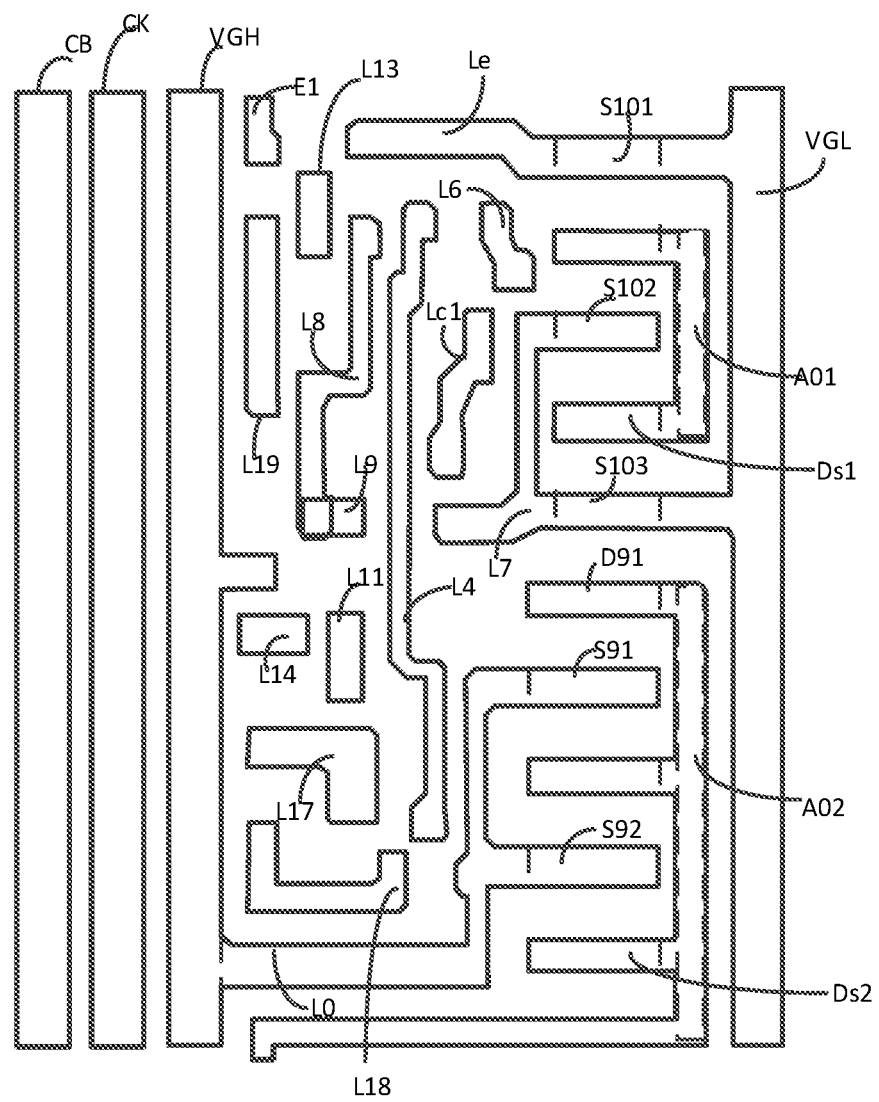
FIG. 10 is a schematic diagram of the source-drain metal layer in FIG. 3A.
Figure 16:
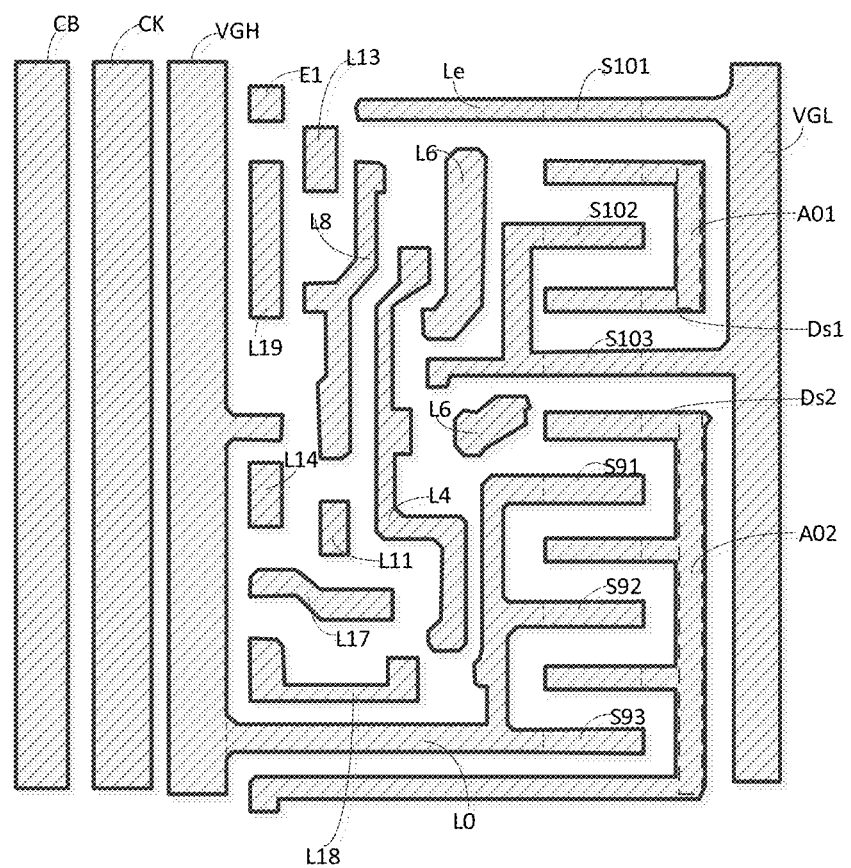
FIG. 16 is a schematic diagram of the source-drain metal layer in FIG. 4A.

As shown in FIG. 3A, FIG. 10 (FIG. 10 is a schematic diagram of the source-drain metal layer in FIG. 3A, in which the first source-drain metal pattern Ds1 and the second source-drain metal pattern Ds2 are shown in FIG. 10), FIG. 4A and FIG. 16 (FIG. 16 is a schematic diagram of the source-drain metal layer in FIG. 4A, in which the first source-drain metal pattern Ds1 and the second source-drain metal pattern Ds2 are shown), the signal line overlap area includes the first signal line overlap area A01 and a second signal line overlap area A02. The first signal line overlap area A01 is an overlap area between the orthographic projection of the first output line portion E01 on the base substrate and the orthographic projection of the first source-drain metal pattern Ds1 on the base substrate, the first source-drain metal pattern Ds1 includes the second electrode of the output transistor T10. The second signal line overlap area A02 is an overlap area between the orthographic projection of the first output line portion E01 on the base substrate and the orthographic projection of the second source-drain metal pattern Ds2 on the base substrate, the second source-drain metal pattern Ds2 incudes the second electrode D9 of the output reset transistor T9.

In at least one embodiment of the present disclosure, the number of the first signal line via holes and the number of the second signal line via holes can be selected according to actual conditions.

The display substrate according to at least one embodiment of the present disclosure includes a scan driving circuit and a display area provided on a base substrate; the scan driving circuit includes a plurality of shift register units, and at least one of the plurality of shift register units includes an output circuit, and the output circuit includes an output transistor and an output reset transistor.

An active layer of the output transistor and an active layer of the output reset transistor are arranged along a first direction, a length of the active layer of the output transistor in the first direction is a first length, and a length of the active layer of the output reset transistor in the first direction is a second length, and a sum of the first length and the second length is an output active length.

A smaller one of A minimum width of the active layer of the output transistor in the second direction and a minimum width of the active layer of the output reset transistor in the second direction is a first output active width, the first direction intersects the second direction.

A ratio of the output active length to the first output active width is within a first predetermined ratio range.

The first predetermined ratio range is greater than or equal to 3 and less than or equal to 11.

In at least one embodiment of the present disclosure, the first output active width is reduced, so that devices in the shift register unit other than the output circuit can use the extra space due to the reducing of the first output active width for layout, thereby reducing the lateral space occupied by the shift register unit.

Optionally, the first output active width is greater than or equal to 12 microns and less than or equal to 40 microns.

Optionally, the output active length is greater than or equal to 50 microns and less than or equal to 130 microns.

In at least one embodiment of the present disclosure, the output active length can also be increased, so that devices in the shift register unit other than the output circuit can use the extra longitudinal space due to the increasing of the output active length for layout, thereby reducing the lateral space occupied by the shift register unit.

In specific implementation, the active layer of the output transistor and the active layer of the output reset transistor are formed by a continuous first semiconductor layer; the first semiconductor layer extends along a first direction.

The length of the first semiconductor layer in the first direction is the output active length.

The minimum length of the first semiconductor layer in the second direction is the first output active width.

Optionally, as shown in FIG. 3A, FIG. 5, FIG. 4A and FIG. 11, the active layer of the output transistor T10 and the active layer of the output reset transistor T9 may be formed by a continuous first semiconductor layer 10, the first semiconductor layer extends along the first direction 10.

As shown in FIG. 5 and FIG. 11, the length of the first semiconductor layer 10 in the first direction is the output active length L1.

The minimum length of the first semiconductor layer 10 in the second direction is the first output active width W1.

As shown in FIG. 5 and FIG. 11, W2 is the second output active width.

As shown in FIG. 3A and FIG. 4A, the output transistor T10 and the output reset transistor T9 are sequentially arranged along the first direction, but not limited to this; in actual operation, the output reset transistor T9 and the output transistor T10 is arranged sequentially along the first direction.

In at least one embodiment of the present disclosure, the output reset transistor T9 is used to provide an invalid light emitting control signal, and the output transistor T10 is used to provide a valid light emitting control signal.

In at least one embodiment of the present disclosure, the valid light emitting control signal may be a voltage signal capable of turning on the light emitting control transistor in the pixel circuit (the gate electrode of the light emitting control transistor is coupled to the light emitting control line), the invalid light emitting control signal may be a voltage signal capable of turning off the light emitting control transistor.

Specifically, the display area of the display substrate includes a plurality of sub-pixels; at least one sub-pixel of the plurality of sub-pixels includes a pixel driving circuit; the pixel driving circuit includes a transistor, a gate line, a light emitting control line, and a data line. The shift register unit included in the scan driving circuit may correspond to at least one light emitting control line, and the signal output line of each shift register unit is coupled to the corresponding at least one light emitting control line for providing a lighting control signal to the corresponding light emitting control line.

In at least one embodiment of the present disclosure, the active layer of the output transistor and the active layer of the output reset transistor may be formed of a continuous first semiconductor layer.

The active layer of the output transistor may include at least two first conductive portions opposite to each other along the first direction and at least one first channel portion, each first channel portion is arranged between two adjacent first conductive portions.

The active layer of the output reset transistor may include at least two second conductive portions opposite to each other along the first direction and at least one second channel portion; each second channel portions is arranged between two adjacent second conductive portions.

The first conductive portion of the active layer of the output transistor that is closest to the active layer of the output reset transistor can be multiplexed as the second conductive portion of the output reset transistor, so that the layout space of the output reset transistor and the output transistor can be further reduced, which is beneficial to realize the narrow frame of the display substrate.

As shown in FIG. 5, the active layer of the output transistor T10 and the active layer of the output reset transistor T9 may be formed by a continuous first semiconductor layer 10.

The active layer of the output transistor T10 includes a first first conductive portion 111, a second first conductive portion 112, a third first conductive portion 113, a fourth first conductive portion 113, a fifth first conductive portion 115, and sixth first conductive portion 116 arranged oppositely; the active layer of the output transistor T10 further includes a first first channel portion 121, a second first channel portion 122, a third first channel portion 123, a fourth first channel portion 124, and a fifth first channel portion 125.

The first first channel portion 121 is arranged between the first first conductive portion 111 and the second first conductive portion 112, and the second first channel portion 122 is arranged between the second first conductive portion 112 and the third first conductive portion 113.

The third first channel portion 123 is arranged between the third first conductive portion 113 and the second first conductive portion 114, and the fourth first channel portion 124 is arranged between the fourth first conductive portion 114 and the fifth first conductive portion 115, the fifth first channel portion 125 is arranged between the fifth first conductive portion 115 and the sixth first conductive portion 116.

The sixth first conductive portion 116 is multiplexed as the first second conductive portion included in the active layer of the output reset transistor T9.

The active layer of the output reset transistor T9 also includes a second second conductive portion 132, a third second conductive portion 133, a fourth second conductive portion 134, and a fifth second conductive portion 132 oppositely arranged along the first direction. The active layer of the output reset transistor T9 also includes a first second channel portion 141, a second second channel portion 142, a third second channel portion 143 and a fourth second channel portion 144.

The first second channel portion 141 is arranged between the first second conductive portion and the second second conductive portion 132, and the second second channel portion 142 is arranged between the second conductive portion 132 and the third second conductive portion 133, and the third second channel portion 143 is arranged between the third second conductive portion 133 and the fourth second conductive portion 134, the fourth second channel portion 144 is arranged between the fourth second conductive portion 134 and the fifth second conductive portion 135.

In the output transistor T10 and the output reset transistor T9, the conductive portions on both sides of the channel portion of each transistor may correspond to the first electrode and the second electrode of the transistor, or may be coupled to the first electrode and the second electrode of the transistor, so that T10 and T9 can be electrically coupled to each other through the sixth first conductive portion 116.

When fabricating the first semiconductor layer 10, for example, the first semiconductor material layer may be formed first, and then after forming the gate electrode G10 of the output transistor T10 and the gate electrode G9 of the output reset transistor T9, the gate electrode G10 of the output transistor T10 and the gate electrode G9 of the output reset transistor T9 are used as a mask, and a portion of the first semiconductor material layer not covered by the gate electrodes of the transistors are doped so that the portion of the first semiconductor material layer not covered by the gate electrodes of the transistors is formed as the conductive portion, and a portion of the first semiconductor material layer covered by each transistor is formed as the channel portion.

According to the specific structure of the above-mentioned display substrate, in the display substrate according to at least one embodiment of the present disclosure, the output transistor T10 and the output reset transistor T9 in the shift register unit can be arranged along the first direction. The area occupied by the shift register unit in the second direction is reduced, so that the display substrate is more in line with the development needs of narrow frame.

As shown in FIG. 11, the active layer of the output transistor T10 and the active layer of the output reset transistor T9 may be formed by a continuous first semiconductor layer 10.

The active layer of the output transistor T10 includes a first first conductive portion 111, a second first conductive portion 112, a third first conductive portion 113, a fourth first conductive portion 113, a fifth first conductive portion 115, and sixth first conductive portion 116 arranged oppositely along the first direction; the active layer of the output transistor T10 further includes a first first channel portion 121, a second first channel portion 122, a third first channel portion 123, a fourth first channel portion 124, and a fifth first channel portion 125.

The first first channel portion 121 is arranged between the first first conductive portion 111 and the second first conductive portion 112, and the second first channel portion 122 is arranged between the second first conductive portion 112 and the third first conductive portion 113.

The third first channel portion 123 is arranged between the third first conductive portion 113 and the second first conductive portion 114, and the fourth first channel portion 124 is arranged between the fourth first conductive portion 114 and the fifth first conductive portion 115, the fifth first channel portion 125 is arranged between the fifth first conductive portion 115 and the sixth first conductive portion 116.

The sixth first conductive portion 116 is multiplexed as the first second conductive portion included in the active layer of the output reset transistor T9.

The active layer of the output reset transistor T9 also includes a second second conductive portion 132, a third second conductive portion 133, a fourth second conductive portion 134, and a fifth second conductive portion 132 oppositely arranged along the first direction. The active layer of the output reset transistor T9 also includes a first second channel portion 141, a second second channel portion 142, and a third second channel portion 143, a fourth second channel portion 144 and a fifth second channel portion 145.

The first second channel portion 141 is arranged between the first second conductive portion and the second second conductive portion 132, and the second second channel portion 142 is arranged between the second conductive portion 132 and the third second conductive portion 133, and the third second channel portion 143 is arranged between the third second conductive portion 133 and the fourth second conductive portion 134, the fourth second channel portion 144 is arranged between the fourth second conductive portion 134 and the fifth second conductive portion 135, and the fifth second channel portion 145 is arranged between the fifth second conductive portion 135 and the sixth second conductive portion 136.

In the output transistor T10 and the output reset transistor T9, the conductive portions on both sides of the channel portion of each transistor may correspond to the first electrode and the second electrode of the transistor, or may be coupled to the first electrode and the second electrode of the transistor, so that T10 and T9 can be electrically coupled to each other through the sixth first conductive portion 116.

Specifically, the gate electrode of the output transistor may include at least one output gate electrode pattern, the first electrode of the output transistor includes at least one first electrode pattern, and the second electrode of the output transistor includes at least one second electrode pattern. The output gate electrode pattern is located between the adjacent first electrode pattern and the second electrode pattern. The first electrode pattern, the output gate electrode pattern, and the second electrode pattern all extend along the second direction.

Specifically, the gate electrode of the output reset transistor may include at least one output reset gate electrode pattern, the first electrode of the output reset transistor includes at least one third electrode pattern, and the second electrode of the output reset transistor includes at least one fourth electrode pattern; the output reset gate electrode pattern is located between the adjacent third electrode pattern and the fourth electrode pattern; the third electrode pattern, the output reset gate electrode pattern, and the fourth electrode pattern all extend along the second direction; the fourth electrode pattern of the output reset transistor closest to the gate electrode of the output transistor is multiplexed as a second electrode pattern of the output transistor.

Figure 9:
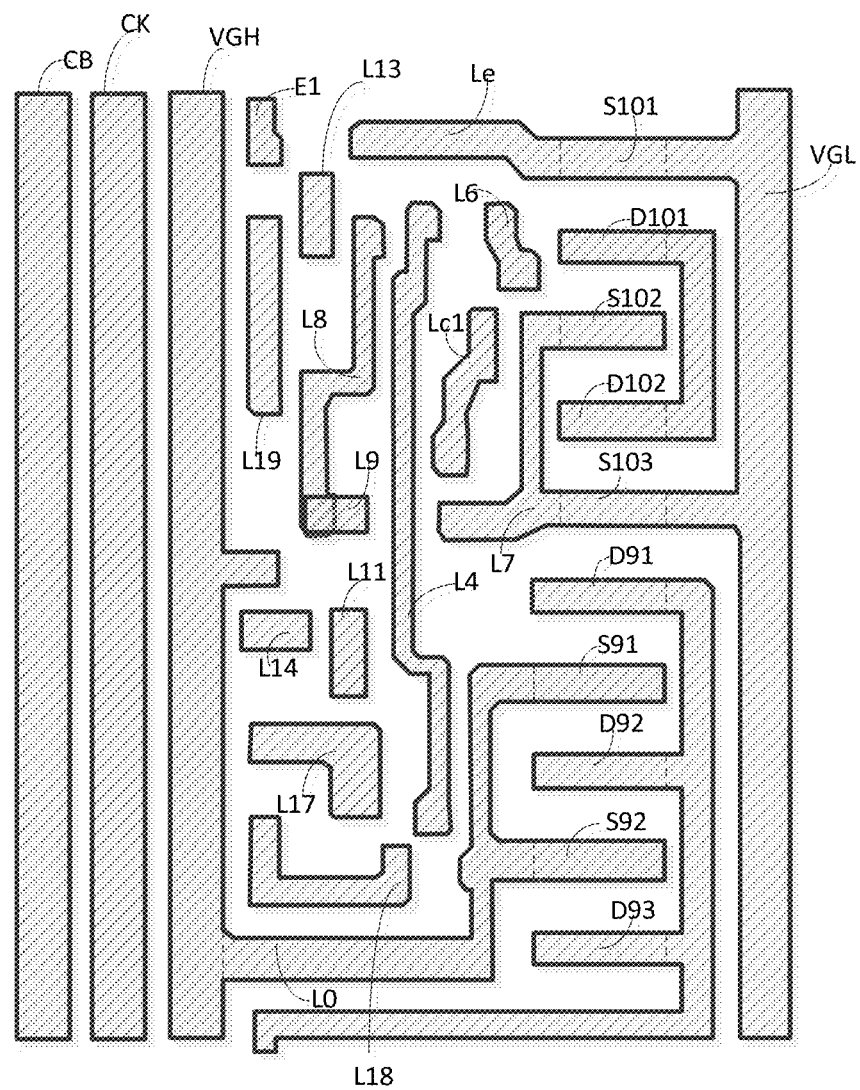
FIG. 9 is a schematic diagram of a source-drain metal layer in the shift register unit shown in FIG. 3A according to at least one embodiment of the present disclosure.

In specific implementation, the number of output reset gate electrode patterns, the number of first electrode patterns, the number of second electrode patterns, the number of output gate electrode patterns, and the number of third electrode patterns and the number of the fourth electrode patterns can be set according to actual needs. Exemplarily, as shown in FIG. 6 and FIG. 9, the number of output gate electrode patterns may be five, the number of first electrode patterns may be three, and the number of second electrode patterns may be three, the number of output reset gate electrode patterns can be four, the number of third electrode patterns can be two, and the number of fourth electrode patterns can be three, but is not limited.

In addition, since the second electrode of the output transistor and the second electrode of the output reset transistor are both coupled to the first output line portion of the signal output line, when the output transistor and the output reset transistor are laid out, the fourth electrode pattern of the output reset transistor closest to the gate electrode of the output transistor is multiplexed as the second electrode pattern of the output transistor, which can further reduce the layout space of the output transistor and the output reset transistor, which is beneficial to implement a narrow frame of the display substrate.

As shown in FIGS. 3A and 6, in some embodiments, the gate electrode of the output transistor T10 may include: a first output gate electrode pattern G101, a second output gate electrode pattern G102, a third output gate electrode pattern G103, a fourth output gate electrode pattern G104 and a fifth output gate electrode pattern G105. The gate electrode of the output reset transistor T9 may include: a first output reset gate electrode pattern G91, a second output reset gate electrode pattern G92, a third output reset gate electrode pattern G93, and a fourth output reset gate electrode pattern G94. The first output gate electrode pattern G101, the second output gate electrode pattern G102, the third output gate electrode pattern G103, the fourth output gate electrode pattern G104, and the fifth output gate electrode pattern G105 are sequentially arranged along the first direction. The first output reset gate electrode pattern G91, the second output reset gate electrode pattern G92, the third output reset gate electrode pattern G93, and the fourth output reset gate electrode pattern G94 are sequentially arranged along the first direction. The first output gate electrode pattern G101, the second output gate electrode pattern G102, the third output gate electrode pattern G103, the fourth output gate electrode pattern G104, and the fifth output gate electrode pattern G105 all extend in the second direction. The second direction intersects the first direction.

The first output gate electrode pattern G101, the second output gate electrode pattern G102, the third output gate electrode pattern G103, the fourth output gate electrode pattern G104, and the fifth output gate electrode pattern G105 are coupled to each other.

The first output reset gate electrode pattern G91, the second output reset gate electrode pattern G92, the third output reset gate electrode pattern G93, and the fourth output reset gate electrode pattern G94 all extend in the second direction.

The first output reset gate electrode pattern G91, the second output reset gate electrode pattern G92, the third output reset gate electrode pattern G93, and the fourth output reset gate electrode pattern G94 are coupled to each other.

As shown in FIG. 9, the first electrode S10 of the output transistor T10 includes a first first electrode pattern S101, a second first electrode pattern S102, and a third first electrode pattern S103.

The second electrode D10 of the output transistor T10 includes a first second electrode pattern D101 and a second second electrode pattern D102.

The first electrode S9 of the output reset transistor T9 includes a first third electrode pattern S91 and a second third electrode pattern S92.

The second electrode D9 of the output reset transistor T9 includes a first fourth electrode pattern D91, a second fourth electrode pattern D92, and a third fourth electrode pattern D93.

The first fourth electrode pattern D91 is multiplexed as the third second electrode pattern included in the output transistor T10.

As shown in FIG. 3A and FIGS. 5 to 10, S101 is coupled to VGL, S102 is coupled to S103, S103 is coupled to VGL, S91 and S92 are respectively coupled to the second electrode plate C3b of the output reset capacitor C3. The second electrode plate C3b of the output reset capacitor C3 is coupled to the first voltage signal line VGH, so that S91 and S92 are coupled to VGH.

As shown in FIG. 3A and FIGS. 5 to 10, the first output line portion E01 is respectively coupled to D101 and D102 through a plurality of first signal line via holes H01 arranged in the signal line overlap area, and the first output line portion E01 is respectively coupled to D91, D92, and D93 through a plurality of second signal line via holes H02 arranged in the signal line overlap area.

The plurality of first signal line via holes H01 are sequentially arranged along the first direction, and the plurality of second signal line via holes H02 are sequentially arranged along the first direction.

In a specific implementation, the active layer of the output transistor may include at least two first conductive portions arranged oppositely along the first direction and at least one first channel portion; each first channel portions is arranged between two adjacent first conductive portions.

The first channel portions corresponds to the output gate electrodes pattern in a one-to-one manner, and the orthographic projection of each first channel portion on the base substrate is located within the orthographic projection of the corresponding output gate electrode pattern on the base substrate.

A portion of the first conductive portion in the output transistor corresponds to the first electrode pattern in a one-to-one manner, and there is a first overlap area between the orthographic projection of the first electrode pattern on the base substrate and the orthographic projection of the corresponding first conductive portion on the base substrate, and the first electrode pattern is coupled to the corresponding first conductive portion through at least one first via hole provided in the first overlap area.

Another portion of the first conductive portion of the output transistor corresponds to the second electrode pattern in a one-to-one manner, and there is a second overlap area between the orthographic projection of the second electrode pattern on the base substrate and the orthographic projection of the corresponding first conductive portion on the base substrate, and the second electrode pattern is coupled to the corresponding first conductive portion through at least one second via hole provided in the second overlap area.

In a specific implementation, the active layer of the output reset transistor includes at least two second conductive portions arranged oppositely along the first direction and at least one second channel portion; each second channel portions is arranged between two adjacent second conductive portions.

The second channel portion corresponds to the output reset gate electrode pattern in a one-to-one manner, and the orthographic projection of each second channel portion on the base substrate is within the orthographic projection of the corresponding output reset gate electrode pattern on the base substrate.

A portion of the second conductive portion in the output reset transistor corresponds to the third electrode pattern on a one-to-one manner, and there is a third overlap area between the orthographic projection of the third electrode pattern on the base substrate and the orthographic projection of the corresponding second conductive portion on the base substrate, and the third electrode pattern is coupled to the corresponding second conductive portion through at least one third via hole provided in the third overlap area.

Another portion of the second conductive portion of the output reset transistor corresponds to the fourth electrode pattern in a one-to-one manner, and there is a fourth overlap area between the orthographic projection of the fourth electrode pattern on the base substrate and the orthographic projection of the corresponding second conductive portion on the base substrate, and the fourth electrode pattern is coupled to the corresponding second conductive portion through at least one fourth via hole provided in the fourth overlap area.

As shown in FIGS. 5, 6, 8 and 9, the first first channel portion 121 corresponds to the first output gate electrode pattern G101, and the second first channel portion 122 corresponds to the second output gate electrode pattern G102, the third first channel portion 123 corresponds to the third output gate electrode pattern G103, the fourth first channel portion 124 corresponds to the fourth output gate electrode pattern G104, and the fifth first channel portion 125 corresponds to the fifth output gate electrode pattern G105.

The orthographic projection of the first first channel portion 121 on the base substrate is located within the orthographic projection of the first output gate electrode pattern G101 on the base substrate. The orthographic projection of the second first channel portion 122 on the base substrate is located within the orthographic projection of the second output gate electrode pattern G102 on the base substrate. The orthographic projection of the third first channel portion 123 on the base substrate is located within the orthographic projection of the third output gate electrode pattern G103 on the base substrate. The orthographic projection of the fourth first channel portion 124 on the base substrate is located within the orthographic projection of the fourth output gate electrode pattern G104 on the base substrate. The orthographic projection of the fifth first channel portion 125 on the base substrate is located within the orthographic projection of the fifth output gate electrode pattern G105 on the base substrate.

The first first conductive portion 111 corresponds to the first first electrode pattern S101, the second first conductive portion 112 corresponds to the first second electrode pattern D101, and the third first conductive portion 113 corresponds to the second first electrode pattern S102, the fourth first conductive portion 114 corresponds to the second second electrode pattern D102, the fifth first conductive portion 115 corresponds to the third first electrode pattern S103, and the sixth first conductive portion 116 corresponds to the first fourth electrode pattern D91.

The sixth first conductive portion 116 is multiplexed as the first second conductive portion included in the active layer of the output reset transistor T9.

The first second channel portion 141 corresponds to the first output reset gate electrode pattern G91, the second second channel portion 142 corresponds to the second output reset gate electrode pattern G92, and the third second channel portion 143 corresponds to third output reset gate electrode pattern G93, and the fourth second channel portion 144 corresponds to the fourth output reset gate electrode pattern G94.

The orthographic projection of the first second channel portion 141 on the base substrate is located within the orthographic projection of the first output reset gate electrode pattern G91 on the base substrate. The orthographic projection of the second second channel portion 142 on the base substrate is located within the orthographic projection of the second output reset gate electrode pattern G92 on the base substrate. The orthographic projection of the third second channel portion 143 on base the substrate is located within the orthographic projection of the third output reset gate electrode pattern G93 on the base substrate. The orthographic projection of the fourth second channel portion 144 on the base substrate is located within the orthographic projection of the fourth output reset gate electrode pattern G94 on the base substrate.

The second second conductive portion 132 corresponds to the first third electrode pattern S91, the third second conductive portion 133 corresponds to the second fourth electrode pattern D92, and the fourth second conductive portion 134 corresponds to the second third electrode pattern S92, and the fifth second conductive portion 135 corresponds to the third fourth electrode pattern D93.

There is a first first verlap area between the orthographic projection of S101 on the base substrate and the orthographic projection of the first first conductive portion 111 on the base substrate, and there is a second first overlap area between the orthographic projection of S102 on the base substrate and the orthographic projection of the third first conductive portion 113 on the base substrate, and there is a third first overlap area between the orthographic projection of S103 on the base substrate and the orthographic projection of the fifth first conductive portion 115 on the base substrate. S101 is coupled to the first first conductive portion 111 through the first via hole H1 in the first first overlap area, S102 is coupled to the third first conductive portion 113 through the first via hole H1 in the second first overlap area, S103 is coupled to the fifth first conductive portion 115 through the first via hole H1 in the third first overlap area.

There is a first second overlap between the orthographic projection of D101 on the base substrate and the orthographic projection of the second first conductive portion 112 on the base substrate, and there is second second overlap area between the orthographic projection of D102 on the base substrate and the orthographic projection of the fourth first conductive portion 114 on the base substrate. D101 is coupled to the second first conductive portion 112 through the second via hole H2 provided in the first second overlap area, and D102 is coupled to the fourth first conductive portion 114 through the second via hole H2 in the second second overlap area.

There is a first fourth overlap area between the orthographic projection of D91 on the base substrate and the orthographic projection of the first second conductive portion 131 on the base substrate, and there is a second fourth overlap area between the orthographic projection of D92 on the base substrate and the orthographic projection of the third second conductive portion 133 on the base substrate, and there is a third fourth overlap area between the orthographic projection of D93 on the base substrate and the orthographic projection of the fifth second conductive portion 135 on the base substrate, D91 is coupled to the first second conductive portion 131 through the fourth via hole H4 in the first fourth overlap area, D92 is coupled to the third second conductive portion 133 through the fourth via hole H4 in the second fourth overlap area, and D93 is coupled to the fifth second conductive portion 133 through the fourth via hole H4 in the third fourth overlap area.

There is a first third overlap area between the orthographic projection of S91 on the base substrate and the orthographic projection of the second second conductive portion 132 on the base substrate, and there is a second third overlap area between the orthographic projection of S92 on the base substrate and the orthographic projection of the fourth second conductive portion 134 on the base substrate; S91 is coupled to the second second conductive portion 132 through the third via hole H3 in the first third overlap area, and S92 is coupled to the fourth second conductive portion 134 through the third via hole H3 in the second third overlap area.

In at least one embodiment of the present disclosure, the number of first via holes, the number of second via holes, the number of third via holes, and the number of fourth via holes can be set according to actual needs.

Figure 17:
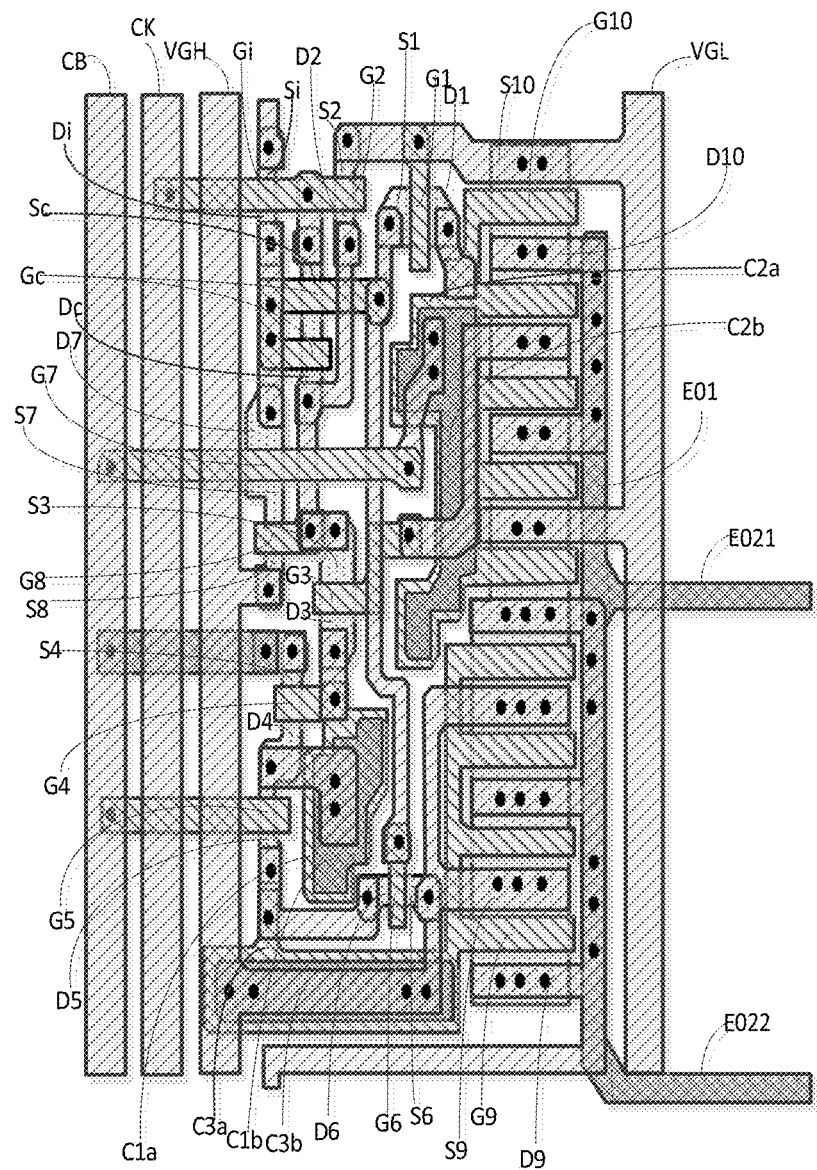
FIG. 17 is another schematic diagram of a layout of a shift register unit according to at least one embodiment of the present disclosure.

In the layout shown in FIG. 3A, the number of first via holes, the number of second via holes, and the number of third via holes are all three, but in actual operation, the number of the above via holes can be selected based on actual conditions. For example, as shown in FIG. 17, in another layout, the number of the first via holes and the number of the second via holes can both be two, and the number of the third via holes and the number of the second via holes can be three. In the layout shown in FIG. 17, the length of the first semiconductor layer in the first direction is longer (compared with the layout shown in FIG. 3A), the width of a semiconductor layer in the second direction is smaller (compared to the layout shown in FIG. 3A), which is more conducive to reduce the width occupied by the shift register unit in the second direction, and is conducive to achieving a narrow frame.

Figure 18:
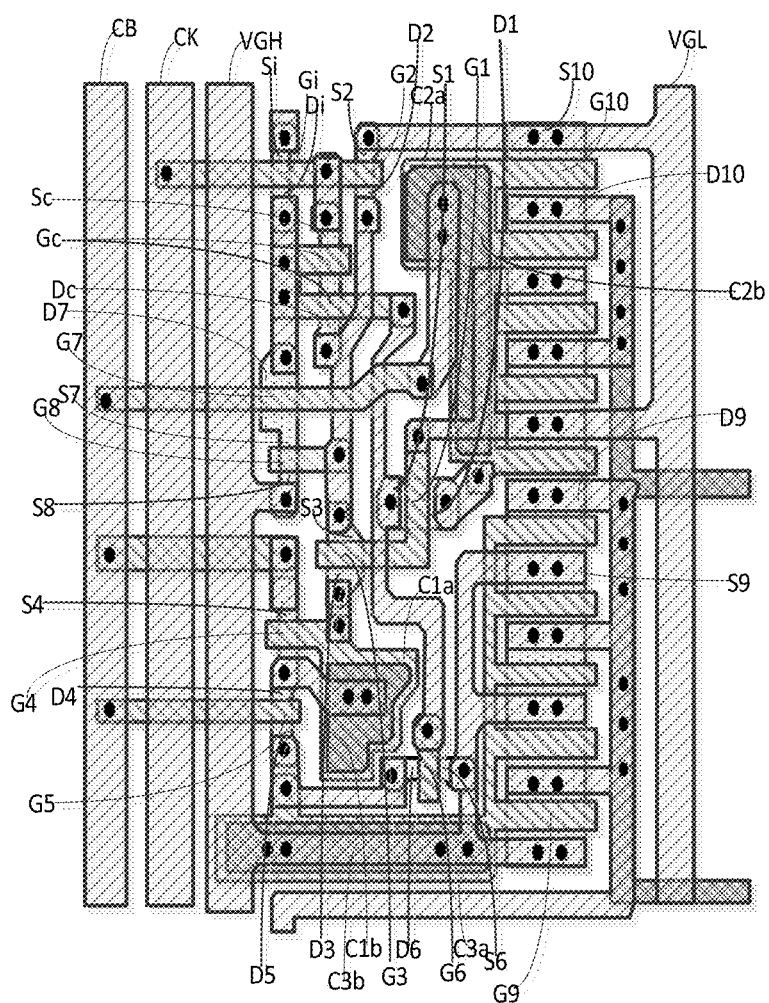
FIG. 18 is yet another schematic diagram of a layout of the shift register unit according to at least one embodiment of the present disclosure.

In the layout shown in FIG. 4A, the number of first via holes, the number of second via holes, and the number of third via holes are all three, but in actual operation, the number of the above via holes can be selected based on actual conditions. For example, as shown in FIG. 18, in another layout, the number of first via holes, the number of second via holes, the number of third via holes, and the fourth via can all be two. In the layout shown in FIG. 18, the length of the first semiconductor layer in the first direction is longer (compared to the layout shown in FIG. 4A), and the width of the first semiconductor layer in the second direction is smaller (compared to the layout shown in FIG. 4A), which is more conducive to reduce the width occupied by the shift register unit in the second direction, and is conducive to achieve a narrow frame.

In the display substrate provided by the above embodiment, the first semiconductor layer 10 is used to form the active layer of the output reset transistor T9 and the active layer of the output transistor T10, which not only makes the space occupied by T9 and T10 in the second direction smaller, but also ensures the channel width of T9 and the channel width of T10 by increasing the size of the active layer of the output reset transistor T9 and the active layer of the output transistor T10 in the first direction, thereby reducing the frame width of the display substrate while ensuring the working performance of T9 and T10.

Figure 12:
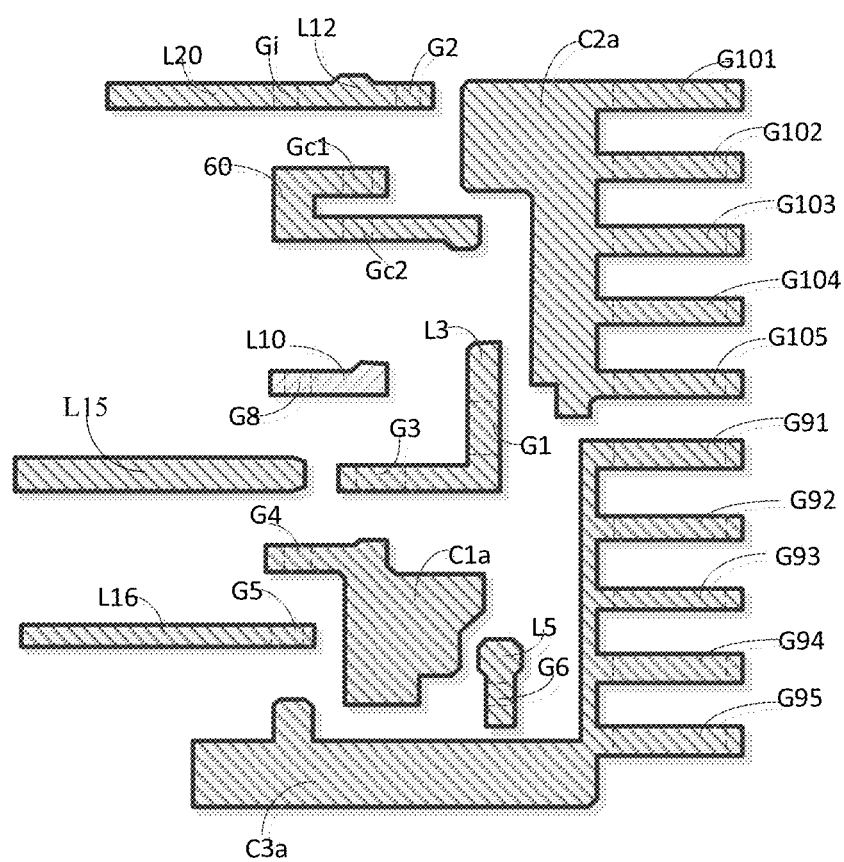
FIG. 12 is a schematic diagram of a first gate metal layer in the shift register unit shown in FIG. 4A according to at least one embodiment of the present disclosure.

As shown in FIGS. 4A and 12, in some embodiments, the gate electrode of the output transistor T10 may include: a first output gate electrode pattern G101, a second output gate electrode pattern G102, a third output gate electrode pattern G103, a fourth output gate electrode pattern G104 and a fifth output gate electrode pattern G105.

The gate electrode of the output reset transistor T9 may include: a first output reset gate electrode pattern G91, a second output reset gate electrode pattern G92, a third output reset gate electrode pattern G93, a fourth output reset gate electrode pattern G94, and a fifth output reset gate electrode pattern G95.

The first output gate electrode pattern G101, the second output gate electrode pattern G102, the third output gate electrode pattern G103, the fourth output gate electrode pattern G104, and the fifth output gate electrode pattern G105 are sequentially arranged along the first direction.

The first output reset gate electrode pattern G91, the second output reset gate electrode pattern G92, the third output reset gate electrode pattern G93, the fourth output reset gate electrode pattern G94, and the fifth output reset gate electrode pattern G95 are sequentially arranged along the first direction.

The first output gate electrode pattern G101, the second output gate electrode pattern G102, the third output gate electrode pattern G103, the fourth output gate electrode pattern G104, and the fifth output gate electrode pattern G105 all extend in the second direction. The first direction intersects the second direction.

The first output gate electrode pattern G101, the second output gate electrode pattern G102, the third output gate electrode pattern G103, the fourth output gate electrode pattern G104, and the fifth output gate electrode pattern G105 are coupled to each other.

The first output reset gate electrode pattern G91, the second output reset gate electrode pattern G92, the third output reset gate electrode pattern G93, the fourth output reset gate electrode pattern G94, and the fifth output reset gate electrode pattern G95 all extend in the second direction.

The first output reset gate electrode pattern G91, the second output reset gate electrode pattern G92, the third output reset gate electrode pattern G93, the fourth output reset gate electrode pattern G94, and the fifth output reset gate electrode pattern G95 are coupled to each other.

Figure 15:
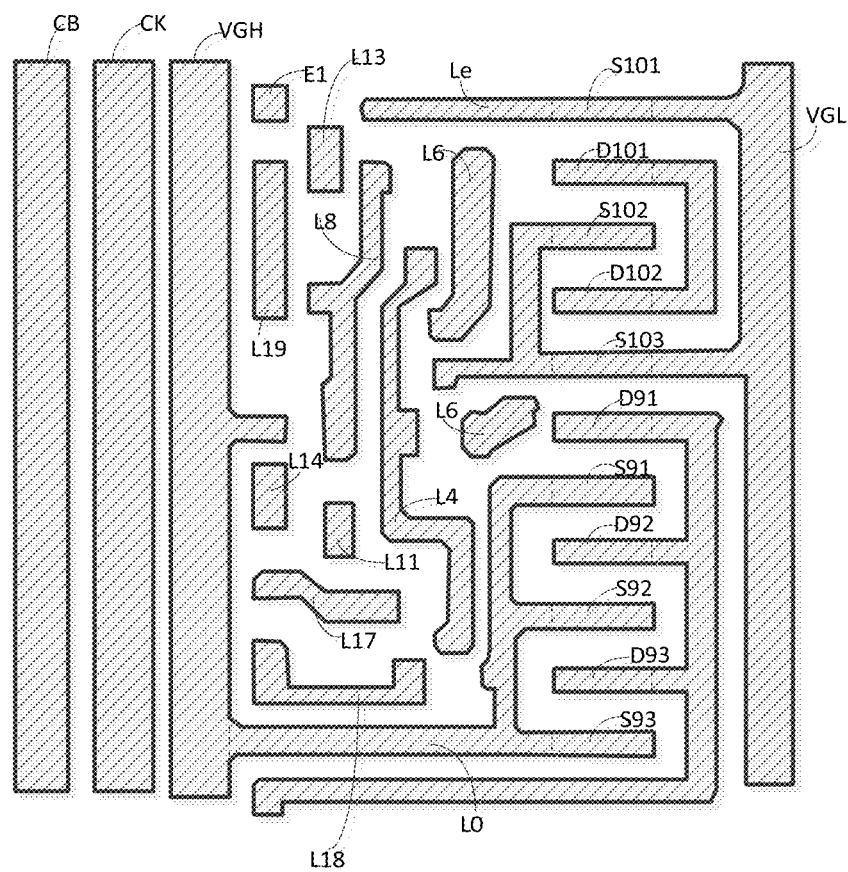
FIG. 15 is a schematic diagram of a source-drain metal layer in the shift register unit shown in FIG. 4A according to at least one embodiment of the present disclosure.

As shown in FIG. 15, the first electrode S10 of the output transistor T10 includes a first first electrode pattern S101, a second first electrode pattern S102, and a third first electrode pattern S103.

The second electrode D10 of the output transistor T10 includes a first second electrode pattern D101 and a second second electrode pattern D102.

The first electrode S9 of the output reset transistor T9 includes a first third electrode pattern S91, a second third electrode pattern S92, and a third third electrode pattern S93.

The second electrode D9 of the output reset transistor T9 includes a first fourth electrode pattern D91, a second fourth electrode pattern D92, and a third fourth electrode pattern D93.

The first fourth electrode pattern D91 is multiplexed as the third second electrode pattern included in the output transistor T10.

As shown in FIGS. 4A and 11 to 16, S101 is coupled to VGL, S102 is coupled to S103, and S103 is coupled to VGL.

S91, S92, and S93 are respectively coupled to the second electrode plate C3b of the output reset capacitor C3, and the second electrode plate C3b of the output reset capacitor C3 is coupled to the first voltage signal line VGH, so that S91, S92 and S93 are all coupled to VGH.

As shown in FIGS. 4A and 11 to 16, the first output line portion E01 is respectively coupled to D101 and D102 through a plurality of first signal line via holes H01 arranged in the signal line overlap area, and the first output line portion E01 is respectively coupled to D91, D92, and D93 through a plurality of second signal line via holes H02 arranged in the signal line overlap area.

The plurality of first signal line via holes H01 are sequentially arranged along the first direction, and the plurality of second signal line via holes H02 are sequentially arranged along the first direction.

As shown in FIGS. 11, 12, 14 and 15, the first first channel portion 121 corresponds to the first output gate electrode pattern G101, and the second first channel portion 122 corresponds to the second output gate electrode pattern G102, the third first channel portion 123 corresponds to the third output gate electrode pattern G103, the fourth first channel portion 124 corresponds to the fourth output gate electrode pattern G104, and the fifth first channel portion 125 corresponds to the fifth output gate electrode pattern G105.

The orthographic projection of the first first channel portion 121 on the base substrate is located within the orthographic projection of the first output gate electrode pattern G101 on the base substrate. The orthographic projection of the second first channel portion 122 on the base substrate is located within the orthographic projection of the second output gate electrode pattern G102 on the base substrate. The orthographic projection of the third first channel portion 123 on the base substrate is located within the orthographic projection of the third output gate electrode pattern G103 on the base substrate. The orthographic projection of the fourth first channel portion 124 on the base substrate is located within the orthographic projection of the fourth output gate electrode pattern G104 on the base substrate. The orthographic projection of the fifth first channel portion 125 on the base substrate is located within the orthographic projection of the fifth output gate electrode pattern G105 on the base substrate.

The first first conductive portion 111 corresponds to the first first electrode pattern S101, the second first conductive portion 112 corresponds to the first second electrode pattern D101, and the third first conductive portion 113 corresponds to the second first electrode pattern S102, the fourth first conductive portion 114 corresponds to the second second electrode pattern D102, the fifth first conductive portion 115 corresponds to the third first electrode pattern S103, and the sixth first conductive portion 115 corresponds to the third first electrode pattern S103, the sixth first conductive portion 116 corresponds to the first fourth electrode pattern D91.

The sixth first conductive portion 116 is multiplexed as the first second conductive portion included in the active layer of the output reset transistor T9.

The first second channel portion 141 corresponds to the first output reset gate electrode pattern G91, the second second channel portion 142 corresponds to the second output reset gate electrode pattern G92, and the third second channel portion 143 corresponds to the third output reset gate electrode pattern G93, the fourth second channel portion 144 corresponds to the fourth output reset gate electrode pattern G94, and the fifth second channel portion 145 corresponds to the fifth output reset gate electrode pattern G95.

The orthographic projection of the first second channel portion 141 on the base substrate is located within the orthographic projection of the first output reset gate electrode pattern G91 on the base substrate. The orthographic projection of the second second channel portion 142 on the base substrate is located within the orthographic projection of the second output reset gate electrode pattern G92 on the base substrate. The orthographic projection of the third second channel portion 143 on the base substrate is located within the orthographic projection of the third output reset gate electrode pattern G93 on the base substrate. The orthographic projection of the fourth second channel portion 144 on the base substrate is located within the orthographic projection of the fourth output reset gate electrode pattern G94 on the base substrate. The orthographic projection of the fifth second channel portion 145 on the base substrate is located within the orthographic projection of the fifth output reset gate electrode pattern G95 on the base substrate.

The second second conductive portion 132 corresponds to the first third electrode pattern S91, the third second conductive portion 133 corresponds to the second fourth electrode pattern D92, and the fourth second conductive portion 134 corresponds to the second third electrode pattern S92, the fifth second conductive portion 135 corresponds to the third fourth electrode pattern D93, and the sixth second conductive portion 136 corresponds to the third third electrode pattern S93.

There is a first first overlap between the orthographic projection of S101 on the base substrate and the orthographic projection of the first first conductive portion 111 on the base substrate, and there is a second first overlap area between the orthographic projection of S102 on the base substrate and the orthographic projection of the third first conductive portion 113 on the base substrate, and there is a third first overlap area between the orthographic projection of S103 on the base substrate and the orthographic projection of the fifth first conductive portion 115 on the base substrate. S101 is coupled to the first first conductive portion 111 through the first via hole H1 in the first first overlap area. S102 is coupled to the third first conductive portion 113 through the first via hole H1 in the second first overlap area. S103 is coupled to the fifth first conductive portion 115 through the first via hole H1 in the third first overlap area.

There is a first second overlap between the orthographic projection of D101 on the base substrate and the orthographic projection of the second first conductive portion 112 on the base substrate, and there is a second second overlap area between the orthographic projection of D102 on the base substrate and the orthographic projection of the fourth first conductive portion 114 on the base substrate. D101 is coupled to the second first conductive portion 112 through the second via hole H2 in the first second overlap area, and D102 is coupled to the fourth first conductive portion 114 through the second via hole H2 in the second second overlap area.

There is a first fourth overlap area between the orthographic projection of D91 on the base substrate and the orthographic projection of the first second conductive portion 131 on the base substrate, there is a second fourth overlap area between the orthographic projection of D92 on the base substrate and the orthographic projection of the third second conductive portion 133 on the base substrate, and there is a third fourth overlap area between the orthographic projection of D93 on the base substrate and the orthographic projection of the fifth second conductive portion 135 on the base substrate. D91 is coupled to the first second conductive portion 131 through the fourth via hole H4 in the first fourth overlap area, D92 is coupled to the third second conductive portion 133 through the fourth via hole H4 in the second fourth overlap area, and D93 is coupled to the fifth second conductive portion 133 through the fourth via holes H4 in the third fourth overlap area.

There is a first third overlap area between the orthographic projection of S91 on the base substrate and the orthographic projection of the second second conductive portion 132 on the base substrate have, and there is a second third overlap area between the orthographic projection of S92 on the base substrate and the orthographic projection of the fourth second conductive portion 134 on the base substrate, and there is a third third overlap area between the orthographic projection of S93 on the base substrate and the orthographic projection of the sixth second conductive portion 136 on the base substrate; S91 is coupled to the second second conductive portion 132 through the third via hole H3 in the first third overlap area is, S92 is coupled to the fourth second conductive portion 134 through the third via hole H3 in the second third overlap area. S93 is coupled to the sixth second conductive portion 136 through the third via hole H3 in the third third overlap area.

In at least one embodiment of the present disclosure, the number of first via holes, the number of second via holes, the number of third via holes, and the number of fourth via holes can be set according to actual needs.

In the layout shown in FIGS. 3A and 4A, the number of first via holes, the number of second via holes, and the number of third via holes are all three, but in actual operation, the number of the above via holes can be selected according to the actual situation. For example, as shown in FIG. 17 and FIG. 18, in another layout, the number of first via holes, the number of second via holes, and the number of third via holes can all be two. In the layout shown in FIGS. 17 and 18, the length of the first semiconductor layer in the first direction is longer (compared to the layout shown in FIGS. 3A and 4A), and the width of the first semiconductor layer in the second direction is smaller (compared with the layout shown in FIG. 3A and FIG. 4A), which is more conducive to reduce the width occupied by the shift register unit in the second direction, and is conducive to achieve a narrow frame.

In the display substrate provided by the above embodiment, the first semiconductor layer 10 is used to form the active layer of the output reset transistor T9 and the active layer of the output transistor T10, which not only makes the space occupied by T9 and T10 in the second direction smaller, but also ensures the channel width of T9 and the channel width of T10 by increasing the size of the active layer of the output reset transistor T9 and the active layer of the output transistor T10 in the first direction, so as to reduce the frame width of the display substrate while ensuring the working performance of T9 and T10.

In at least one embodiment of the present disclosure, the scan driving circuit may include a light emitting control circuit and a gate driving circuit, but it is not limited thereto.

Figure 3B:
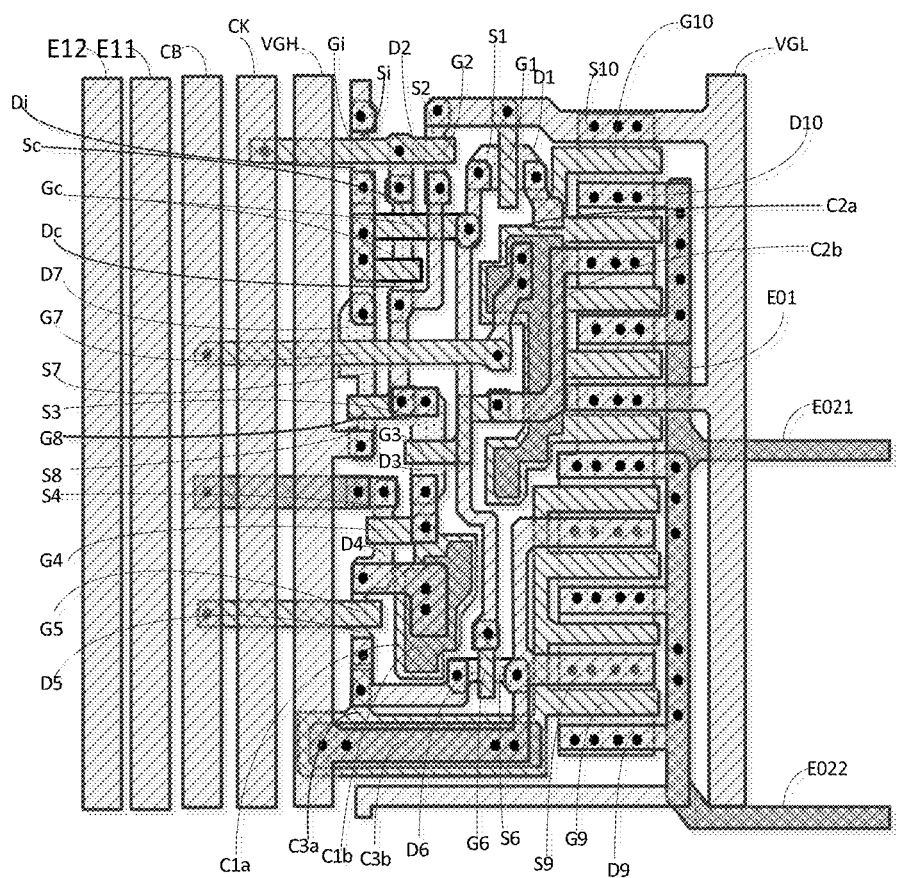
FIG. 3B is yet another schematic diagram of the layout of the shift register unit according to at least one embodiment of the present disclosure.

As shown in FIG. 3B, based on at least one embodiment of the shift register unit shown in FIG. 3A, at least one embodiment of the shift register unit may further include a first start signal line E11 and a second start signal line E12.

The first start signal line E11 and the second start signal line E12 may both extend in a first direction.

As shown in FIG. 3B, E12, E11, CB, CK, and VGH are arranged in sequence along the direction close to the display area.

Figure 3C:
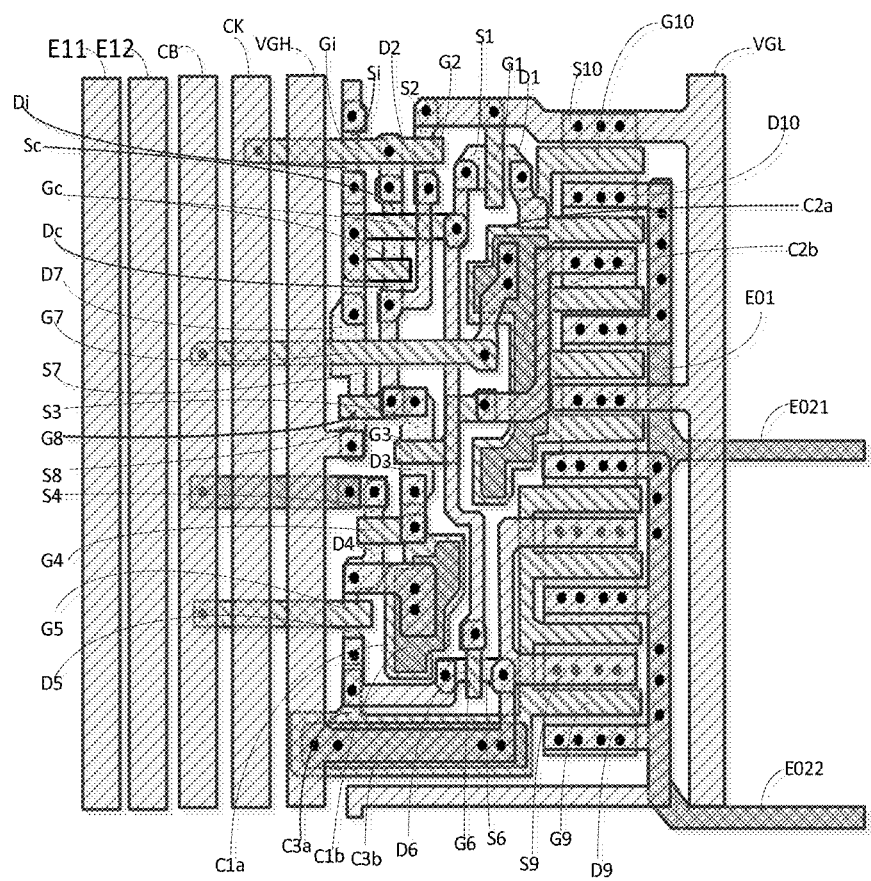
FIG. 3C is still yet another schematic diagram of the layout of the shift register unit according to at least one embodiment of the present disclosure.

In actual operation, as shown in FIG. 3C, on the basis of at least one embodiment shown in FIG. 3B, the position of E11 and the position of E12 can be interchanged, that is, E11, E12, CB, CK, VGH are arranged in sequence along the direction close to the display area.

In at least one embodiment shown in FIG. 3B, E11 may provide an input signal for the input signal end of the first stage of shift register unit included in the light emitting control circuit, and E12 may provide an input signal for the input signal end of the first stage of shift register unit included in the gate driving circuit.

Figure 4B:
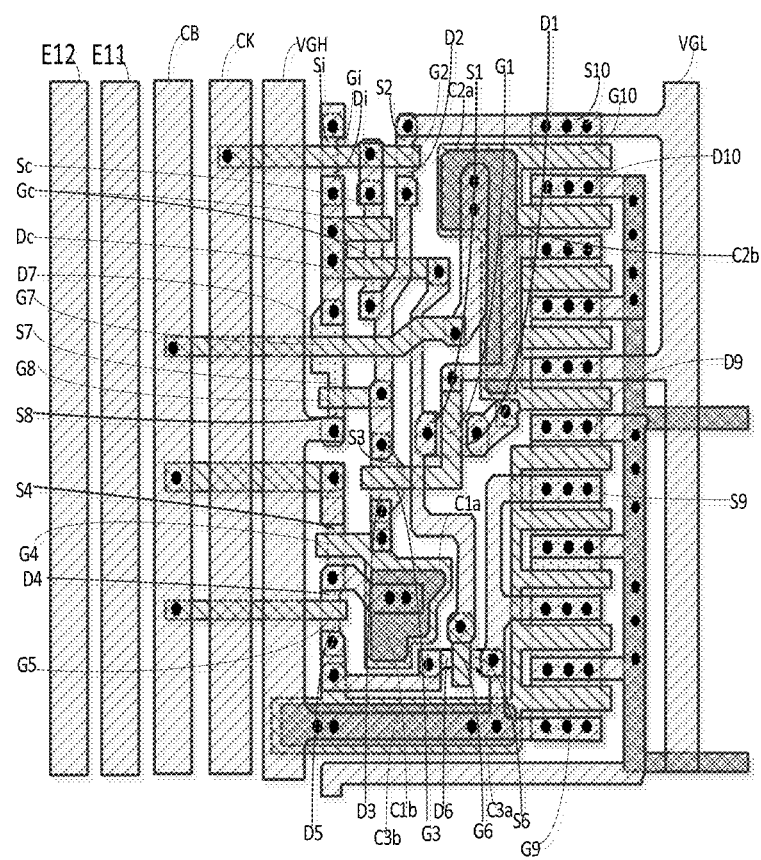
FIG. 4B is still yet another schematic diagram of the layout of the shift register unit according to at least one embodiment of the present disclosure.

As shown in FIG. 4B, based on at least one embodiment of the shift register unit shown in FIG. 4A, at least one embodiment of the shift register unit may further include a first start signal line E11 and a second start signal line E12.

The first start signal line E11 and the second start signal line E12 may both extend in a first direction.

As shown in FIG. 4B, E12, E11, CB, CK, and VGH are arranged in sequence along the direction close to the display area.

Figure 4C:
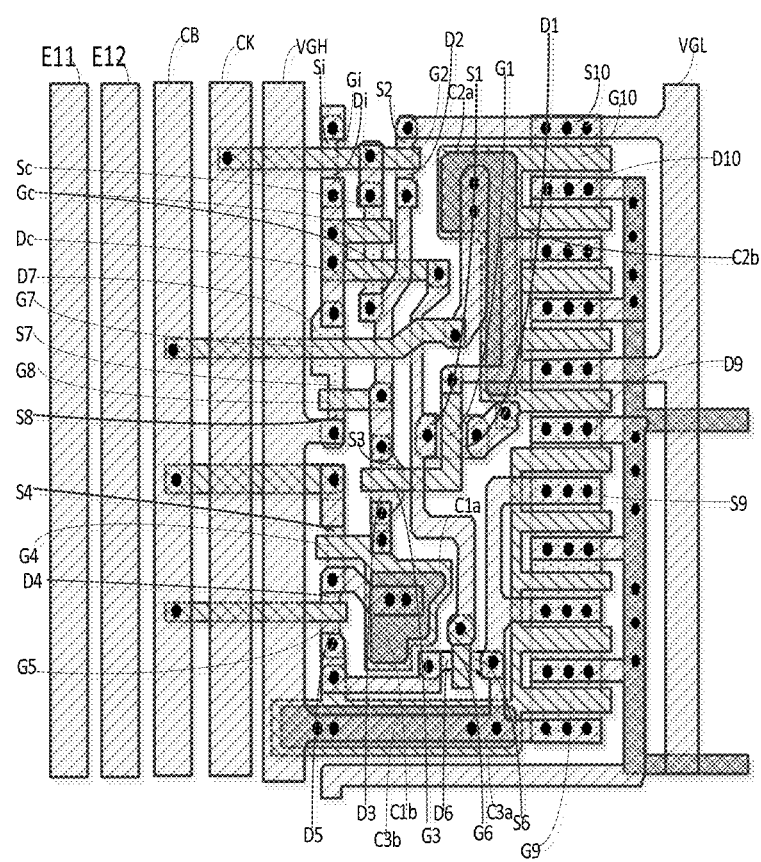
FIG. 4C is still yet another schematic diagram of the layout of the shift register unit according to at least one embodiment of the present disclosure.

In actual operation, as shown in FIG. 4C, on the basis of at least one embodiment shown in FIG. 4B, the position of E11 and the position of E12 can be interchanged, that is, E11, E12, CB, CK, VGH are arranged in sequence along the direction close to the display area.

In at least one embodiment shown in FIG. 4B, E11 may provide an input signal for the input signal end of the first stage of shift register unit included in the light emitting control circuit, and E12 may provide an input signal for the input signal end of the first stage of shift register unit included in the gate driving circuit.

Figure 7:
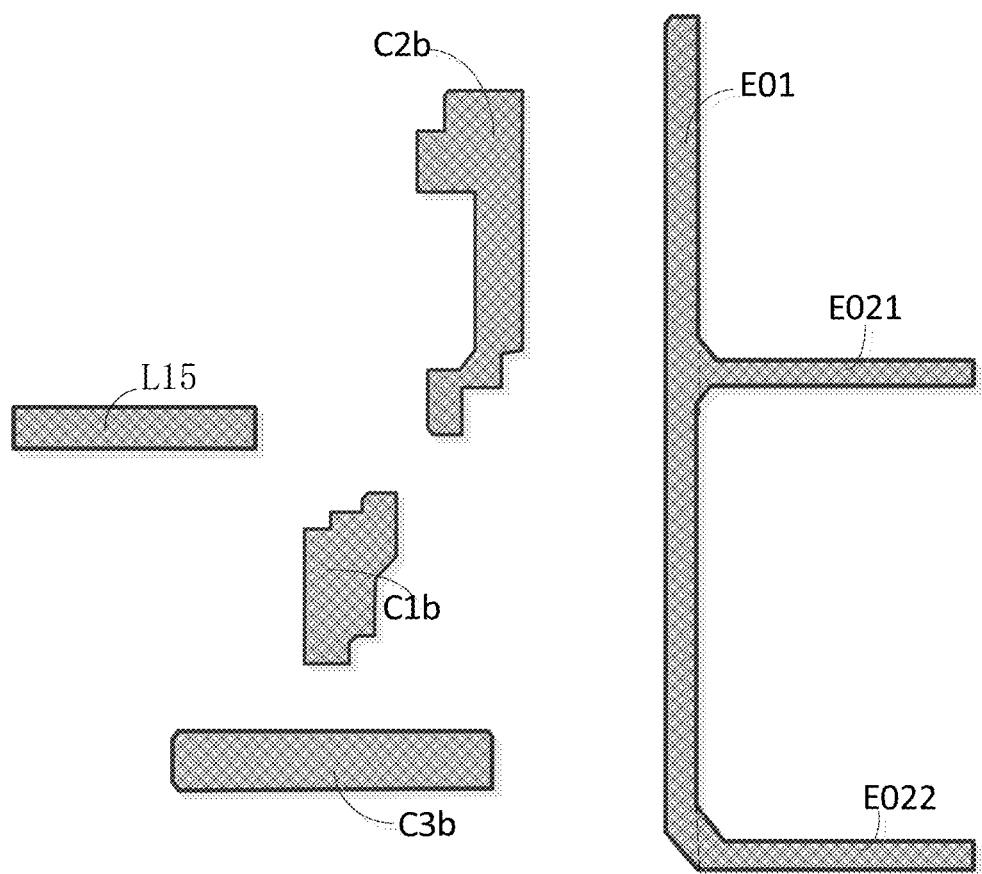
FIG. 7 is a schematic diagram of a second gate metal layer in the shift register unit shown in FIG. 3A according to at least one embodiment of the present disclosure.
Figure 8:
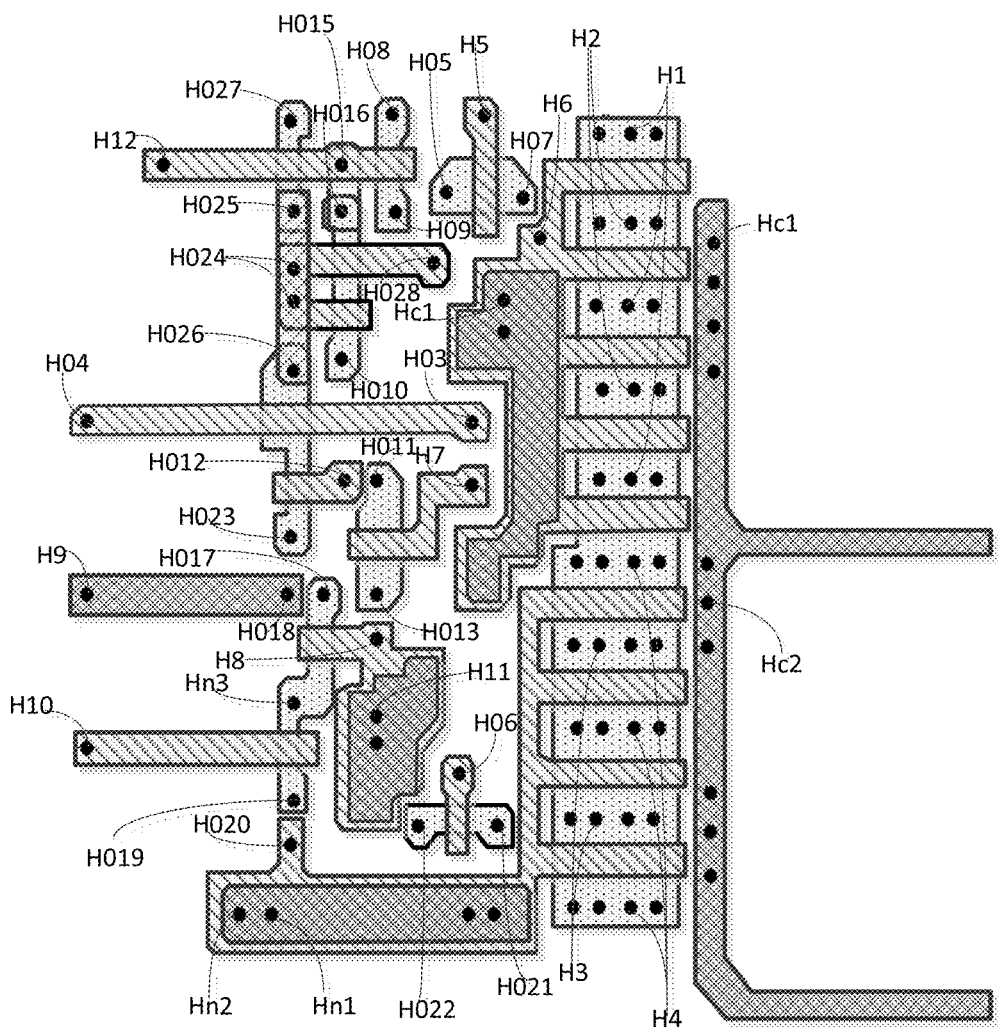
FIG. 8 is a schematic diagram of a via hole used in the shift register unit shown in FIG. 3A according to at least one embodiment of the present disclosure.
Figure 13:
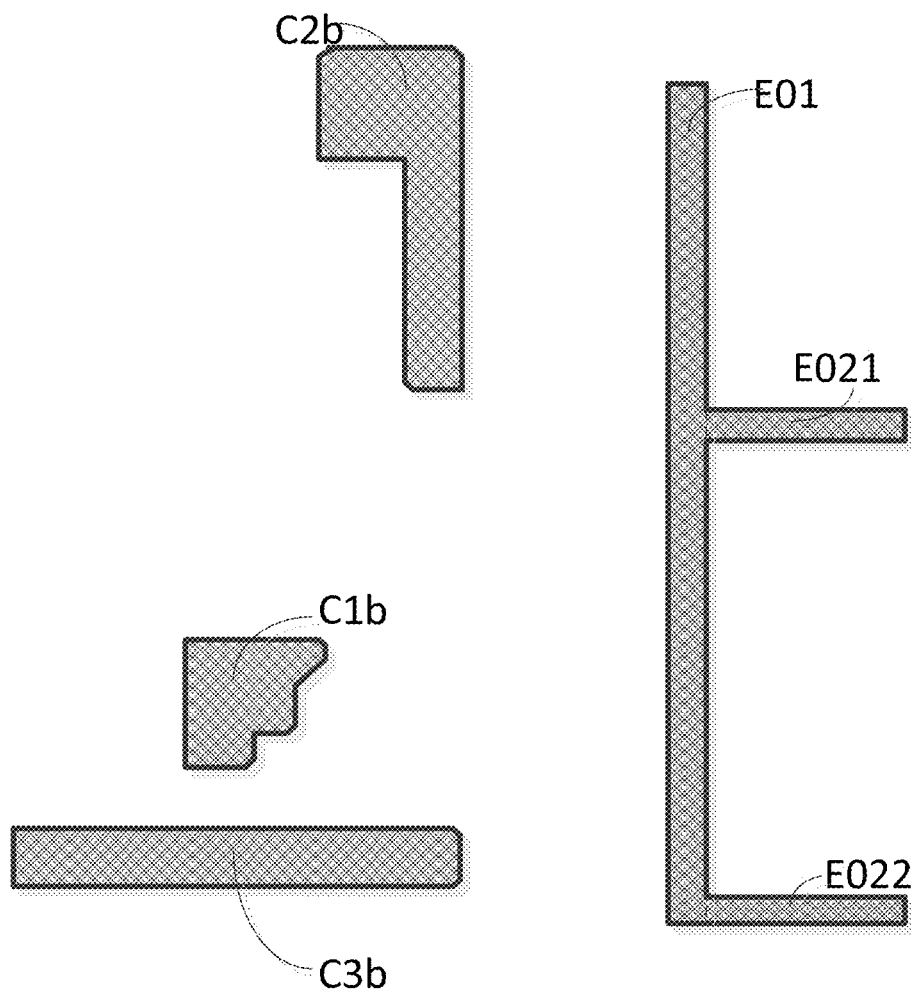
FIG. 13 is a schematic diagram of a second gate metal layer in the shift register unit shown in FIG. 4A according to at least one embodiment of the present disclosure.
Figure 14:
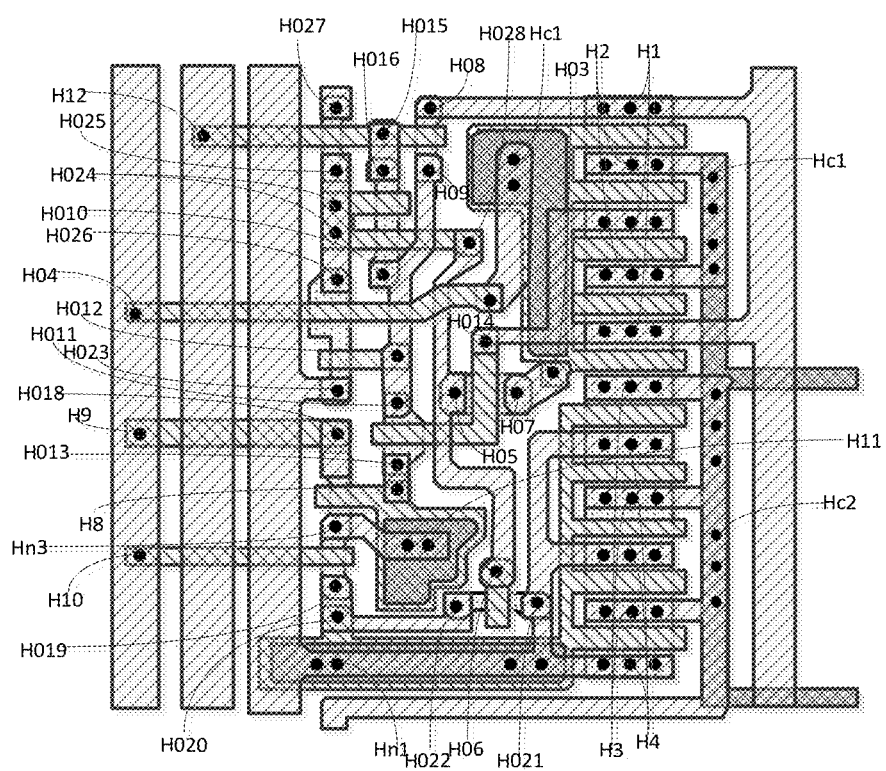
FIG. 14 is a schematic diagram of a via hole used in the shift register unit shown in FIG. 4A according to at least one embodiment of the present disclosure.

In at least one embodiment of the present disclosure, FIG. 5 is a schematic diagram of the active layer in FIG. 3A, FIG. 6 is a schematic diagram of the first gate metal layer in FIG. 3A, and FIG. 7 is a schematic diagram of the second gate metal layer in FIG. 3A. FIG. 8 is a schematic diagram of via holes made after the active layer, the first gate metal layer and the second gate metal layer are sequentially arranged, FIG. 9 is a schematic diagram of the source-drain metal layer in FIG. 3A; FIG. 11 is schematic diagram of the active layer in FIG. 4A. FIG. 12 is a schematic diagram of the first gate metal layer in FIG. 4A, FIG. 13 is a schematic diagram of the second gate metal layer in FIG. 4A, and FIG. 14 is a schematic diagram of the via holes formed after the active layer, the first gate metal layer and the second gate metal layer. FIG. 15 is a schematic diagram of the source-drain metal layer in FIG. 4A.

In a specific implementation, an active layer, a first gate metal layer, a second gate metal layer, a via hole, and a source-drain metal layer are sequentially arranged on the base substrate to form a display substrate.

In at least one embodiment of the present disclosure, in addition to the output transistor and the output reset transistor, the at least one shift register unit may also include a plurality of transistors; the conductive portions on both sides of the channel portion of each transistor may correspond to the first electrode and the second electrode of the transistor, or can be coupled to the first electrode of the transistor and the second electrode of the transistor, respectively.

As shown in FIGS. 3A-16, S91 and S92 are respectively coupled to the second electrode plate C3b of the output reset capacitor C3, and the second electrode plate C3b of the output reset capacitor C3 is coupled to the first voltage signal line VGH, so that S91 and S92 are coupled to VGH.

In at least one embodiment of the present disclosure, as shown in FIGS. 3A and 4A, the at least one shift register unit may further include an output reset capacitor C3; the scan driving circuit further includes a first voltage signal line VGH.

A first electrode plate C3a of the output reset capacitor C3 is coupled to a gate electrode G9 of the output reset transistor T9. A second electrode plate C3b of the output reset capacitor C3 is coupled to the first voltage signal line VGH. The second electrode plate C3b of the output reset capacitor C3 extends along the second direction. The first voltage signal line VGH and the output reset capacitor C3 are both located on a side of the output circuit away from the display area.

In the display substrate according to at least one embodiment of the present disclosure, the at least one shift register unit further includes an output reset capacitor C3. In at least one embodiment of the present disclosure, the electrode plates of C3 extend in the second direction, and C3 is arranged under each transistor, which saves the lateral space occupied by the electrode plate of C3 when it extends in the first direction, and C3 is arranged close to VGH and T9 to facilitate the coupling of the second electrode plate C3b of C3 with VGH, which facilitates the coupling of the gate electrode G9 of T9 with the first electrode plate C3a of C3, which facilitates the coupling of the second electrode plate C3b of C3 with the first electrode S9 of T9.

In addition, optionally, in at least one embodiment of the present disclosure, the output active length is increased, so that the extra space in the longitudinal direction can be used to arrange C3.

As shown in FIGS. 3A-16, the first electrode plate C3a of C3 is coupled to the gate electrode G9 of T9.

As shown in FIGS. 3A and 5-10, the first electrode S9 of T9 is coupled to the first voltage signal line VGH through the output reset conductive connection portion L0; there is an overlap area between the orthographic projection of the output reset conductive connection portion L0 on the base substrate and the orthographic projection of the second electrode plate C3b of the output reset capacitor C3 on the base substrate, and the output reset conductive connection portion L0 is coupled to the second electrode plate C3b of C3 through the first conductive connection via holes Hn1 in the overlap area, so that C3b is coupled to the first electrode S9 of T9.

In addition, as shown in FIGS. 3A and 5-10, there is an overlap area between the orthographic projection of the second electrode plate C3b of the output reset capacitor C3 on the base substrate and the orthographic projection of the VGH on the base substrate, and C3b is coupled to VGH through the second conductive connection via Hn2 in the overlap area.

As shown in FIGS. 4A and 11-16, the first electrode S9 of T9 is coupled to the first voltage signal line VGH through the output reset conductive connection portion L0. There is an overlap area between the orthographic projection of the output reset conductive connection portion L0 on the base substrate and the orthographic projection of the second electrode plate C3b of the output reset capacitor C3 on the base substrate, and the output reset conductive connection portion L0 is coupled to the second electrode plate C3b of C3 through the first conductive connection via hole Hc1 in the overlap area, so that C3b is coupled to the first electrode S9 of T9.

Optionally, as shown in FIGS. 3A-16, the scan driving circuit may further include a first voltage signal line VGH and a second voltage signal line VGL; the at least one shift register unit may also include an output reset capacitor C3.

The output circuit is located between the first voltage signal line VGH and the second voltage signal line VGL, the first voltage signal line VGH is located on the side of the output circuit away from the display area, and the second voltage signal line VGL is located on the side of the output circuit close to the display area.

The first electrode S10 of the output transistor T10 is coupled to the second voltage signal line VGL.

The first electrode S9 of the output reset transistor T9 is coupled to the second electrode plate C3b of the output reset capacitor C3.

In at least one embodiment of the present disclosure, the second voltage signal line VGL is located on the side of the output circuit close to the display area to facilitate the coupling of the first electrode S10 of the output transistor T10 with the VGL.

In specific implementation, both the first voltage signal line VGH and the second voltage signal line VGL extend along a first direction.

A minimum distance in the second direction between the edge of the orthographic projection of the active layer of the output transistor T10 on the base substrate and the edge of the orthographic projection of the second voltage signal line VGL on the base substrate is a first predetermined distance.

Optionally, the first predetermined distance may be greater than or equal to 10 microns and less than or equal to 15 microns, but is not limited to this.

In at least one embodiment of the present disclosure, the distance between the active layer of T10 and the VGL in the second direction is relatively short, which can reduce the width of the shift register unit in the second direction, which is beneficial to realize a narrow frame.

Optionally, the scan driving circuit may further include a second voltage signal line, and the at least one shift register unit may further include a signal output line; the second voltage signal line extends along the first direction, and the second voltage signal line is located on the side of the output circuit close to the display area.

The signal output line includes a first output line portion extending in a first direction.

The first output line portion is coupled to the second electrode of the output transistor through a plurality of first signal line via holes arranged in the first signal line overlap area, and the first output line portion is coupled to the second electrode of the output reset transistor through a plurality of second signal line via holes in the second signal line overlap area, the plurality of first signal line via holes are arranged in sequence along the first direction, and the plurality of second signal line via holes are arranged in sequence along the first direction.

The first signal line overlap area is an overlap area between the orthographic projection of the first output line portion on the base substrate and the orthographic projection of the first source-drain metal pattern on the base substrate, the first source-drain metal pattern includes the second electrode of the output transistor. The second signal line overlap area is an overlap area between the orthographic projection of the first output line portion on the base substrate and the orthographic projection of the second source-drain metal pattern on the base substrate, the second source-drain metal pattern includes the second electrode of the output reset transistor.

The first output line portion is located between the output circuit and the second voltage signal line.

In a specific implementation, the signal output line may include a first output line portion extending along a first direction, the first output line portion is coupled to the second electrode of the output transistor through the first signal line via hole, and the first output line portion is coupled to the second electrode of the output reset transistor through the second signal line via hole. The first output line portion is located between the output circuit and the second voltage signal line to facilitate the coupling of the first output line portion with the output transistor and the output circuit included in the output circuit.

In at least one embodiment of the present disclosure, the scan driving circuit may further include a second voltage signal line, and the at least one shift register unit may further include a signal output line.

The signal output line includes a first output line portion and at least one second output line portion that are coupled to each other.

Both the second voltage signal line and the first output line portion extend in a first direction, and the first output line portion is located between the second voltage signal line and the output circuit.

The second output line portion extends along the second direction.

The second output line portion is used for coupling with the pixel circuit in the display area.

The first output line portion and the output circuit are located on a side of the second voltage signal line away from the display area.

In the layout shown in FIG. 3A and FIG. 4A, the signal output line includes two second output line portions. In specific implementation, the number of second output line portions included in the signal output line can be determined according to the actual conditions.

In at least one embodiment of the present disclosure, the signal output line may further include at least one second output line portion, the second output line portion is coupled to the first output line portion; the second output line portion extends to the display area and is used to provide a light emitting control signal for the pixel circuit located in the display area.

According to a specific embodiment, the minimum width of the active layer of the output transistor in the second direction is smaller than the minimum width of the active layer of the output reset transistor in the second direction.

As shown in FIGS. 3A and 5, the minimum width of the active layer of the output transistor T10 in the second direction is smaller than the minimum width of the active layer of the output reset transistor T9 in the second direction, in the layout shown in FIG. 3A, the first output active width W1 is equal to the minimum width of the active layer of the output transistor T10 in the second direction. In the layout shown in FIG. 3A, only the width of the active layer of T10 is reduced.

According to another specific embodiment, the minimum width of the active layer of the output transistor in the second direction is equal to the minimum width of the active layer of the output reset transistor in the second direction.

As shown in FIGS. 4A and 11, the minimum width of the active layer of the output transistor T10 in the second direction is equal to the minimum width of the active layer of the output reset transistor T9 in the second direction, in the layout shown in FIG. 4A, the first output active width W1 is equal to the minimum width of the active layer of the output transistor T10 in the second direction and the minimum width of the active layer of the output reset transistor T9 in the second direction. In the layout shown in FIG. 4A, the width of the active layer of T10 and the width of the active layer of T9 are reduced.

Optionally, as shown in FIGS. 1 and 3A-16, the at least one shift register unit may further include an output capacitor C2. The first electrode plate C2a of the output capacitor C2 is coupled to the gate electrode G10 of the output transistor T10. The orthographic projection of the second electrode plate C2b of the output capacitor C2 on the base substrate is within the orthographic projection of the first electrode plate C2a of the output capacitor C2 on the base substrate. The output capacitor C2 is located on the side of the output transistor T10 away from the display area.

In at least one embodiment of the present disclosure, the electrode plate of C2 is set close to T10 to facilitate the coupling of the first electrode plate C2a of C2 with the gate electrode G10 of T10, and the reduced lateral width of T10 can be used to set C2, which facilitates to reduce the width of the shift register unit in the second direction.

As shown in FIGS. 3A-16, there is a first electrode plate overlap area between the orthographic projection of the second electrode plate C2b of C2 on the base substrate and the orthographic projection of the first electrode plate conductive connection portion Lc1 on the base substrate, C2b is coupled to the first electrode plate conductive connection portion Lc1 through the first electrode plate connection via hole Hc1 in the first electrode plate overlap area; the first electrode plate conductive connection portion Lc1 is coupled to the first electrode plate conductive connection portion Lc1 through the third connection via hole H03, the first gate electrode conductive connection portion Lg1 is coupled to the gate electrode G7 of the seventh transistor T7, so that the second electrode plate C2b of C2 is coupled to the gate electrode G7 of T7.

The gate electrode G7 of T7 is also coupled to the second gate electrode conductive connection portion Lg2. There is a first conductive line overlap area between the orthographic projection of the second gate electrode conductive connection portion Lg2 on the base substrate and the orthographic projection of the first clock signal line CB on the base substrate, and the second gate electrode conductive connection portion Lg2 is coupled to the first clock signal line CB through a fourth connection via hole H04 provided in the first conductive line overlap area, so that the gate electrode of T7 is coupled to the first clock signal line CB, the second electrode plate C2b of C2 is also coupled to the first clock signal line CB.

As shown in FIGS. 3A and 5-9, in the layout shown in FIG. 3A, the shape of the electrode plate of C2 matches the arrangement of T10, T9, and T1.

In at least one embodiment of the present disclosure, the shape of the second electrode plate of the output capacitor may be L-shaped, but it is not limited to this.

In the layout shown in FIG. 4A, the shape of the second electrode plate C2b of the output capacitor C2 may be L-shaped to match the arrangement of T10, T2, and T1.

Optionally, as shown in FIGS. 1 and 3A-16, the at least one shift register unit may further include a first transistor T1. The first transistor T1 includes a first active pattern A1; the first active pattern A1 extends along a second direction. The first transistor T1 is located on a side of the output circuit away from the display area.

In at least one embodiment of the present disclosure, the first active pattern A1 included in T1 is changed to extend in the second direction, and the space above C2 or the space below C2 is used to set Ti, which can reduce the space occupied by the shift register unit in the second direction.

In specific implementation, the at least one shift register unit may further include a first transistor and a second transistor. The first electrode of the second transistor is coupled to the electrode conductive connection portion; the gate electrode of the first transistor is coupled to the first conductive connection portion. There is a fifth overlap area between the orthographic projection of the first conductive connection portion on the base substrate and the orthographic projection of the electrode conductive connection portion on the base substrate. The electrode conductive connection portion is coupled to the first conductive connection portion through a fifth via hole in the fifth overlap area, so that the first electrode of the second transistor is coupled to the gate electrode of the first transistor.

Optionally, the at least one shift register unit may further include a third transistor. The gate electrode of the third transistor is coupled to the second conductive connection portion, and the second conductive connection portion is coupled to the first electrode of the output transistor, so that the gate electrode of the third transistor is connected to the first electrode of the output transistor.

In specific implementation, the at least one shift register unit further includes a first transistor and a third transistor. The gate electrode of the first transistor is coupled to the gate electrode of the third transistor. The gate electrode of the first transistor is coupled to a third conductive connection portion, and the third conductive connection portion is coupled to the first electrode of the output transistor, so that the gate electrode of the first transistor is connected to the first electrode of the output transistor.

In at least one embodiment of the present disclosure, the first transistor may be located on a side of the third transistor close to the output circuit; a distance in the second direction between the orthographic projection of the gate electrode of the first transistor on the base substrate and the orthographic projection of the gate electrode of the third transistor on the base substrate is a second predetermined distance.

Optionally, the second predetermined distance may be greater than or equal to 18 micrometers and less than or equal to 24 micrometers, but is not limited to this.

As shown in FIGS. 3A and 5-9, the first transistor T1 includes a first active pattern A1, and the first active pattern A1 includes a first seventh conductive portion A11, a seventh channel portion A10 and a second seventh conductive portion A12 sequentially arranged along the second direction.

The first seventh conductive portion A11 is multiplexed as the first electrode S1 of the first transistor T1, and the second seventh conductive portion A12 is multiplexed as the second electrode D1 of the first transistor T1.

The first electrode S1 of T1 is coupled to the fourth conductive connection portion L4 through the fifth connection via hole H05, the gate electrode G6 of the sixth transistor T6 is coupled to the fifth conductive connection portion L5, and the fourth conductive connection portion L4 is coupled to the fifth conductive connection portion L5 through the sixth connection via hole H06, so that the first electrode Si of Ti is coupled to the gate electrode G6 of T6.

The second electrode D1 of T1 is coupled to the sixth conductive connection portion L6 through the seventh connection via hole H07. There is a sixth overlap area between the orthographic projection of the sixth conductive connection portion L6 on the base substrate and the orthographic projection of the first electrode plate C2a of C2 on the base substrate. The sixth conductive connection portion L6 is coupled to C2a through a sixth via hole H6 provided in the sixth overlap area, so that the second electrode D1 of T1 is coupled to C2a.

As shown in FIGS. 1, 3A, and 5-9, the at least one shift register unit may further include a second transistor T2 and a third transistor T3.

The first electrode S2 of the second transistor T2 is coupled to the electrode conductive connection portion Le through the eighth connection via hole H08; the electrode conductive connection portion Le is coupled to a first electrode pattern S101 included in the first electrode S10 of the output transistor T10, so that the first electrode S2 of T2 is coupled to the first electrode S10 of T10.

The gate electrode G1 of the first transistor T1 is coupled to the first conductive connection portion L1.

There is a fifth overlap area between the orthographic projection of the first conductive connection portion L1 on the base substrate and the orthographic projection of the electrode conductive connection portion Le on the base substrate, and the electrode conductive connection portion Le is the first conductive connection portion L1 through the fifth via hole H5 in the five overlap area, so that the first electrode S2 of the second transistor T2 is coupled to the gate electrode G1 of the first transistor T1.

The gate electrode G3 of the third transistor T3 is coupled to the second conductive connection portion L2, the first electrode S10 of the output transistor T10 is coupled to the seventh conductive connection portion L7, and there is a seventh overlap area between the orthographic projection of the second conductive connection portion L2 on the base substrate and the orthographic projection of the seventh conductive connection portion L7 on the base substrate, and L2 is coupled to L7 through the seventh via hole H7 in the seventh overlap area, so that the gate electrode G3 of T3 is coupled to the first electrode S10 of T10.

In the layout shown in FIG. 3A, the gate electrode G1 of T1 is coupled to the first electrode S2 of T2, and the distance between T1 and T2 is relatively short, so as to shorten a length of the connection line between the gate electrode G1 of T1 and the first electrode S2 of T2, avoid an excessively long connection path, and reduce the overlap of wiring in different layers caused by the long connection path.

As shown in FIGS. 3A and 5-9, the second electrode D2 of T2 is coupled to the eighth conductive connection portion L8 through the ninth connection via hole H09, and the second electrode Dc of the node control transistor Tc is coupled to the eighth conductive connecting portion L8 through the tenth connection via hole H010, so that the second electrode D2 of T2 is coupled to the second electrode Dc of the node control transistor Tc; the first electrode S3 of T3 is coupled to the ninth conductive connection portion L9 through the eleventh connection via hole H011, the gate electrode G8 of the eighth transistor T8 is coupled to the tenth conductive connection portion L10, and the tenth conductive connection portion L10 is respectively coupled to the eighth conductive connection portion L8 and the ninth conductive connection portion L9 through the twelfth connection via hole H012, so that the first electrode S3 of T3 is respectively coupled to the second electrode D2 of T2 and the gate electrode G8 of the eighth transistor T8.

The second electrode D3 of T3 is coupled to the eleventh conductive connection portion L11 through the thirteenth connection via hole H013, there is an eighth overlap area between the orthographic projection of L11 on the base substrate and the orthographic projection of the first electrode plate Cla of the first capacitor C1 on the base substrate, and L11 is coupled to the first electrode plate Cla of C1 through an eighth via hole H8 provided in the eighth overlap area, so that the second electrode D3 of T3 is coupled to C1a, and C1a is coupled to the gate electrode G4 of T4.

As shown in FIGS. 1, 4A, and 11-16, the at least one shift register unit may further include a first transistor T1 and a third transistor T3. The gate electrode G1 of the first transistor T1 is coupled to the gate electrode G3 of the third transistor T3. The gate electrode G1 of the first transistor T1 is coupled to a third conductive connection portion L3, and the third conductive connection portion L3 is coupled to the first electrode S10 of the output transistor T10 through a fourteenth connection via hole H014, so that the gate electrode G1 of the first transistor T1 is coupled to the first electrode S10 of the output transistor T10.

In the layout shown in FIG. 4A, T1 is moved to the right side of T3, which reduces the space occupied by the parallel arrangement of a plurality of transistors in the second direction.

In at least one embodiment of the present disclosure, as shown in FIGS. 4A and 11-16, the first transistor T1 may be located on the side of the third transistor T3 close to the output circuit.

A distance in the second direction between the orthographic projection of the gate electrode G1 of the first transistor T1 on the base substrate and the orthographic projection of the gate electrode G3 of the third transistor T3 on the base substrate is a second predetermined distance, so that T1 and T3 are closer in the second direction, so as to shorten the lateral width occupied by the shift register unit.

In at least one embodiment of the present disclosure, the maximum distance in the second direction between the orthographic projection of G1 on the base substrate and the orthographic projection of G3 on the base substrate refers to: a maximum distance in the second direction between the edge of the orthographic projection of G1 on the base substrate and the edge of the orthographic projection of G3 on the base substrate.

As shown in FIGS. 1, 4A, and 11-16, the first electrode S1 of T1 is coupled to the fourth conductive connection portion L4 through the fifth connection via hole H05, and the gate electrode G6 of the sixth transistor T6 is coupled to the fifth conductive connection portion L5, and the fourth conductive connection portion L4 is coupled to the fifth conductive connection portion L5 through a sixth connection via hole H06, so that the first electrode Si of T1 is coupled to the gate electrode G6 of T6.

As shown in FIGS. 1, 4A, and 11-16, the second electrode D1 of T1 is coupled to the sixth conductive connection portion L6 through the seventh connection via hole H07, and there is a sixth overlap area between the orthographic projection of the sixth conductive connection portion L6 on the base substrate and the orthographic projection of the first electrode plate C2a of C2 on the base substrate, and the sixth conductive connection portion L6 is coupled to C2a through a sixth via hole H6 provided in the sixth overlap area, so that the second electrode D1 of Ti is coupled to C2a.

As shown in FIGS. 1, 4A, and 11-16, the at least one shift register unit further includes a second transistor T2.

As shown in FIGS. 4A and 11-16, the first electrode S2 of the second transistor T2 is coupled to the electrode conductive connection portion Le through the eighth connection via hole H08; the electrode conductive connection portion Le is coupled to the first electrode S10 of the output transistor T10, so that the first electrode S2 of T2 is coupled to the first electrode S10 of T10.

As shown in FIGS. 4A and 11-16, the second electrode D2 of T2 is coupled to the eighth conductive connection portion L8 through the ninth connection via hole H09, and the second electrode Dc of the node control transistor Tc is coupled to the eighth conductive connection portion L8 through the tenth connection via hole H010, so that the second electrode D2 of T2 is coupled to the second electrode Dc of the node control transistor Tc.

The first electrode S3 of T3 is coupled to the eighth conductive connection portion L8 through the eleventh connection via hole H011, the gate electrode of the eighth transistor T8 is coupled to the tenth conductive connection portion L10, and the tenth conductive connection portion L10 is coupled to the eighth conductive connection portion L8 through the twelfth connection via hole H012, so that the first electrode S3 of T3 is respectively coupled to the second electrode D2 of T2 and the gate electrode G8 of the eighth transistor T8.

The second electrode D3 of T3 is coupled to the eleventh conductive connection portion L11 through the thirteenth connection via hole H013, there is an eighth overlap area between the orthographic projection of L11 on the base substrate, and the orthographic projection of the first electrode plate C1a of the first capacitor C1 on the base substrate, and L11 is coupled to the first electrode plate C1a of C1 through an eighth via hole H8 provided in the eighth overlap area, so that the second electrode D3 of T3 is coupled to C1a, and C1a is coupled to the gate electrode G4 of T4.

As shown in FIGS. 3A-16, the gate electrode G2 of T2 is coupled to the gate electrode Gi of the input transistor T1 through the twelfth conductive connection portion L12.

The twelfth conductive connection portion L12 is coupled to the thirteenth conductive connection portion L13 through the fifteenth connection via hole H015, and the first electrode Sc of the node control transistor Tc is coupled to the thirteenth conductive connection portion L13 through the sixteenth connection via hole H016, so that the first electrode Sc of Tc is coupled to the gate electrode G2 of T2.

As shown in FIGS. 3A-16, the second transistor T2 includes a second active pattern A2.

The second active pattern A2 includes a first eighth conductive portion A21, an eighth channel portion A20, and a second eighth conductive portion A22 that are sequentially arranged along the first direction.

The first eighth conductive portion A21 is multiplexed as the first electrode S2 of the second transistor T2, and the second eighth conductive portion A22 is multiplexed as the second electrode D2 of the second transistor T2.

The third transistor T3 includes a third active pattern A3.

The third active pattern A3 includes a first ninth conductive portion A31, a ninth channel portion A30, and a second ninth conductive portion A32 sequentially arranged along the first direction.

The first ninth conductive portion A31 is multiplexed as the first electrode S3 of the third transistor T3, and the second ninth conductive portion A32 is multiplexed as the second electrode D3 of the third transistor T3.

Optionally, the at least one shift register unit may further include a fourth transistor and a fifth transistor; the scan driving circuit may further include a first clock signal line.

A first electrode of the fourth transistor is coupled to a first clock signal line, and a gate electrode of the fifth transistor is coupled to the first clock signal line. No transistor and/or capacitor are provided between the fourth transistor and the first clock signal line. No transistor and/or capacitor are provided between the fifth transistor and the first clock signal line.

As shown in FIGS. 1 and 3A-16, the at least one shift register unit may further include a fourth transistor T4 and a fifth transistor T5; the scan driving circuit may also include a first clock signal line CB.

The first electrode S4 of the fourth transistor T4 is coupled to the first clock signal line CB, and the gate electrode G5 of the fifth transistor T5 is coupled to the first clock signal line CB. No transistor and/or capacitor are provided between the fourth transistor T4 and the first clock signal line CB. No transistor and/or capacitor are provided between the fifth transistor T5 and the first clock signal line CB.

In at least one embodiment of the present disclosure, T4 and T5 are arranged close to the signal line, so as to shorten the connection path between the first electrode S4 of T4 and CB, and shorten the connection path between the gate electrode G5 of T5 and CB.

As shown in FIGS. 3A-16, the CB extends along the first direction, and the CB is disposed on the side of T4 and T5 away from the display area.

In specific implementation, the active layer of the fourth transistor and the active layer of the fifth transistor may be formed by a continuous second semiconductor layer; the second semiconductor layer extends along the first direction.

The active layer of the fourth transistor includes a first third conductive portion, a third channel portion, and a second third conductive portion sequentially arranged along the first direction.

The second third conductive portion is multiplexed as the first fourth conductive portion.

The active layer of the fifth transistor includes a first fourth conductive portion, a fourth channel portion, and a second fourth conductive portion sequentially arranged along the first direction.

The first third conductive portion is used as the first electrode of the fourth transistor, the second third conductive portion is used as the second electrode of the fourth transistor, and the second fourth conductive portion is used as the second electrode of the fourth transistor, and the second electrode of the fourth transistor is multiplexed as the first electrode of the fifth transistor.

In at least one embodiment of the present disclosure, the second electrode of the fourth transistor is multiplexed as the first electrode of the fifth transistor, that is, in the display substrate according to at least one embodiment of the present disclosure, the fourth transistor and the fifth transistor can be directly coupled to the second third conductive portion included in the second semiconductor layer, which reduces the area occupied by the fourth transistor and the fifth transistor in the first direction.

In a specific implementation, the first clock signal line extends along a first direction, and the first clock signal line is located on a side of the fourth transistor and the fifth transistor away from the display area.

As shown in FIGS. 3A-16, the active layer of the fourth transistor T4 and the active layer of the fifth transistor T5 may be formed by a continuous second semiconductor layer 20 extending in the first direction.

The active layer of the fourth transistor T4 includes a first third conductive portion 211, a third channel portion 210, and a second third conductive portion 212 sequentially arranged along the first direction.

The second third conductive portion 212 is multiplexed as the first fourth conductive portion.

The active layer of the fifth transistor T5 includes a first fourth conductive portion, a fourth channel portion 220, and a second fourth conductive portion 222 sequentially arranged along the first direction.

The first third conductive portion 211 is used as the first electrode S4 of the fourth transistor T4, the second third conductive portion 212 is used as the second electrode D4 of the fourth transistor T4, and the second fourth conductive portion 222 is used as the second electrode D5 of the fifth transistor T5, and the second electrode D4 of the fourth transistor T4 is multiplexed as the first electrode S5 of the fifth transistor T5.

As shown in FIGS. 3A-16, the first electrode S4 of T4 is coupled to the fourteenth conductive connection portion L14 through the seventeenth connection via hole H017, and the fourteenth conductive connection portion L14 is coupled to the fifteenth conductive connection portion L15 through the eighteenth connection via hole H018; there is a ninth overlap area between the orthographic projection of L15 on the base substrate and the orthographic projection of CB on the base substrate, and L15 is coupled to CB through the ninth via hole H9 in the ninth overlap area, so that the first electrode S4 of T4 is coupled to CB.

As shown in FIGS. 3A-16, the gate electrode of T5 is coupled to the sixteenth conductive connection portion L16; there is a tenth overlap area between the orthographic projection of L16 on the base substrate and the orthographic projection of CB on the base substrate. L16 is coupled to CB through the tenth via hole H10 in the tenth overlap area, so that the gate electrode G5 of T5 is coupled to CB.

Optionally, the at least one shift register unit may further include a fourth transistor, a fifth transistor, a sixth transistor, and a first capacitor. The gate electrode of the fourth transistor is coupled to the first electrode plate of the first capacitor, and the second electrode plate of the first capacitor is coupled to the second electrode of the fourth transistor; the second electrode of the fourth transistor is multiplexed as the first electrode of the fifth transistor. The second electrode of the fifth transistor is coupled to the second electrode of the sixth transistor. The first electrode of the sixth transistor is coupled to the first electrode of the output reset transistor. The fourth transistor, the fifth transistor, the sixth transistor and the first capacitor are located on a side of the output reset transistor away from the display area. The fourth transistor, the first capacitor, and the sixth transistor are arranged in a first direction, and the output reset transistor, the first capacitor, and the fifth transistor are arranged in a direction away from the display area.

In the specific implementation, the arrangement positions of the fourth transistor, the fifth transistor, and the sixth transistor can be appropriately adjusted to match the shape of the first capacitor in a better way.

As shown in FIGS. 3A-16, the gate electrode G4 of T4 is directly coupled to the first electrode plate C1a of the first capacitor C1.

The second electrode D4 of T4 is coupled to the seventeenth conductive connection portion L17 through the third conductive connection via hole Hn3. There is an eleventh overlap area between L17 and the second electrode plate C1b of C1, and L17 is coupled to the second electrode plate C1b of C1 through the eleventh via hole H11 in the eleventh overlap area.

The second electrode D5 of T5 is coupled to the eighteenth conductive connection portion L18 through the nineteenth connection via hole H019; the eighteenth conductive connection portion L18 is coupled to the first electrode plate C3a of C3 through the twentieth connection via hole H020, so that the second electrode D5 of T5 is coupled to the first electrode plate C3a of C3.

The first electrode S6 of T6 is coupled to the output reset conductive connection portion L0 through the twenty-first connection via hole H021, so that the first electrode S6 of T6 is coupled to the first electrode S9 of T9.

The second electrode D6 of T6 is coupled to the eighteenth conductive connection portion L18 through the twenty-second connection via hole H022, and L18 is coupled to the first electrode plate C3a of C3 through the twentieth connection via hole H020, so that the second electrode D6 of T6 is coupled to the first electrode plate C3a of C3.

In at least one embodiment of the present disclosure, the at least one shift register unit may further include an output reset capacitor. The second electrode of the fifth transistor is coupled to the first electrode plate of the output reset capacitor, and the first electrode of the sixth transistor is coupled to the second electrode plate of the output reset capacitor. The first capacitor and the output reset capacitor are arranged along a first direction.

In specific implementation, the first capacitor and the output reset capacitor may be arranged along the first direction.

Optionally, the at least one shift register unit may further include a seventh transistor and an eighth transistor.

The active layer of the seventh transistor and the active layer of the eighth transistor are formed by a continuous third semiconductor layer; the third semiconductor layer extends along the first direction.

The active layer of the seventh transistor includes a first fifth conductive portion, a fifth channel portion, and a second fifth conductive portion sequentially arranged along the first direction.

The second fifth conductive portion is multiplexed as the first sixth conductive portion.

The active layer of the eighth transistor includes a first sixth conductive portion, a sixth channel portion, and a second sixth conductive portion that are sequentially arranged along a first direction.

The first fifth conductive portion is used as the second electrode of the seventh transistor, the second fifth conductive portion is used as the first electrode of the seventh transistor, and the second sixth conductive portion is used as the first electrode of the seventh transistor. The first electrode of the seventh transistor is multiplexed as the second electrode of the eighth transistor.

In at least one embodiment of the present disclosure, the first electrode of the seventh transistor is multiplexed as the second electrode of the eighth transistor. That is, in the display substrate according to at least one embodiment of the present disclosure, the seventh transistor and the eighth transistor can be directly coupled through the second fifth conductive portion included in the third semiconductor layer, which reduces the area occupied by the seventh transistor and the eighth transistor in the first direction.

As shown in FIGS. 3A-16, the at least one shift register unit may further include a seventh transistor T7 and an eighth transistor T8.

The active layer of the seventh transistor T7 and the active layer of the eighth transistor T8 are formed by a continuous third semiconductor layer 30; the third semiconductor layer 30 extends along the first direction.

The active layer of the seventh transistor T7 includes a first fifth conductive portion 311, a fifth channel portion 310, and a second fifth conductive portion 312 sequentially arranged along the first direction.

The second fifth conductive portion 312 is multiplexed as the first sixth conductive portion.

The active layer of the eighth transistor T8 includes a first sixth conductive portion, a sixth channel portion 320, and a second sixth conductive portion 322 sequentially arranged along the first direction.

The first fifth conductive portion 311 is used as the second electrode D7 of the seventh transistor T7, the second fifth conductive portion 312 is used as the first electrode S7 of the seventh transistor T7, and the second sixth conductive portion is used as the first electrode S8 of the eighth transistor T8, and the first electrode S7 of the seventh transistor T7 is multiplexed as the second electrode D8 of the eighth transistor T8.

In specific implementation, as shown in FIGS. 3A-16, the scan driving circuit may further include a first voltage signal line VGH.

The first electrode S8 of the eighth transistor T8 is coupled to the first voltage signal line VGH.

The first voltage signal line VGH is located on a side of the output circuit away from the display area, and the seventh transistor T7 and the eighth transistor T8 are located between the first voltage signal line VGH and the output circuit.

No transistor and/or capacitor are provided between the eighth transistor T8 and the first voltage signal line VGH.

In at least one embodiment of the present disclosure, since the first electrode S8 of T8 is coupled to VGH, no transistor and/or capacitor are provided between T8 and VGH.

As shown in FIGS. 3A-16, the first electrode S8 of T8 is coupled to the first voltage signal line VGH through the twenty-third connecting via hole H023.

Optionally, as shown in FIGS. 3A-16, the at least one shift register unit may further include a second transistor T2 and an input transistor T1; the scan driving circuit may further include a second clock signal line CK; the second clock signal line CK extends along the first direction.

The gate electrode G2 of the second transistor T2 is coupled to the gate electrode Gi of the input transistor T1.

The gate electrode Gi of the input transistor T1 is coupled to the second clock signal line CK, and the first electrode Si of the input transistor T1 is coupled to the input end E1.

The second transistor T2 and the input transistor T1 are located on a side of the output circuit away from the display area.

The second clock signal line CK is located on a side of the input transistor Ti away from the output circuit.

In at least one embodiment of the present disclosure, as shown in FIGS. 3A-16, the at least one shift register unit may further include a node control transistor Tc.

The gate electrode Gc of the node control transistor Tc includes a first gate electrode pattern Gc1 and a second gate electrode pattern Gc2 coupled to each other, so that the Tc is formed in a double gate structure.

As shown in FIG. 5 and FIG. 11, the node control transistor Tc includes a node control active pattern.

The node control active pattern includes a first node control conductive portion Ac11, a first node control channel portion Ac21, a second node control conductive portion Ac12, a second node control channel portion Ac22 and the third node control the conductive portion Ac13 sequentially arranged along a first direction.

The first node control conductive portion Ac11 is multiplexed as the first electrode Sc of Tc, and the third node control conductive portion Ac13 is multiplexed as the second electrode Dc of Tc.

As shown in FIGS. 3A-16, the gate electrode of Tc is included in the first gate metal pattern 60, and the first gate metal pattern 60 is U-shaped, so that the gate electrode of Tc includes first gate electrode pattern Gc1 and the second gate electrode pattern Gc2s coupled to each other.

The first gate metal pattern 60 is coupled to the nineteenth conductive connection portion L19 through the twenty-fourth connection via hole H024.

The second electrode Di of Ti is coupled to L19 through the twenty-fifth connecting via hole H025, so that the second electrode Di of Ti is coupled to the gate electrode Gc of Tc.

The second electrode D7 of T7 is coupled to L19 through the twenty-sixth connecting via hole H026, so that the second electrode D7 of T7 is coupled to the gate electrode Gc of Tc.

The first electrode Si of Ti is coupled to the input end E1 through the twenty-seventh connection via hole H027.

The gate electrode Gi of Ti is coupled to the twentieth conductive connection portion L20, there is a twelfth overlap area between the orthographic projection of L20 on the base substrate and the orthographic projection of the second clock signal line CK on the base substrate, and L20 is coupled to the second clock signal line CK through the twelfth via hole H12 in the twelfth overlap area, so that the gate electrode Gi of Ti is coupled to the second clock signal line CK.

The first gate metal pattern 60 is also coupled to the fourth conductive connection portion L4 through the twenty-eighth connection via hole H028, so that the first electrode S1 of T1 is coupled to the gate electrode Gc of Tc.

Optionally, as shown in FIGS. 1 and 3A-16, the at least one shift register unit may further include an input transistor T1, a sixth transistor T6, a first transistor T1, a seventh transistor T7, and an eighth transistor T8.

The gate electrode Gc of the node control transistor Tc is coupled to the first electrode S1 of the first transistor T1, and the gate electrode Gc of the node control transistor Tc is also coupled to the second electrode Di of the input transistor T1, the gate electrode Gc of the node control transistor Tc is also coupled to the second electrode D7 of the seventh transistor T7, and the gate electrode Gc of the node control transistor Tc is also coupled to the gate electrode G6 of the sixth transistor T6.

The first electrode Sc of the node control transistor Tc is coupled to the gate electrode Gi of the input transistor T1, and the second electrode Dc of the node control transistor Tc is coupled to the gate electrode G8 of the eighth transistor T8.

The input transistor T1, the node control transistor Tc, the seventh transistor T7, and the eighth transistor T8 are arranged in a first direction.

As shown in FIGS. 3A-16, the sixth transistor T6 includes a sixth active pattern A6.

The sixth active pattern A6 includes a first tenth conductive portion A61, a tenth channel portion A60, and a second tenth conductive portion A62 that are sequentially arranged along the second direction.

The first tenth conductive portion A61 is multiplexed as the second electrode D6 of the sixth transistor T6, and the second tenth conductive portion A62 is multiplexed as the first electrode S6 of the sixth transistor T6.

As shown in FIGS. 3A-16, the input transistor T1 includes an input active pattern Ai.

The input active pattern Ai includes a first eleventh conductive portion Ai1, an eleventh channel portion Ai0, and a second eleventh conductive portion Ai2 sequentially arranged along a first direction.

Ai1 is multiplexed as the first electrode Si of Ti, and Ai2 is multiplexed as the second electrode Di of Ti.

In specific implementation, the scan driving circuit may further include a first voltage signal line, a second voltage signal line, a first clock signal line, and a second clock signal line.

The first voltage signal line, the second voltage signal line, the first clock signal line, and the second clock signal line all extend in a first direction.

The orthographic projection of the first voltage signal line on the base substrate, the orthographic projection of the first clock signal line on the base substrate, and the orthographic projection of the second clock signal line on the base substrate are all located on a side of the orthographic projection of the shift register unit on the base substrate away from the display area.

The orthographic projection of the second voltage signal line on the base substrate is located on a side of the shift register unit close to the display area.

Specifically, the specific positions of the first clock signal line, the second clock signal line, and the first voltage signal line can be set according to actual needs. For example, the first clock signal line, the second clock signal line and the first voltage signal line are all arranged at the edge of the display substrate, that is, the orthographic projection of the first voltage signal line on the base substrate, the orthographic projection of the first clock signal line on the base substrate and the orthographic projection of the second clock signal line on the base substrate are all located on a side of the orthographic projection of the shift register unit on the base substrate away from the display area of the display substrate, when the shift register unit is laid out, it is possible to prevent the transistors in the shift register unit from overlapping the first clock signal line, the second clock signal line, and the first voltage signal line too much, which is more conducive to improving the working performance of the shift register unit.

In addition, by arranging the first clock signal line, the second clock signal line, and the first voltage signal line to extend along the first direction, it is more advantageous for the display substrate to realize a narrow frame.

In at least one embodiment of the present disclosure, the phases of the first clock signal outputted by the first clock signal line and the second clock signal outputted by the second clock signal line may be reverse, but not limited to this.

In at least one embodiment of the present disclosure, as shown in FIGS. 1 and 3A, the scan driving circuit includes an output transistor T10, an output reset transistor T9, a first voltage signal line VGH, a second voltage signal line VGL, a first clock signal line CB and the second clock signal line CK; the at least one shift register unit further includes a signal output line E0, a first capacitor C1, an output capacitor C2, an output reset capacitor C3, a first transistor T1, a second transistor T2, a third transistor T3, a fourth transistor T4, a fifth transistor T5, a sixth transistor T6, a seventh transistor T7, an eighth transistor T8, an input transistor T1, and a node control transistor Tc.

The signal output line E0 includes a first output line portion E01, a first second output line portion E021, and a second second output line portion E022 that are coupled to each other.

The first electrode plate C3a of the output reset capacitor C3 is coupled to the gate electrode G9 of the output reset transistor T9, and the second electrode plate C3b of the output reset capacitor C3 is coupled to the first voltage signal line VGH.

The first electrode S10 of the output transistor T10 is coupled to the second voltage signal line VGL, and the first electrode S9 of the output reset transistor T9 is coupled to the second electrode plate C3b of the output reset capacitor C3; the second electrode D10 of the output transistor T10 and the second electrode D9 of the output reset transistor T9 are respectively coupled to the first output line portion E01.

The first electrode plate C2a of the output capacitor C2 is coupled to the gate electrode G10 of the output transistor T10, and the second electrode plate C2b of the output capacitor C2 is coupled to the gate electrode G7 of the seventh transistor T7.

The gate electrode G1 of the first transistor T1 is coupled to the first electrode S10 of the output transistor T10, and the second electrode D1 of the first transistor T1 is coupled to the gate electrode G10 of the output transistor T10.

The gate electrode G2 of the second transistor T2 is coupled to the gate electrode Gi of the input transistor T1, the first electrode S2 of the second transistor T2 is coupled to the gate electrode G1 of the first transistor T1, and the second electrode D2 of the second transistor T2 is coupled to the gate electrode G8 of the eighth transistor T8.

The gate electrode G3 of the third transistor T3 is coupled to the first electrode S10 of the output transistor T10, the first electrode S3 of the third transistor T3 is coupled to the gate electrode G8 of the eighth transistor T8, the second electrode D3 of the third transistor T3 is coupled to the gate electrode G4 of the fourth transistor T4.

The first electrode S4 of the fourth transistor T4 is coupled to the first clock signal line CB, and the gate electrode G5 of the fifth transistor T5 is coupled to the first clock signal line CB.

The gate electrode G4 of the fourth transistor T4 is coupled to the first electrode plate C1a of the first capacitor C1, and the second electrode plate C1b of the first capacitor C1 is coupled to the second electrode D4 of the fourth transistor T4. The second electrode D4 of the fourth transistor T4 is multiplexed as the first electrode S5 of the fifth transistor T5.

The second electrode D5 of the fifth transistor T5 is coupled to the second electrode D6 of the sixth transistor T6.

The gate electrode G6 of the sixth transistor T6 is coupled to the gate electrode Gc of the node control transistor Tc, and the first electrode S6 of the sixth transistor T6 is coupled to the first electrode S9 of the output reset transistor T9.

The second electrode D5 of the fifth transistor T5 is coupled to the first electrode plate C3a of the output reset capacitor C3, and the first electrode S6 of the sixth transistor T6 is coupled to the second electrode plate C3b of the output reset capacitor C3.

The gate electrode G7 of the seventh transistor T7 is coupled to the second electrode plate C2b of the output capacitor C2, and the first electrode S7 of the seventh transistor T7 is multiplexed as the second electrode D8 of the eighth transistor T8. The second electrode D7 of the seventh transistor T7 is coupled to the gate electrode Gc of the node control transistor Tc.

The gate electrode G8 of the eighth transistor T8 is coupled to the second electrode Dc of the node control transistor Gc, and the first electrode S8 of the eighth transistor T8 is coupled to the first voltage signal line VGH.

The gate electrode Gi of the input transistor T1 is coupled to the second clock signal line CK, and the first electrode Si of the input transistor T1 is coupled to the input end E1.

The gate electrode Gc of the node control transistor Tc is coupled to the first electrode S1 of the first transistor T1, and the gate electrode Gc of the node control transistor Tc is also coupled to the second electrode Di of the input transistor T1.

The first electrode Sc of the node control transistor Tc is coupled to the gate electrode Gi of the input transistor T1.

The first second output line portion E021 and the second second output line portion E022 extend to the display area and are used to provide light emitting control signals for pixel circuits located in the display area.

During specific implementation, along the first direction, the input transistor T1, the node control transistor Tc, the seventh transistor T7, the eighth transistor T8, the fourth transistor T4, and the fifth transistor T5 and the output reset capacitor C3 are arranged in sequence.

The input transistor T1, the second transistor T2, and the first transistor T1 are arranged along a second direction.

The node control transistor Tc, the output capacitor C2, and the output transistor T10 are arranged along a second direction.

Along the first direction, the third transistor T3, the fourth transistor T4, the first capacitor C1, and the output reset capacitor C3 are arranged in sequence.

The sixth transistor T6 is arranged between the output reset transistor T9 and the first capacitor C1.

In at least one embodiment of the present disclosure, as shown in FIG. 4A, the scan driving circuit may further include a first voltage signal line VGH, a second voltage signal line VGL, a first clock signal line CB, and a second clock signal line CK. The at least one shift register unit also includes a signal output line E0, a first capacitor C1, an output capacitor C2, an output reset capacitor C3, a first transistor T1, a second transistor T2, a third transistor T3, a fourth transistor T4, a fifth transistor T5, a sixth transistor T6, a seventh transistor T7, an eighth transistor T8, an input transistor Ti and a node control transistor Tc; the first electrode plate C3a of the output reset capacitor C3 is coupled to the gate electrode G9 of the output reset transistor T9, and the second pole electrode plate C3b of the output reset capacitor C3 is coupled to the first voltage signal line VGH.

The signal output line E0 includes a first output line portion E01, a first second output line portion E021, and a second second output line portion E022 that are coupled to each other.

The first electrode S10 of the output transistor T10 is coupled to the second voltage signal line VGL, and the first electrode S9 of the output reset transistor T9 is coupled to the second electrode plate C3aA of the output reset capacitor C3; the second electrode D10 of the output transistor T10 and the second electrode D9 of the output reset transistor T9 are respectively coupled to the first output line portion E01.

The first electrode plate C2a of the output capacitor C2 is coupled to the gate electrode G10 of the output transistor T10, and the second electrode plate C2b of the output capacitor C2 is coupled to the gate electrode G7 of the seventh transistor T7.

The gate electrode G1 of the first transistor T1 is coupled to the gate electrode G3 of the third transistor T3, and the gate electrode G1 of the first transistor T1 is coupled to the first electrode S10 of the output transistor T10; the second electrode D1 of the first transistor T1 is coupled to the gate electrode G10 of the output transistor T10.

The gate electrode G2 of the second transistor T2 is coupled to the gate electrode Gi of the input transistor T1, the first electrode S2 of the second transistor T2 is coupled to the first electrode S10 of the output transistor T10, and the second electrode D2 of the second transistor T2 is coupled to the gate electrode G8 of the eighth transistor T8.

The first electrode S3 of the third transistor T3 is coupled to the gate electrode G8 of the eighth transistor T8, and the second electrode D3 of the third transistor T3 is coupled to the gate electrode G4 of the fourth transistor T4.

The first electrode S4 of the fourth transistor T4 is coupled to the first clock signal line CB, and the gate electrode G5 of the fifth transistor T5 is coupled to the first clock signal line CB.

The gate electrode G4 of the fourth transistor T4 is coupled to the first electrode plate C1a of the first capacitor C1, and the second electrode plate C1b of the first capacitor C1 is coupled to the second electrode D4 of the fourth transistor T4; the second electrode D4 of the fourth transistor T4 is multiplexed as the first electrode S5 of the fifth transistor T5.

The second electrode D5 of the fifth transistor T5 is coupled to the second electrode D6 of the sixth transistor T6.

The gate electrode G6 of the sixth transistor T6 is coupled to the gate electrode Gc of the node control transistor Tc, and the first electrode S6 of the sixth transistor T6 is coupled to the first electrode S9 of the output reset transistor T9.

The second electrode D5 of the fifth transistor T5 is coupled to the first electrode plate C3a of the output reset capacitor C3, and the first electrode S6 of the sixth transistor T6 is connected to the second electrode plate C3b of the output reset capacitor C3.

The gate electrode G7 of the seventh transistor T7 is coupled to the second electrode plate C2b of the output capacitor C2, and the first electrode S7 of the seventh transistor T7 is multiplexed as the second electrode D8 of the eighth transistor T8. The second electrode D7 of the seventh transistor T7 is coupled to the gate electrode Gc of the node control transistor Tc.

The gate electrode G8 of the eighth transistor T8 is coupled to the second electrode Dc of the node control transistor Tc, and the first electrode S8 of the eighth transistor T8 is coupled to the first voltage signal line VGH.

The gate electrode Gi of the input transistor T1 is coupled to the second clock signal line CK, and the first electrode Si of the input transistor T1 is coupled to the input end E1.

The gate electrode Gc of the node control transistor Tc is coupled to the first electrode S1 of the first transistor T1, and the gate electrode Gc of the node control transistor Tc is also coupled to the second electrode Di of the input transistor T1.

The first electrode Sc of the node control transistor Tc is coupled to the gate electrode Gi of the input transistor T1.

The first second output line portion E021 and the second second output line portion E022 extend to the display area and are used to provide light emitting control signals for pixel circuits located in the display area.

During specific implementation, along the first direction, the input transistor T1, the node control transistor Tc, the seventh transistor T7, the eighth transistor T8, the fourth transistor T4, and the fifth transistor T5 and the output reset capacitor C3 are arranged in sequence.

The input transistor T1 and the second transistor T2 are arranged along the second direction.

The node control transistor Tc, the output capacitor C2, and the output transistor T10 are arranged along the second direction.

Along the first direction, the third transistor T3, the fourth transistor T4, the first capacitor C1, and the output reset capacitor C3 are arranged in sequence.

Along the first direction, the first transistor T1, the sixth transistor T6, and the output reset capacitor C3 are arranged in sequence.

Optionally, the second voltage signal line is arranged on a side of the shift register unit close to the display area.

The first voltage signal line, the first clock signal line, and the second clock signal line are arranged on a side of the shift register unit away from the display area.

Along the direction close to the display area, the first clock signal line, the second clock signal line, and the first voltage signal line are arranged in sequence; or, along the direction close to the display area, the second clock signal line, the first clock signal line, and the first voltage signal line are arranged in sequence.

In at least one embodiment of the present disclosure, the scan driving circuit may further include a first start signal line and a second start signal line. Along the direction close to the display area, the second start signal line, the first start signal line, the first clock signal line, the second clock signal line, and the first voltage signal line are sequentially arranged; or along the direction close to the display area, the first start signal line, the second start signal line, the first clock signal line, the second clock signal line, and the first voltage signal line are sequentially arranged; or along the direction close to the display area, the second start signal line, the first start signal line, the second clock signal line, the first clock signal line, and the first voltage signal line are sequentially arranged; or along the direction close to the display area, the first start signal line, the second start signal line, the second clock signal line, the first clock signal line, and the first voltage signal line are sequentially arranged.

In at least one embodiment of the present disclosure, the display substrate further includes a plurality of rows of pixel circuits arranged on the base substrate; the pixel circuit includes a light emitting control end. The shift register unit corresponds to at least one row of the pixel circuits. The signal output line of the shift register unit is coupled to the light emitting control end of the at least one row of pixel circuits, and is used to provide a light emitting control signal for the light emitting control end of the at least one row of pixel circuits.

In the layout shown in FIG. 3A, as shown in FIG. 5 (FIG. 5 is a schematic diagram of the active layer in FIG. 3A), the length of the first semiconductor layer 10 in the first direction is the output active length L1, so the minimum width of the first semiconductor layer 10 in the second direction is the first output active width W1.

The ratio of the output active length L1 to the first output active width W1 is within a first predetermined ratio range; the first predetermined ratio range is greater than or equal to 3 and less than or equal to 11.

Optionally, the first output active width is greater than or equal to 12 microns and less than or equal to 40 microns.

In the layout shown in FIG. 3A of the present disclosure, the first output active width W1 is reduced, the devices in the shift register unit other than the output circuit can be laid out by using the saved space in the horizontal direction. The lateral space occupied by the shift register unit can also be reduced; and the output active length L1 can be increased, so that the devices in the shift register unit other than the output circuit can be laid out by using the extra vertical space due to the length increase of L1. The horizontal space occupied by the shift register unit can be reduced.

In the layout shown in FIG. 4A, as shown in FIG. 11 (FIG. 5 is a schematic diagram of the active layer in FIG. 3A), the length of the first semiconductor layer 10 in the first direction is the output active length L1, so the minimum width of the first semiconductor layer 10 in the second direction is the first output active width W1.

The first output active width W1 is greater than or equal to 12 microns and less than or equal to 40 microns.

The ratio of the output active length L1 to the first output active width W1 is within a first predetermined ratio range.

The output active length L1 is greater than or equal to 50 microns and less than or equal to 130 microns.

In the layout shown in FIG. 4A of the present disclosure, the first output active width W1 is reduced, the devices in the shift register unit other than the output circuit can be laid out by using the saved space in the horizontal direction. It is also possible to reduce the horizontal space occupied by the shift register unit. The output active length L1 is increased, so that the devices in the shift register unit other than the output circuit can be laid out by using the extra vertical space due to the length increase of L1. The horizontal space occupied by the shift register unit is reduced.

In the layout shown in FIG. 3A of the present disclosure, as shown in FIG. 3A and FIG. 8, the first output line portion E01 is coupled to the second electrode D10 of the output transistor T10 through a plurality of first signal line via holes H01 arranged in the signal line overlap area, and the first output line portion E01 is coupled to the second electrode D9 of the output reset transistor T9 through a plurality of second signal line via holes H02 arranged in the signal line overlap area. The plurality of first signal line via holes H01 are arranged in sequence along the first direction, and the plurality of second signal line via holes H02 are arranged in sequence along the first direction.

As shown in FIG. 10 (FIG. 10 is a schematic diagram of the source-drain metal layer in FIG. 3A, the first source-drain metal pattern Ds1 and the second source-drain metal pattern Ds2 are shown in FIG. 10), the signal line overlap area includes a first signal line overlap area A01 and a second signal line overlap area A02, the first signal line overlap area A01 is an overlap area between the orthographic projection of the first output line portion E01 on the base substrate and the orthographic projection of the first source-drain metal pattern Ds1 on the base substrate, the first source-drain metal pattern Ds1 includes the second electrode D10 of the output transistor T10. The second signal line overlap area A02 is an overlap area between the orthographic projection of the first output line portion E01 on the base substrate and the orthographic projection of the second source-drain metal pattern Ds2 on the base substrate, the second source-drain metal pattern Ds2 includes the second electrode D9 of the output reset transistor T9.

In the layout shown in FIG. 4A of the present disclosure, as shown in FIG. 4A and FIG. 14, the first output line portion E01 is coupled to the second electrode D10 of the transistor T10 through a plurality of first signal line via holes H01 arranged in the signal line overlap area, and the first output line portion E01 is coupled to the second electrode D9 of the output reset transistor T9 through a plurality of second signal line via holes H02 arranged in the signal line overlap area. The plurality of first signal line via holes H01 are arranged in sequence along the first direction, and the plurality of second signal line via holes H02 are arranged in sequence along the first direction.

As shown in FIG. 16 (FIG. 16 is a schematic diagram of the source-drain metal layer in FIG. 4A, the first source-drain metal pattern Ds1 and the second source-drain metal pattern Ds2 are shown in FIG. 16), the signal line overlap area includes a first signal line overlap area A01 and a second signal line overlap area A02, the first signal line overlap area A01 is an overlap area between the orthographic projection of the first output line portion E01 on the base substrate and the orthographic projection of the first source-drain metal pattern Ds1 on the base substrate, the first source-drain metal pattern Ds1 includes the second electrode D10 of the output transistor T10. The second signal line overlap area A02 is an overlap area between the orthographic projection of the first output line portion E01 on the base substrate and the orthographic projection of the second source-drain metal pattern Ds2 on the base substrate, the second source-drain metal pattern Ds2 includes the second electrode D9 of the output reset transistor T9.

In at least one embodiment of the present disclosure, a first gate insulating layer may also be arranged between the semiconductor layer as shown in FIG. 5 and the first gate metal layer as shown in FIG. 6; a second gate insulating layer may also be provided between the first gate metal layer as shown in FIG. 6 and the second gate metal layer as shown in FIG. 7; an insulating layer may also be arranged between the second gate metal layer as shown in FIG. 7 and the source-drain metal layer as shown in FIG. 9.

When manufacturing the display substrate according to at least one embodiment of the present disclosure, a semiconductor material layer is first provided on the base substrate, and the semiconductor material layer is patterned to form the active layer of each transistor; as shown in FIG. 5, the first semiconductor layer 10, the second semiconductor layer 20, the third semiconductor layer 30, the first active pattern A1, the second active pattern A2, the third active pattern A3, the sixth active pattern A6, and the node control active pattern and the input active pattern Ai are formed.

A first gate insulating layer is formed on the side of the active layer away from the base substrate.

A first gate metal layer is formed on the side of the first gate insulating layer away from the active layer, and a patterning process is performed on the first gate metal layer. As shown in FIG. 6, gate electrodes of the transistors included in the shift register unit, the first electrode plate C3a of the output reset capacitor C3, the first electrode plate C1a of the first capacitor C1, and the first electrode plate C2a of the output capacitor C2 are formed.

Using the gate electrode of each transistor as a mask, a portion of the active layer that is not covered by the gate electrode is doped, so that the portion of the active layer that is not covered by the gate electrode is formed as a conductive portion, a portion of the active layer covered by the gate electrode is formed as a channel portion; the conductive portion is used as a first electrode or a second electrode; or, the conductive portion is coupled to the first electrode or the second electrode.

A second gate metal layer is provided on the side of the second gate insulating layer away from the first gate metal layer, and a patterning process is performed on the second gate metal layer, as shown in FIG. 7, the signal output line, the input signal end E1, the second electrode plate C3b of the output reset capacitor C3, the second electrode plate C1b of the first capacitor C1, the first electrode plate C2b of the output capacitor C2, and the fifteenth conductive connecting portion L15 are formed.

An insulating layer is formed on the side of the second gate metal layer away from the second gate insulating layer.

As shown in FIG. 8, a plurality of via holes are provided on the base substrate provided with the active layer, the first gate insulating layer, the first gate metal layer, the second gate insulating layer, the second gate metal layer and the insulating layer.

A source-drain metal layer is provided on the side of the insulating layer away from the second gate metal layer, and a patterning process is performed on the source-drain metal layer. As shown in FIG. 9, a first voltage signal line VGH, a second voltage signal line VGL, the first clock signal line CK, the second clock signal line CB, the second electrode of the output reset transistor T9, the first electrode of the output reset transistor T9, the second electrode of the output transistor T10, the first electrode of the output transistor T10 are formed.

In at least one embodiment of the present disclosure, a first gate insulating layer may also be provided between the semiconductor layer shown in FIG. 11 and the first gate metal layer shown in FIG. 12. A second gate insulating layer may also be provided between the first gate metal layer shown in FIG. 12 and the second gate metal layer shown in FIG. 13; an insulating layer may be provided between the second gate metal layer as shown in FIG. 13 and the source-drain metal layer as shown in FIG. 15.

When manufacturing the display substrate according to at least one embodiment of the present disclosure, a semiconductor material layer is first arranged on the base substrate, and the semiconductor material layer is patterned to form the active layer of each transistor; as shown in FIG. 11, the first semiconductor layer 10, the second semiconductor layer 20, the third semiconductor layer 30, the first active pattern A1, the second active pattern A2, the third active pattern A3, the sixth active pattern A6, and the node control active pattern and the input active pattern Ai are formed.

A first gate insulating layer is formed on the side of the active layer away from the base substrate.

A first gate metal layer is formed on the side of the first gate insulating layer away from the active layer, and a patterning process is performed on the first gate metal layer. As shown in FIG. 12, the gate electrode of each transistor, the first electrode plate C3a of the output reset capacitor C3, the first electrode plate C1a of the first capacitor C1, and the first electrode plate C2a of the output capacitor C2 are formed.

Using the gate electrode of each transistor as a mask, a portion of the active layer that is not covered by the gate electrode is doped, so that the portion of the active layer that is not covered by the gate electrode is formed as a conductive portion, a portion of the active layer covered by the gate electrode is formed as a channel portion; the conductive portion is used as a first electrode or a second electrode; or, the conductive portion is coupled to the first electrode or the second electrode.

A second gate metal layer is provided on the side of the second gate insulating layer away from the first gate metal layer, and a patterning process is performed on the second gate metal layer, as shown in FIG. 13, the signal output line, the input signal end E1, the second electrode plate C3b of the output reset capacitor C3, the second electrode plate C1b of the first capacitor C1, and the first electrode plate C2b of the output capacitor C2 are formed.

An insulating layer is formed on the side of the second gate metal layer away from the second gate insulating layer.

As shown in FIG. 14, a plurality of via holes are provided on the base substrate provided with the active layer, the first gate insulating layer, the first gate metal layer, the second gate insulating layer, the second gate metal layer and the insulating layer.

A source-drain metal layer is provided on the side of the insulating layer away from the second gate metal layer, and a patterning process is performed on the source-drain metal layer. As shown in FIG. 15, a first voltage signal line VGH, a second voltage signal line VGL, the first clock signal line CK, the second clock signal line CB, the second electrode of the output reset transistor T9, the first electrode of the output reset transistor T9, the second electrode of the output transistor T10, The first electrode of the output transistor T10 are formed.

The method of manufacturing the display substrate according to at least one embodiment of the present disclosure includes manufacturing a scan driving circuit on a base substrate; the scan driving circuit includes a plurality of shift register units, and at least one shift register unit of the plurality of shift register units includes an output circuit; the output circuit includes an output transistor and an output reset transistor.

The method of manufacturing the display substrate further includes: forming a semiconductor layer on the base substrate, and performing a patterning process on the semiconductor layer to form an active layer of an output transistor and an active layer of an output reset transistor.

The active layer of the output transistor and the active layer of the output reset transistor are arranged along a first direction, the length of the active layer of the output transistor in the first direction is a first length, and the length of the active layer of the output reset transistor in the first direction is a second length, and the sum of the first length and the second length is the output active length.

The smaller one of the minimum width of the active layer of the output transistor in the second direction and the minimum width of the active layer of the output reset transistor in the second direction is a first output active width; the first direction intersects the second direction.

The ratio of the output active length to the first output active width is within a first predetermined ratio range. The first predetermined ratio range is greater than or equal to 3 and less than or equal to 11.

In at least one embodiment of the present disclosure, the first output active width is reduced, so that devices in the shift register unit other than the output circuit can be laid out by using the extra space due to the reducing of the length of the first output active width. The horizontal space occupied by the shift register unit is reduced.

Optionally, the first output active width is greater than or equal to 12 microns and less than or equal to 40 microns.

Optionally, the output active length is greater than or equal to 50 microns and less than or equal to 130 microns.

In at least one embodiment of the present disclosure, the output active length can also be increased, so that devices in the shift register unit other than the output circuit can be laid out by using the extra longitudinal space due to the increase of the output active length. The lateral space occupied by the shift register unit can be reduced.

In specific implementation, the method of manufacturing the display substrate may further include: forming a first gate metal layer on a side of the semiconductor layer away from the substrate, and performing a patterning process on the first gate metal layer to form a gate electrode of the output transistor and a gate electrode of the output reset transistor; using the gate electrode of the output transistor and the gate electrode of the output reset transistor as a mask, doping a portion of the semiconductor layer that is not covered by the gate electrodes so that the portion of the semiconductor layer that is not covered by the gate electrodes is formed as a conductive portion, and a portion of the semiconductor layer covered by the gate electrode is formed as a channel portion; forming a second gate metal layer on a side of the first gate metal layer away from the semiconductor layer, and performing a patterning process on the second gate metal layer to form a signal output line; the signal output line including a first output line portion extending in the first direction; forming a first insulating layer on a side of the second gate metal layer away from the first gate metal layer; forming a plurality of first signal line via holes and a plurality of second signal line via holes in an overlap area between the first insulating layer and the first output line portion; the plurality of first signal line via holes and the plurality of second signal line via holes penetrating the first insulating layer; forming a source-drain metal layer on a side of the first insulating layer away from the second gate metal layer, performing a patterning process on the source-drain metal layer to form a first source-drain metal pattern and a second source-drain metal pattern, wherein the first source-drain metal pattern includes the second electrode of the output transistor, and the second source-drain metal pattern includes the second electrode of the output reset transistor, so that the first output line portion is coupled to the second electrode of the output transistor through the plurality of first signal line via holes, and the first output line portion is coupled to the second electrode of the output reset transistor through the plurality of second signal line via holes, the plurality of first signal line via holes are sequentially arranged along the first direction, and the plurality of second signal line via holes are sequentially arranged along the first direction.

The plurality of first signal line via holes are sequentially arranged along the first direction, and the plurality of second signal line via holes are sequentially arranged along the first direction.

In a specific implementation, the signal output line may include a first output line portion extending along a first direction, the first output line portion is coupled to the second electrode of the output transistor through the first signal line via hole, and the first output line portion is coupled to the second electrode of the output reset transistor through the second signal line via hole. The first output line portion is located between the output circuit and the second voltage signal line to facilitate the coupling of the first output line portion with the output transistor and the output reset transistor included in the output circuit.

In at least one embodiment of the present disclosure, the signal output line further includes at least one second output line portion, the second output line portion is coupled to the first output line portion; the second output line portion extends to the display area, and is used to provide a light emitting control signal for the pixel circuit located in the display area.

The display device according to at least one embodiment of the present disclosure includes the above-mentioned display substrate.

The display device provided by at least one embodiment of the present disclosure may be any product or component with a display function, such as a mobile phone, a tablet computer, a television, a monitor, a notebook computer, a digital photo frame, and a navigator.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, area or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate comprising a scan driving circuit and a display area provided on a base substrate, wherein the scan driving circuit includes a plurality of shift register units, and at least one of the plurality of shift register units includes an output circuit, and the output circuit includes a first switch and a second switch;
   an active layer of the first switch and an active layer of the second switch are arranged along a first direction, a length of the active layer of the first switch in the first direction is a first length, and a length of the active layer of the second switch in the first direction is a second length, and a sum of the first length and the second length is an output active length;
   a smaller one of a minimum width of the active layer of the first switch in a second direction and a minimum width of the active layer of the second switch in the second direction is a first output active width, the first direction intersects the second direction;
   a ratio of the output active length to the first output active width is within a first predetermined ratio range;
   the first predetermined ratio range is greater than or equal to 3 and less than or equal to 11.

2. The display substrate according to claim 1, wherein the first output active width is greater than or equal to 12 microns and less than or equal to 40 microns.

3. The display substrate according to claim 1, wherein the active layer of the first switch and the active layer of the second switch are formed by a continuous first semiconductor layer; the first semiconductor layer extends along the first direction;
   a length of the first semiconductor layer in the first direction is the output active length;
   a minimum length of the first semiconductor layer in the second direction is the first output active width.

4. The display substrate according to claim 1, wherein the at least one shift register unit further includes an output reset capacitor; the scan driving circuit further includes a first voltage signal line;
   a first electrode plate of the output reset capacitor is coupled to a gate electrode of the second switch;
   a second electrode plate of the output reset capacitor is coupled to the first voltage signal line;
   the second electrode plate of the output reset capacitor extends along the second direction;
   the first voltage signal line and the output reset capacitor are both located on a side of the output circuit away from the display area.

5. The display substrate according to claim 1, wherein the scan driving circuit further includes a first voltage signal line and a second voltage signal line; the at least one shift register unit further includes an output reset capacitor;

the output circuit is located between the first voltage signal line and the second voltage signal line, the first voltage signal line is located on a side of the output circuit away from the display area, and the second voltage signal line is located on a side of the output circuit close to the display area;

the first electrode of the first switch is coupled to the second voltage signal line;

the first electrode of the second switch is coupled to the second electrode plate of the output reset capacitor, wherein both the first voltage signal line and the second voltage signal line extend along the first direction;

a minimum distance in the second direction between an edge of an orthographic projection of the active layer of the first switch on the base substrate and an edge of an orthographic projection of the second voltage signal line on the base substrate is a first predetermined distance;

wherein the first predetermined distance is greater than or equal to 10 microns and less than or equal to 15 microns.

6. The display substrate according to claim 1, wherein the scan driving circuit further includes a second voltage signal line, and the at least one shift register unit further includes a signal output line; the second voltage signal line extends along the first direction, and the second voltage signal line is located on a side of the output circuit close to the display area;

the signal output line includes a first output line portion extending in the first direction;

the first output line portion is coupled to a second electrode of the first switch through a plurality of first signal line via holes arranged in a first signal line overlap area, and the first output line portion is coupled to the second electrode of the second switch through a plurality of second signal line via holes in a second signal line overlap area, the plurality of first signal line via holes are arranged in sequence along the first direction, and the plurality of second signal line via holes are arranged in sequence along the first direction;

the first signal line overlap area is an overlap area between an orthographic projection of the first output line portion on the base substrate and an orthographic projection of a first source-drain metal pattern on the base substrate, the first source-drain metal pattern includes the second electrode of the first switch; the second signal line overlap area is an overlap area between the orthographic projection of the first output line portion on the base substrate and an orthographic projection of a second source-drain metal pattern on the base substrate, the second source-drain metal pattern includes the second electrode of the second switch;

the first output line portion is located between the output circuit and the second voltage signal line.

7. The display substrate according to claim 1, wherein the scan driving circuit further includes a second voltage signal line, and the at least one shift register unit further includes a signal output line;

the signal output line includes a first output line portion and at least one second output line portion that are coupled to each other;

the second voltage signal line and the first output line portion extend in a first direction, and the first output line portion is located between the second voltage signal line and the output circuit;

the second output line portion extends along the second direction;

the second output line portion is used for coupling with a pixel circuit in the display area;

the first output line portion and the output circuit are located on a side of the second voltage signal line away from the display area.

8. The display substrate according to claim 1, wherein the minimum width of the active layer of the first switch in the second direction is smaller than or equal to theft minimum width of the active layer of the second switch in the second direction, wherein the at least one shift register unit further comprises an output capacitor;

a first electrode plate of the output capacitor is coupled to the gate electrode of the first switch;

an orthographic projection of a second electrode plate of the output capacitor on the base substrate is within an orthographic projection of the first electrode plate of the output capacitor on the base substrate;

the output capacitor is located on a side of the first switch away from the display area;

wherein a shape of the second electrode plate of the output capacitor is an L shape.

9. The display substrate according to claim 1, wherein the at least one shift register unit further comprises a first transistor;

the first transistor includes a first active pattern; the first active pattern extends in a second direction;

the first transistor is located on a side of the output circuit away from the display area.

10. The display substrate according to claim 1, wherein the at least one shift register unit further includes a first transistor and a second transistor;

a first electrode of the second transistor is coupled to an electrode conductive connection portion; a gate electrode of the first transistor is coupled to a first conductive connection portion;

there is a fifth overlap area between an orthographic projection of the first conductive connection portion on the base substrate and the orthographic projection of the electrode conductive connection portion on the base substrate; the electrode conductive connection portion is coupled to the first conductive connection portion through a fifth via hole in the fifth overlap area, so that the first electrode of the second transistor is coupled to the gate electrode of the first transistor.

11. The display substrate according to claim 1, wherein the at least one shift register unit further includes a third transistor;

a gate electrode of the third transistor is coupled to the second conductive connection portion, and the second conductive connection portion is coupled to a first electrode of the first switch, so that a gate electrode of the third transistor is connected to the first electrode of the first switch.

12. The display substrate according to claim 1, wherein the at least one shift register unit further includes a first transistor and a third transistor;

a gate electrode of the first transistor is coupled to a gate electrode of the third transistor;

the gate electrode of the first transistor is coupled to a third conductive connection portion, and the third conductive connection portion is coupled to a first electrode of the first switch, so that the gate electrode of the first transistor is connected to the first electrode of the first switch;

wherein the first transistor is located on a side of the third transistor close to the output circuit;
a distance in the second direction between an orthographic projection of the gate electrode of the first transistor on the base substrate and an orthographic projection of a gate electrode of the third transistor on the base substrate is a second predetermined distance;
wherein the second predetermined distance is greater than or equal to 18 microns and less than or equal to 24 microns.

13. The display substrate according to of claim 1, wherein the at least one shift register unit further includes a fourth transistor and a fifth transistor; the scan driving circuit further includes a first clock signal line;
a first electrode of the fourth transistor is coupled to the first clock signal line, and a gate electrode of the fifth transistor is coupled to the first clock signal line;
no transistor and/or capacitor is provided between the fourth transistor and the first clock signal line;
no transistor and/or capacitor is provided between the fifth transistor and the first clock signal line;
wherein
an active layer of the fourth transistor and an active layer of the fifth transistor are formed by a continuous second semiconductor layer; the second semiconductor layer extends along the first direction;
the active layer of the fourth transistor includes a first third conductive portion, a third channel portion, and a second third conductive portion sequentially arranged along the first direction;
the second third conductive portion is multiplexed as a first fourth conductive portion;
the active layer of the fifth transistor includes the first fourth conductive portion, a fourth channel portion, and a second fourth conductive portion sequentially arranged along the first direction;
the first third conductive portion is used as the first electrode of the fourth transistor, the second third conductive portion is used as a second electrode of the fourth transistor, and the second fourth conductive portion is used as a second electrode of the fifth transistor, and the second electrode of the fourth transistor is multiplexed as a first electrode of the fifth transistor;
wherein the first clock signal line extends along a first direction, and the first clock signal line is located on a side of the fourth transistor and the fifth transistor away from the display area.

14. The display substrate according to claim 1, wherein the at least one shift register unit further includes a fourth transistor, a fifth transistor, a sixth transistor, and a first capacitor;
a gate electrode of the fourth transistor is coupled to a first electrode plate of the first capacitor, and a second electrode plate of the first capacitor is coupled to a second electrode of the fourth transistor; the second electrode of the fourth transistor is multiplexed as a first electrode of the fifth transistor;
a second electrode of the fifth transistor is coupled to a second electrode of the sixth transistor;
a first electrode of the sixth transistor is coupled to a first electrode of the second switch;
the fourth transistor, the fifth transistor, the sixth transistor and the first capacitor are located on a side of the second switch away from the display area;
the fourth transistor, the first capacitor, and the sixth transistor are arranged in the first direction, and the second switch, the first capacitor, and the fifth transistor are arranged in a direction away from the display area;
wherein the at least one shift register unit further includes an output reset capacitor;
the second electrode of the fifth transistor is coupled to a first electrode plate of the output reset capacitor, and the first electrode of the sixth transistor is coupled to a second electrode plate of the output reset capacitor;
the first capacitor and the output reset capacitor are arranged along the first direction.

15. The display substrate according to claim 1, wherein the at least one shift register unit further includes a seventh transistor and an eighth transistor;
an active layer of the seventh transistor and an active layer of the eighth transistor are formed by a continuous third semiconductor layer; the third semiconductor layer extends along the first direction;
the active layer of the seventh transistor includes a first fifth conductive portion, a fifth channel portion, and a second fifth conductive portion sequentially arranged along the first direction;
the second fifth conductive portion is multiplexed as a first sixth conductive portion;
an active layer of the eighth transistor includes the first sixth conductive portion, a sixth channel portion, and a second sixth conductive portion that are sequentially arranged along the first direction;
the first fifth conductive portion is used as a second electrode of the seventh transistor, the second fifth conductive portion is used as a first electrode of the seventh transistor, and the second sixth conductive portion is used as a first electrode of the eighth transistor, the first electrode of the seventh transistor is multiplexed as a second electrode of the eighth transistor;
wherein the scan driving circuit further includes a first voltage signal line;
the first electrode of the eighth transistor is coupled to the first voltage signal line;
the first voltage signal line is located on a side of the output circuit away from the display area, and the seventh transistor and the eighth transistor are located between the first voltage signal line and the output circuit;
no transistor and/or capacitor is provided between the eighth transistor and the first voltage signal line.

16. The display substrate according to claim 1, wherein the at least one shift register unit further includes a second transistor and an input transistor; the scan driving circuit further includes a second clock signal line; the second clock signal line extends along the first direction;
a gate electrode of the second transistor is coupled to a gate electrode of the input transistor;
the gate electrode of the input transistor is coupled to the second clock signal line and a first electrode of the input transistor is coupled to an input end;
the second transistor and the input transistor are located on a side of the output circuit away from the display area.

17. The display substrate according to claim 1, wherein the at least one shift register unit further includes a node control transistor,
a gate electrode of the node control transistor includes a first gate electrode pattern and a second gate electrode pattern coupled to each other;

wherein the at least one shift register unit furthers include an input transistor, a sixth transistor, a first transistor, a seventh transistor, and an eighth transistor;

the gate electrode of the node control transistor is coupled to a first electrode of the first transistor, and the gate electrode of the node control transistor is also coupled to a second electrode of the input transistor, the gate electrode of the node control transistor is also coupled to a second electrode of the seventh transistor, and the gate electrode of the node control transistor is also coupled to a gate electrode of the sixth transistor;

a first electrode of the node control transistor is coupled to a gate electrode of the input transistor, and a second electrode of the node control transistor is coupled to a gate electrode of the eighth transistor;

the input transistor, the node control transistor, the seventh transistor, and the eighth transistor are arranged in the first direction.

18. The display substrate according to claim 1, wherein the scan driving circuit further includes a first voltage signal line, a second voltage signal line, a first clock signal line, and a second clock signal line;

the first voltage signal line, the second voltage signal line, the first clock signal line, and the second clock signal line all extend in the first direction;

an orthographic projection of the first voltage signal line on the base substrate, an orthographic projection of the first clock signal line on the base substrate, and an orthographic projection of the second clock signal line on the base substrate are all located on a side of an orthographic projection of the shift register unit on the base substrate away from the display area;

the orthographic projection of the second voltage signal line on the base substrate is located on a side of the shift register unit close to the display area.

19. The display substrate according to claim 1, wherein the scan driving circuit further includes a first voltage signal line, a second voltage signal line, a first clock signal line, and a second clock signal line; the at least one shift register unit also includes a signal output line, a first capacitor, an output capacitor, an output reset capacitor, a first transistor, a second transistor, a third transistor, a fourth transistor, a fifth transistor, a sixth transistor, a seventh transistor, an eighth transistor, an input transistor and a node control transistor;

the signal output line includes a first output line portion and at least one second output line portion;

a first electrode plate of the output reset capacitor is coupled to a gate electrode of the second switch, and a second electrode plate of the output reset capacitor is coupled to the first voltage signal line;

a first electrode of the first switch is coupled to the second voltage signal line, and a first electrode of the second switch is coupled to the second electrode plate of the output reset capacitor; a second electrode of the first switch and a second electrode of the second switch are respectively coupled to the first output line portion;

a first electrode plate of the output capacitor is coupled to the gate electrode of the first switch, and a second electrode plate of the output capacitor is coupled to a gate electrode of the seventh transistor;

a gate electrode of the first transistor is coupled to a first electrode of the first switch, and the second electrode of the first transistor is coupled to the gate electrode of the first switch;

a gate electrode of the second transistor is coupled to a gate electrode of the input transistor, a first electrode of the second transistor is coupled to the gate electrode of the first transistor, and a second electrode of the second transistor is coupled to a gate electrode of the eighth transistor;

a gate electrode of the third transistor is coupled to the first electrode of the first switch, a first electrode of the third transistor is coupled to a gate electrode of the eight transistor, a second electrode of the third transistor is coupled to a gate electrode of the fourth transistor;

a first electrode of the fourth transistor is coupled to the first clock signal line, and a gate electrode of the fifth transistor is coupled to the first clock signal line;

the gate electrode of the fourth transistor is coupled to the first electrode plate of the first capacitor, and the second electrode plate of the first capacitor is coupled to the second electrode of the fourth transistor; the second electrode of the fourth transistor is multiplexed as a first electrode of the fifth transistor;

a second electrode of the fifth transistor is coupled to a second electrode of the sixth transistor;

a gate electrode of the sixth transistor is coupled to a gate electrode of the node control transistor, and a first electrode of the sixth transistor is coupled to a first electrode of the second switch;

a second electrode of the fifth transistor is coupled to a first electrode plate of the output reset capacitor, and a first electrode of the sixth transistor is connected to a second electrode plate of the output reset capacitor;

a gate electrode of the seventh transistor is coupled to the second electrode plate of the output capacitor, and a first electrode of the seventh transistor is multiplexed as a second electrode of the eighth transistor, a second electrode of the seventh transistor is coupled to the gate electrode of the node control transistor;

a gate electrode of the eighth transistor is coupled to the second electrode of the node control transistor, and a first electrode of the eighth transistor is coupled to the first voltage signal line;

a gate electrode of the input transistor is coupled to the second clock signal line, and a first electrode of the input transistor is coupled to the input end;

the gate electrode of the node control transistor is coupled to the first electrode of the first transistor, and the gate electrode of the node control transistor is also coupled to the second electrode a of the input transistor;

the first electrode of the node control transistor is coupled to the gate electrode of the input transistor;

the second output line portion extends to the display area and is used to provide a light emitting control signal for a pixel circuit located in the display area;

wherein along the first direction, the input transistor, the node control transistor, the seventh transistor, the eighth transistor, the fourth transistor, the fifth transistor and the output reset capacitor are arranged in sequence;

the input transistor, the second transistor, and the first transistor are arranged along the second direction;

the node control transistor, the output capacitor, and the first switch are arranged along a second direction;

the third transistor, the fourth transistor, the first capacitor, and the output reset capacitor are arranged in sequence along the first direction;

the sixth transistor is arranged between the second switch and the first capacitor.

20. The display substrate according to claim 1, wherein the scan driving circuit further includes a first voltage signal line, a second voltage signal line, a first clock signal line, and a second clock signal line; the at least one shift register unit also includes a signal output line, a first capacitor, an output capacitor, an output reset capacitor, a first transistor, a second transistor, a third transistor, a fourth transistor, a fifth transistor, a sixth transistor, a seventh transistor, an eighth transistor, an input transistor and a node control transistor; a first electrode plate of the output reset capacitor is coupled to a gate electrode of the second switch, and a second electrode plate of the output reset capacitor is coupled to the first voltage signal line;

the signal output line includes a first output line portion and at least one second output line portion;

a first electrode of the first switch is coupled to the second voltage signal line, and a first electrode of the second switch is coupled to the second electrode plate of the output reset capacitor; a second electrode of the first switch and a second electrode of the second switch are respectively coupled to the first output line portion;

a first electrode plate of the output capacitor is coupled to the gate electrode of the first switch, and a second electrode plate of the output capacitor is coupled to a gate electrode of the seventh transistor;

a gate electrode of the first transistor is coupled to a gate electrode of the third transistor, and the gate electrode of the first transistor is coupled to the first electrode of the first switch; a second electrode of the first transistor is coupled to a gate electrode of the first switch;

a gate electrode of the second transistor is coupled to a gate electrode of the input transistor, a first electrode of the second transistor is coupled to the first electrode of the first switch, and a second electrode of the second transistor is coupled to a gate electrode of the eighth transistor;

a first electrode of the third transistor is coupled to the gate electrode of the eighth transistor, and a second electrode of the third transistor is coupled to a gate electrode of the fourth transistor;

a first electrode of the fourth transistor is coupled to the first clock signal line, and a gate electrode of the fifth transistor is coupled to the first clock signal line;

the gate electrode of the fourth transistor is coupled to the first electrode plate of the first capacitor, and the second electrode plate of the first capacitor is coupled to the second electrode of the fourth transistor; the second electrode of the fourth transistor is multiplexed as a first electrode of the fifth transistor;

a second electrode of the fifth transistor is coupled to a second electrode of the sixth transistor;

a gate electrode of the sixth transistor is coupled to a gate electrode of the node control transistor, and a first electrode of the sixth transistor is coupled to a first electrode of the second switch;

a second electrode of the fifth transistor is coupled to a first electrode plate of the output reset capacitor, and a first electrode of the sixth transistor is connected to a second electrode plate of the output reset capacitor;

a gate electrode of the seventh transistor is coupled to the second electrode plate of the output capacitor, and a first electrode of the seventh transistor is multiplexed as a second electrode of the eighth transistor, a second electrode of the seventh transistor is coupled to the gate electrode of the node control transistor;

a gate electrode of the eighth transistor is coupled to the second electrode of the node control transistor, and a first electrode of the eighth transistor is coupled to the first voltage signal line;

a gate electrode of the input transistor is coupled to the second clock signal line, and a first electrode of the input transistor is coupled to the input end;

the gate electrode of the node control transistor is coupled to the first electrode of the first transistor, and the gate electrode of the node control transistor is also coupled to the second electrode of the input transistor;

the first electrode of the node control transistor is coupled to the gate electrode of the input transistor;

the second output line portion extends to the display area and is used to provide a light emitting control signal for a pixel circuit located in the display area;

wherein the input transistor, the node control transistor, the seventh transistor, the eighth transistor, the fourth transistor, and the fifth transistor and the output reset capacitor are arranged in sequence along the first direction;

the input transistor and the second transistor are arranged along the second direction;

the node control transistor, the output capacitor, and the first switch are arranged along the second direction;

the third transistor, the fourth transistor, the first capacitor, and the output reset capacitor are arranged in sequence along the first direction;

the first transistor, the sixth transistor, and the output reset capacitor are arranged in sequence along the first direction.

21. The display substrate according to claim 19, wherein the second voltage signal line is arranged on a side of the shift register unit close to the display area;

the first voltage signal line, the first clock signal line, and the second clock signal line are arranged on a side of the shift register unit away from the display area;

along a direction close to the display area, the first clock signal line, the second clock signal line, and the first voltage signal line are arranged in sequence; or along the direction close to the display area, the second clock signal line, the first clock signal line, and the first voltage signal line are arranged in sequence;

wherein the scan driving circuit further includes a first start signal line and a second start signal line;

along the direction close to the display area, the second start signal line, the first start signal line, the first clock signal line, the second clock signal line, and the first voltage signal line are sequentially arranged; or along the direction close to the display area, the first start signal line, the second start signal line, the first clock signal line, the second clock signal line, and the first voltage signal line are sequentially arranged; or along the direction close to the display area, the second start signal line, the first start signal line, the second clock signal line, the first clock signal line, and the first voltage signal line are sequentially arranged; or along the direction close to the display area, the first start signal line, the second start signal line, the second clock signal line, the first clock signal line, and the first voltage signal line are sequentially arranged.

22. The display substrate according to claim 1, wherein the display substrate further includes a plurality of rows of pixel circuits arranged on the base substrate; the pixel circuit includes a light emitting control end;

the shift register unit corresponds to at least one row of the pixel circuits;

the signal output line of the shift register unit is coupled to the light emitting control end of the at least one row of pixel circuits, and is used to provide a light emitting control signal for the light emitting control end of the at least one row of pixel circuits.

23. The display substrate according to claim 1, wherein a larger one of a minimum width of the active layer of the first switch in the second direction and a minimum width of the active layer of the second switch in the second direction is a second output active width, and a ratio of the output active length to the second output active width is within a second predetermined ratio range;
the second predetermined ratio range is greater than or equal to 3 and less than or equal to 11.

24. A method of manufacturing a display substrate, comprising forming a scan driving circuit on a base substrate; wherein the scan driving circuit includes a plurality of shift register units, and at least one shift register unit of the plurality of shift register units includes an output circuit; the output circuit includes an first switch and an second switch; the method of manufacturing the display substrate further includes:
forming a semiconductor layer on the base substrate, and performing a patterning process on the semiconductor layer to form an active layer of the first switch and an active layer of the second switch;
the active layer of the first switch and the active layer of the second switch are arranged along a first direction, a length of the active layer of the first switch in the first direction is a first length, and a length of the active layer of the second switch in the first direction is a second length, and a sum of the first length and the second length is an output active length;
a smaller one of a minimum width of the active layer of the first switch in a second direction and a minimum width of the active layer of the second switch in the second direction is a first output active width; the first direction intersects the second direction;
a ratio of the output active length to the first output active width is within a first predetermined ratio range;
the first predetermined ratio range is greater than or equal to 3 and less than or equal to 11.

25. The method according to claim 24, further comprising:
forming a first gate metal layer on a side of the semiconductor layer away from the substrate, and performing a patterning process on the first gate metal layer to form a gate electrode of the first switch and a gate electrode of the second switch;
using the gate electrode of the first switch and the gate electrode of the second switch as a mask, doping a portion of the semiconductor layer that is not covered by the gate electrodes so that the portion of the semiconductor layer that is not covered by the gate electrodes is formed as a conductive portion, and a portion of the semiconductor layer covered by the gate electrode is formed as a channel portion;
forming a second gate metal layer on a side of the first gate metal layer away from the semiconductor layer, and performing a patterning process on the second gate metal layer to form a signal output line; the signal output line including a first output line portion extending in the first direction;
forming a first insulating layer on a side of the second gate metal layer away from the first gate metal layer;
forming a plurality of first signal line via holes and a plurality of second signal line via holes in an overlap area between the first insulating layer and the first output line portion; the plurality of first signal line via holes and the plurality of second signal line via holes penetrating the first insulating layer;
forming a source-drain metal layer on a side of the first insulating layer away from the second gate metal layer, performing a patterning process on the source-drain metal layer to form a first source-drain metal pattern and a second source-drain metal pattern, wherein the first source-drain metal pattern includes the second electrode of the first switch, and the second source-drain metal pattern includes the second electrode of the second switch, so that the first output line portion is coupled to the second electrode of the first switch through the plurality of first signal line via holes, and the first output line portion is coupled to the second electrode of the second switch through the plurality of second signal line via holes,
the plurality of first signal line via holes are sequentially arranged along the first direction, and the plurality of second signal line via holes are sequentially arranged along the first direction.

* * * * *